(12) United States Patent
Ishikawa et al.

(10) Patent No.: US 6,933,531 B1
(45) Date of Patent: Aug. 23, 2005

(54) HEAT SINK MATERIAL AND METHOD OF MANUFACTURING THE HEAT SINK MATERIAL

(75) Inventors: Shuhei Ishikawa, Nagoya (JP); Tsutomu Mitsui, Nagoya (JP); Ken Suzuki, Nagoya (JP); Nobuaki Nakayama, Nagoya (JP); Hiroyuki Takeuchi, Nagoya (JP); Seiji Yasui, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/913,353

(22) PCT Filed: Dec. 22, 2000

(86) PCT No.: PCT/JP00/09133

§ 371 (c)(1),
(2), (4) Date: Aug. 13, 2001

(87) PCT Pub. No.: WO01/48816

PCT Pub. Date: Jul. 5, 2001

(30) Foreign Application Priority Data

Dec. 24, 1999 (JP) .............................................. 11-368108
Mar. 22, 2000 (JP) ....................................... 2000-080833

(51) Int. Cl.⁷ .............................................. H01L 23/12
(52) U.S. Cl. .................... 257/76; 428/307.7; 428/312.2; 428/408; 428/469; 428/472
(58) Field of Search .................... 257/76, 77; 428/408, 428/469, 472, 307.7, 312.2, 325, 698, 457

(56) References Cited

U.S. PATENT DOCUMENTS 4,333,986 A  *  6/1982  Tsuji et al.
4,425,315 A  *  1/1984  Tsuji et al.

(Continued)

FOREIGN PATENT DOCUMENTS

| CN | 1201256 A | 12/1998 |
|----|-----------|---------|
| EP | 0 504 532 A1 | 9/1992 |
| EP | 0 673 900 A2 | 9/1995 |
| JP | 48-84008 | 11/1973 |
| JP | 49-116109 | 11/1974 |
| JP | 51-24525 | 2/1976 |
| JP | 56054046 A | 5/1981 |
| JP | 56161647 A | 12/1981 |
| JP | 59-228742 | 12/1984 |
| JP | 62-207832 | 9/1987 |
| JP | 01149933 A | 6/1989 |
| JP | 01254369 A | 10/1989 |

(Continued)

OTHER PUBLICATIONS

Wei et al "Improvement of wear resistance of pulsed laser deposited diamond–like carbon films through incorporation of metals" Materials Science and Engineering B53, (1998) 262–266.*

Klages et al "Microstructure and Physical Properties of Metal–Containing Hydrogenated Carbon Films" Material Science Forum vols. 52 & 53 (1989) pp 609–644.*

U.S. patent application Ser. No. 10/279,959, Ishikawa et al., filed Oct. 24, 2002.

U.S. patent application Ser. No. 10/245,999, Ishikawa et al., filed Sep. 18, 2002.

*Primary Examiner*—Archene Turner
(74) *Attorney, Agent, or Firm*—Burr & Brown

(57) ABSTRACT

Graphite is placed in a case, and the case is set in a furnace. The interior of the furnace is subjected to sintering to produce a porous sintered member of graphite. After that, the case with the porous sintered member therein is taken out of the furnace, and is set in a recess of a press machine. Subsequently, molten metal of metal is poured into the case, and then a punch is inserted into the recess to forcibly press the molten metal in the case downwardly. Open pores of the porous sintered member are infiltrated with the molten metal of the metal by the pressing treatment with the punch.

38 Claims, 40 Drawing Sheets

U.S. PATENT DOCUMENTS

| | | | | |
|---|---|---|---|---|
| 5,008,737 | A | * | 4/1991 | Burnham et al. |
| 5,045,972 | A | | 9/1991 | Supan et al. |
| 5,120,495 | A | * | 6/1992 | Supan et al. |
| 5,296,310 | A | * | 3/1994 | Kibler et al. |
| H1358 | H | * | 9/1994 | Ferrando et al. |
| 5,347,426 | A | * | 9/1994 | Dermarkar et al. |
| 5,410,796 | A | * | 5/1995 | Weeks, Jr. |
| 5,455,738 | A | * | 10/1995 | Montesano et al. |
| 5,580,658 | A | * | 12/1996 | Maruyama et al. |
| 5,783,316 | A | * | 7/1998 | Colella et al. |
| 5,786,075 | A | * | 7/1998 | Mishuku et al. |
| 5,848,349 | A | * | 12/1998 | Newkirk et al. |
| 5,944,097 | A | * | 8/1999 | Gungor et al. |
| 6,031,285 | A | * | 2/2000 | Nishibayashi |
| 6,037,032 | A | * | 3/2000 | Klett et al. |
| 6,110,577 | A | | 8/2000 | Ishikawa et al. |
| 6,143,142 | A | * | 11/2000 | Shi et al. |
| 6,171,691 | B1 | * | 1/2001 | Nishibayashi |
| 6,238,454 | B1 | * | 5/2001 | Polese et al. |
| 6,270,848 | B1 | * | 8/2001 | Nishibayashi ............... 419/23 |
| 6,569,524 | B2 | | 5/2003 | Kawai et al. |

FOREIGN PATENT DOCUMENTS

| | | | |
|---|---|---|---|
| JP | 03295879 A | | 12/1991 |
| JP | 04083784 | * | 3/1992 |
| JP | 4-259305 | | 9/1992 |
| JP | 4-329845 | | 11/1992 |
| JP | 4329845 | | 11/1992 |
| JP | 05337630 A | | 12/1993 |
| JP | 06263571 A | | 9/1994 |
| JP | 07011360 A | | 1/1995 |
| JP | 8-37258 | | 2/1996 |
| JP | 08-279569 | | 10/1996 |
| JP | 09175877 A | | 7/1997 |
| JP | 10168502 A | | 6/1998 |
| JP | 11-67991 | | 3/1999 |
| JP | 11061292 | | 3/1999 |
| JP | 11-140559 A | | 5/1999 |
| JP | 11140560 A | | 5/1999 |
| JP | 2000095586 A | | 4/2000 |
| JP | 2000203973 A | | 7/2000 |
| JP | 2001058255 A | | 3/2001 |
| JP | 2001-122672 | | 5/2001 |
| JP | 2002-080280 | | 3/2002 |

* cited by examiner

FIG. 17

| SAMPLE | SIZE (mm) | TYPE OF POWDER | PARTICLE SIZE OF POWDER (μm) | FILLING METHOD | METAL | ADDED ELEMENT | AMOUNT OF ADDITION (wt%) | INFIL-TRATION METHOD | INFIL-TRATION PRESSURE (MPa) | COEFFICIENT OF THERMAL CONDUCTIVITY (W/mK) | COEFFICIENT OF THERMAL EXPANSION (×10⁻⁶/K) | WATER RESISTANCE | EFFECT |
|---|---|---|---|---|---|---|---|---|---|---|---|---|---|
| PW-1 | 30×120×190 | type-P | AVERAGE 120 | NO PRESSURIZATION | Cu | Nb | 0.001 | PRESS | 60.0 | 321 | 14.0 | △ | GENERATION OF CARBIDE |
| PW-2 | 30×120×191 | type-S | AVERAGE 50 | NO PRESSURIZATION | Cu | Nb | 0.001 | PRESS | 60.0 | 325 | 13.5 | △ | GENERATION OF CARBIDE |
| PW-3 | 30×120×192 | type-R | 212-1180 | NO PRESSURIZATION | Cu | Nb | 0.001 | PRESS | 60.0 | 305 | 13.6 | △ | GENERATION OF CARBIDE |
| PW-4 | 30×120×193 | type-P | AVERAGE 120 | NO PRESSURIZATION | Cu | Nb | 0.001 | PRESS | 60.0 | 321 | 14.0 | △ | GENERATION OF CARBIDE |
| PW-5 | 30×120×194 | type-P | AVERAGE 120 | PRESSURIZATION 7MPa | Cu | Nb | 0.001 | PRESS | 60.0 | 311 | 11.5 | △ | GENERATION OF CARBIDE |
| PW-6 | 30×120×195 | type-P | AVERAGE 120 | PRESSURIZATION 25MPa | Cu | Nb | 1.001 | PRESS | 60.0 | 301 | 9.5 | △ | GENERATION OF CARBIDE |

FIG. 19

| SAMPLE | SIZE (mm) | METAL | ELEMENT | AMOUNT OF ADDITION (wt%) | INFIL- TRATING METHOD | COEFFICIENT OF THERMAL CONDUCTIVITY (W/mK) | | COEFFICIENT OF THERMAL EXPANSION (×10⁻⁶/°C) | | BENDING STRENGTH (MPa) | | WATER RESISTANCE | EFFECT |
|---|---|---|---|---|---|---|---|---|---|---|---|---|---|
| | | | | | | SUR- FACE | THICK- NESS | SUR- FACE | THICK- NESS | SUR- FACE | THICK- NESS | | |
| p1-1 | 20x60x60 | Al | NONE | NONE | PRESS | 171 | 171 | 5.3 | 5.5 | 33.3 | 53.9 | △ | NONE |
| p1-2 | 20x60x60 | Cu | NONE | NONE | PRESS | 162 | 170 | 5.1 | 5.1 | 27.4 | 41.2 | ◎ | NONE |
| p2-1 | 20x60x60 | Cu | Bi | 2 | PRESS | 168 | 178 | 5.0 | 5.1 | 28.4 | 45.1 | ◎ | WETT- ABILITY |
| p2-2 | 20x60x60 | Cu | Sb | 0.5 | | 178 | 186 | 5.0 | 5.1 | 27.4 | 41.2 | | |
| p2-3 | 20x60x60 | Cu | Te | 0.5 | | 180 | 189 | 5.0 | 5.1 | 26.5 | 39.2 | | |
| p2-4 | 20x60x60 | Cu | Te | 2 | | 172 | 178 | 4.9 | 5.0 | 25.5 | 38.2 | | |
| p2-5 | 20x60x60 | Cu | Te,Bi | 0.5,0.5 | | 169 | 176 | 5.0 | 5.0 | 26.5 | 39.2 | | |
| p2-6 | 20x60x60 | Cu | Te,Pb | 0.5,2.0 | | 172 | 185 | 5.0 | 5.0 | 27.4 | 41.2 | | |
| p3-1 | 20x60x60 | Cu | Be | 1 | PRESS | 184 | 204 | 5.0 | 5.0 | 34.3 | 57.8 | △ | GENERATION OF CARBIDE |
| p3-2 | 20x60x60 | Cu | Cr | 0.5 | | 187 | 192 | 5.0 | 5.0 | 37.2 | 58.8 | | |
| p3-3 | 20x60x60 | Cu | Mn | 0.5 | | 175 | 181 | 5.0 | 5.0 | 34.3 | 56.8 | | |
| p3-4 | 20x60x60 | Cu | Nb | 0.05 | | 187 | 190 | 5.0 | 5.0 | 34.3 | 56.8 | | |
| p3-5 | 20x60x60 | Cu | Zr | 0.5 | | 172 | 174 | 5.0 | 5.0 | 24.5 | 40.2 | | |
| p4-1 | 20x60x60 | Cu | Te,Ni | 0.5,0.5 | PRESS | 165 | 177 | 5.0 | 5.0 | 27.4 | 45.1 | ○ | COMBINED ADDITION |
| p5-1 | 20x60x60 | Cu | NONE | NONE | GAS | 170 | 188 | 5.0 | 5.1 | 27.4 | 41.2 | ◎ | NONE |
| p6-1 | 10x85x180 | Cu | Te | 2 | GAS | 185 | 196 | 5.0 | 5.1 | 26.5 | 39.2 | ◎ | WETT- ABILITY |
| p6-2 | 20x60x60 | Cu | Te | 2 | | 192 | 204 | 5.0 | 5.0 | 28.4 | 42.1 | | |

FIG. 20

| SAMPLE | SIZE (mm) | METAL | ELEMENT | AMOUNT OF ADDITION (wt%) | INFILTRATING METHOD | COEFFICIENT OF THERMAL CONDUCTIVITY (W/mK) | | COEFFICIENT OF THERMAL EXPANSION ($\times 10^{-6}/°C$) | | BENDING STRENGTH (MPa) | | WATER RESISTANCE | EFFECT |
|---|---|---|---|---|---|---|---|---|---|---|---|---|---|
| | | | | | | SURFACE | THICKNESS | SURFACE | THICKNESS | SURFACE | THICKNESS | | |
| m1-1 | 20×60×60 | Al | NONE | NONE | PRESS | 161 | 187 | 4.5 | 5.6 | 34.3 | 56.8 | △ | NONE |
| m1-2 | 20×60×60 | Cu | NONE | NONE | PRESS | 145 | 181 | 4.6 | 5.1 | 28.4 | 42.1 | ◎ | NONE |
| m2-1 | 20×60×60 | Cu | Te | 0.50 | PRESS | 168 | 199 | 4.5 | 5.1 | 26.5 | 39.2 | ◎ | WETTABILITY |
| m3-1 | 20×60×60 | Cu | Be | 1.00 | PRESS | 184 | 213 | 4.5 | 5.1 | 38.3 | 59.8 | △ | GENERATION OF CARBIDE |
| m3-2 | 20×60×60 | Cu | Cr | 0.50 | | 170 | 193 | 4.5 | 5.1 | 37.2 | 60.8 | | |
| m3-3 | 20×60×60 | Cu | Mn | 0.50 | | 165 | 192 | 4.5 | 5.1 | 35.3 | 57.8 | | |
| m3-4 | 20×120×190 | Cu | Nb | 0.05 | | 162 | 192 | 4.5 | 5.1 | 35.3 | 57.8 | | |
| m3-5 | 20×60×60 | Cu | Nb | 0.05 | | 169 | 207 | 4.5 | 5.1 | 35.3 | 57.8 | | |
| m3-6 | 20×60×60 | Cu | Zr | 0.50 | | 158 | 182 | 4.5 | 5.1 | 32.3 | 52.9 | | |
| m5-1 | 20×60×60 | Cu | NONE | NONE | GAS | 166 | 198 | 4.5 | 5.1 | 25.5 | 38.2 | ◎ | NONE |

FIG. 21

| SAMPLE | SIZE (mm) | METAL | ADDITIVE ELEMENT | AMOUNT OF ADDITION (wt%) | INFILTRATING METHOD | INFILTRATION PRESSURE (MPa) | COEFFICIENT OF THERMAL CONDUCTIVITY (W/mK) | COEFFICIENT OF THERMAL EXPANSION (×10⁻⁶/K) SUR-FACE | THICK-NESS | BENDING STRENGTH (MPa) SUR-FACE | THICK-NESS | COMPRESSIVE STRENGTH (MPa) SUR-FACE | THICK-NESS | WATER RESISTANCE | EFFECT |
|---|---|---|---|---|---|---|---|---|---|---|---|---|---|---|---|
| n1-1 | 20×60×60 | Al | NONE | NONE | PRESS | 26.7 | 156 | 5.5 | 6.0 | 31.4 | 51.9 | 46.1 | 51.0 | ~ | NONE |
| n1-4 | 20×120×190 | Al | NONE | NONE | PRESS | 60.0 | 185 | 6.5 | 6.5 | | | | | △ | NONE |
| n1-2 | 20×60×60 | Cu | NONE | NONE | PRESS | 26.7 | 150 | 3.8 | 4.6 | | | | | △ | NONE |
| n1-3 | 20×120×190 | Cu | NONE | NONE | PRESS | 26.7 | 147 | 3.9 | 4.5 | | | | | ◎ | NONE |
| n2-1 | 20×60×60 | Cu | Te | 0.500 | PRESS | 26.7 | 190 | 3.8 | 4.5 | 26.5 | 39.2 | | | ◎ | WETTABILITY |
| n3-1 | 20×60×60 | Cu | Be | 1.000 | PRESS | 26.7 | 183 | 3.8 | 4.6 | 28.5 | 39.2 | | | △ | |
| n3-2 | 20×120×190 | Cu | Be | 1.000 | PRESS | 166.1 | 341 | 3.8 | 4.6 | 26.5 | 39.2 | | | △ | |
| n3-3 | 20×60×60 | Cu | Cr | 0.500 | PRESS | 26.7 | 189 | 4.0 | 4.6 | 38.2 | 62.7 | 42.1 | 48.0 | △ | GENERATION OF CARBIDE |
| n3-4 | 20×60×60 | Cu | Mn | 0.500 | PRESS | 26.7 | 180 | 3.8 | 4.6 | 37.2 | 61.7 | | | △ | |
| n3-5 | 20×60×60 | Cu | Nb | 0.500 | PRESS | 166.1 | 320 | 3.8 | 4.5 | 36.3 | 59.8 | | | △ | |
| n3-6 | 20×120×190 | Cu | Nb | 0.050 | PRESS | 26.7 | 336 | 3.8 | 4.6 | 34.3 | 55.9 | | | △ | |
| n3-7 | 20×60×60 | Cu | Nb | 0.050 | PRESS | 26.7 | 309 | 3.8 | 4.5 | 35.9 | 57.8 | | | △ | |
| n3-8 | 20×120×190 | Cu | Zr | 0.500 | PRESS | 26.7 | 312 | 4.5 | 3.0 | 35.3 | 57.8 | | | △ | |
| n3-9 | 20×60×60 | Cu | Nb | 0.001 | PRESS | 43.3 | 352 | 4.0 | 3.0 | 34.3 | 56.8 | | | △ | |
| n3-10 | 20×120×190 | Cu | Nb | 0.001 | PRESS | 60.0 | 363 | 4.0 | 2.5 | | | 40.2 | 51.9 | △ | |
| n3-11 | 20×120×190 | Cu | Nb | 1.100 | PRESS | 60.0 | 359 | 4.5 | 3.5 | | | 42.1 | 51.9 | ◎ | |
| n3-12 | 20×120×190 | Cu | Be | 1.900 | PRESS | 60.0 | 366 | | | | | 51.0 | 58.8 | ○ | |
| n3-13 | 20×120×190 | Cu | Ni,Sn | 9,4,6,7 | PRESS | 60.0 | 343 | | | | | 57.9 | 64.7 | △ | |
| n3-14 | 20×120×190 | Cu | Ni,Si,P | 1.0,0.23,0.04 | PRESS | 60.0 | 353 | | | | | 51.9 | 51.9 | △ | COMBINED ADDITION |
| n3-15 | 20×120×190 | Cu | Mn,Cr | 4.180 | PRESS | 60.0 | 352 | | | | | 48.0 | 54.9 | △ | |
| n3-16 | 20×120×190 | Cu | Zr | 2.870 | PRESS | 60.0 | 387 | | | | | 51.0 | 51.9 | △ | GENERATION OF CARBIDE |
| n3-17 | 20×120×190 | Cu | Si | 4.490 | PRESS | 60.0 | 367 | | | | | 48.0 | 63.7 | △ | |
| n3-18 | 20×120×190 | Cu | Si | 11.300 | PRESS | 26.7 | 333 | | | | | 53.9 | 60.8 | ◎ | EXPANSION OF SOLID-LIQUID RANGE |
| n3-19 | 20×120×190 | Cu | Si | 10.900 | PRESS | 60.0 | 316 | | | | | 53.9 | 68.8 | ○ | |
| n3-20 | 20×120×190 | Cu | Si | 5.170 | PRESS | 153.0 | 343 | | | | | 56.8 | 62.7 | ◎ | |
| n2-20 | 20×120×190 | Cu | Si | 5.300 | PRESS | 43.3 | 325 | | | | | 52.9 | 60.8 | ◎ | |
| n5-1 | 20×60×60 | Cu | NONE | NONE | GAS | 26.7 | 170 | 3.8 | 4.5 | 26.6 | 39.2 | 54.9 | | ◎ | NONE |
| n7-1 | 20×120×190 | Al | Be | 2.000 | PRESS | 60.0 | 177 | 5.0 | 6.5 | | | 57.8 | 62.7 | △ | GENERATION OF CARBIDE |
| n7-2 | 20×120×190 | Al | Si | 5.000 | PRESS | 60.0 | 189 | 5.0 | 6.5 | | | 50.0 | 61.7 | ◎ | EXPANSION OF SOLID-LIQUID RANGE |
| n7-3 | 20×120×190 | Al | Si | 12.000 | PRESS | 60.0 | 181 | 5.0 | 6.5 | | | 56.8 | 68.6 | ◎ | |

FIG. 22

| TYPE OF CARBON | COEFFICIENT OF THERMAL CONDUCTIVITY (W/mK) | | COEFFICIENT OF THERMAL EXPANSION ($\times 10^{-6}$/°C) | | BENDING STRENGTH (MPa) | |
|---|---|---|---|---|---|---|
| | SURFACE DIRECTION | THICKNESS DIRECTION | SURFACE DIRECTION | THICKNESS DIRECTION | SURFACE DIRECTION | THICKNESS DIRECTION |
| P | 150 | 160 | 3.2 | 3.2 | 34.3 | 49.0 |
| M | 140 | 168 | 3.2 | 3.2 | 29.4 | 44.1 |
| N | 150 | 255 | 1.8 | 2.3 | 14.7 | 29.4 |

FIG. 23

| SAMPLE | SIZE (mm) | METAL | ELEMENT | AMOUNT OF ADDITION (wt%) | INFIL-TRATING METHOD | COEFFICIENT OF THERMAL CONDUCTIVITY (W/mK) | | COEFFICIENT OF THERMAL EXPANSION (×10⁻⁶/°C) | | BENDING STRENGTH (MPa) | | WATER RESISTANCE | EFFECT |
|---|---|---|---|---|---|---|---|---|---|---|---|---|---|
| | | | | | | SUR-FACE | THICK-NESS | SUR-FACE | THICK-NESS | SUR-FACE | THICK-NESS | | |
| p1-2 | 20×60×60 | Cu | NONE | NONE | PRESS | 162 | 170 | 5.1 | 5.1 | 27.4 | 41.2 | ◎ | NONE |
| p5-1 | 20×60×60 | Cu | NONE | NONE | GAS | 170 | 188 | 5.0 | 5.0 | 27.4 | 41.2 | | |
| p2-4 | 20×60×60 | Cu | Te | 2 | PRESS | 172 | 178 | 4.9 | 5.0 | 25.5 | 38.2 | ◎ | WETT-ABILITY |
| p6-2 | 20×60×60 | Cu | Te | 2 | GAS | 192 | 204 | 5.0 | 5.0 | 28.4 | 42.1 | | |
| m1-2 | 20×60×60 | Cu | NONE | NONE | PRESS | 145 | 181 | 4.5 | 5.1 | 28.4 | 42.1 | ◎ | NONE |
| m5-1 | 20×60×60 | Cu | NONE | NONE | GAS | 166 | 198 | 4.5 | 5.1 | 25.5 | 38.2 | | |
| n1-2 | 20×60×60 | Cu | NONE | NONE | PRESS | 150 | 310 | 3.8 | 4.5 | 28.5 | 39.2 | ◎ | NONE |
| n5-1 | 20×60×60 | Cu | NONE | NONE | GAS | 170 | 320 | 3.8 | 4.5 | 26.5 | 39.2 | | |

FIG. 30

| No. | POROSITY [%] | PORE DIAMETER [μm] | Ni PLATING | Si INFIL-TRATION | INFILTRATION TEMPERATURE [°C] | PRESSURIZATION [MPa (kgf/cm²)] | PRESSURIZATION TIME [sec] | COOLING SPEED [°C/min] | REACTION OF Si/Cu | INFIL-TRATION |
|---|---|---|---|---|---|---|---|---|---|---|
| SAMPLE1 | 35 | 70 | ABSENT | ABSENT | 1130 | 0.78 (8) | 60 | 260 | △ | △ |
| SAMPLE2 | 44 | 22 | ABSENT | ABSENT | 1130 | 7.84 (80) | 20 | 900 | ○ | ◎ |
| SAMPLE3 | 59 | 42 | ABSENT | PRESENT | 1130 | 11.8 (120) | 10 | 480 | ◎ | ◎ |
| SAMPLE4 | 15 | 5 | PRESENT | ABSENT | 1130 | 23.5 (240) | 10 | 900 | ◎ | ○ |
| SAMPLE5 | 59 | 42 | ABSENT | PRESENT | 1180 | 0.78 (8) | 60 | 900 | △ | △ |
| SAMPLE6 | 15 | 5 | ABSENT | ABSENT | 1180 | 3.92 (40) | 20 | 480 | ○ | △ |
| SAMPLE7 | 59 | 42 | ABSENT | PRESENT | 1180 | 11.8 (120) | 10 | 900 | ◎ | ◎ |
| SAMPLE8 | 44 | 22 | ABSENT | ABSENT | 1180 | 23.5 (240) | 10 | 620 | ◎ | ◎ |
| SAMPLE9 | 44 | 22 | ABSENT | PRESENT | 1230 | 0.78 (8) | 20 | 480 | ○ | △ |
| SAMPLE10 | 59 | 42 | PRESENT | ABSENT | 1230 | 3.92 (40) | 35 | 790 | ◎ | ○ |
| SAMPLE11 | 35 | 70 | ABSENT | ABSENT | 1230 | 7.84 (80) | 100 | 620 | ◎ | ◎ |
| SAMPLE12 | 44 | 22 | ABSENT | PRESENT | 1230 | 23.5 (240) | 5 | 620 | ◎ | ◎ |
| SAMPLE13 | 59 | 42 | ABSENT | ABSENT | 1280 | 3.92 (40) | 50 | 790 | ○ | ◎ |
| SAMPLE14 | 35 | 70 | PRESENT | ABSENT | 1280 | 7.84 (80) | 35 | 480 | △ | ◎ |
| SAMPLE15 | 44 | 22 | ABSENT | PRESENT | 1280 | 7.84 (80) | 5 | 620 | ○ | ◎ |
| SAMPLE16 | 59 | 42 | ABSENT | ABSENT | 1280 | 11.8 (120) | 10 | 790 | ○ | ◎ |
| SAMPLE17 | 20 | 21 | ABSENT | ABSENT | 1150 | 156.1 | 3 | 900 | ◎ | ◎ |
| SAMPLE18 | 20 | 19 | ABSENT | ABSENT | 1150 | 156.1 | 5 | 900 | ◎ | ◎ |
| SAMPLE19 | 20 | 23 | ABSENT | ABSENT | 1140 | 69.3 | 5 | 900 | ◎ | ◎ |
| SAMPLE20 | 20 | 22 | ABSENT | ABSENT | 1145 | 26.7 | 7 | 900 | ◎ | ◎ |

NOTES   REACTION of Si/Cu: ◎NO REACTION  ○SLIGHT REACTION  △STRONG REACTION
INFILTRATION OF Cu: ◎GOOD INFILTRATION  ○SLIGHTLY INSUFFICIENT INFILTRATION
△ INSUFFICIENT INFILTRATION

HEAT SINK MATERIAL AND METHOD OF MANUFACTURING THE HEAT SINK MATERIAL

TECHNICAL FIELD

The present invention relates to a heat sink material for construction a heat sink which efficiently releases heat generated, for example, from an IC chip, and a method of producing the same.

BACKGROUND ART

In general, heat is an enemy for the IC chip and it is necessary that the internal temperature thereof does not exceed the maximum allowable junction temperature. The electric power consumption per operation area is large in the semiconductor device such as a power transistor or a semiconductor rectifier element. Therefore, the generated heat amount cannot be sufficiently released with only the heat amount released from a case (package) and a lead of the semiconductor device. It is feared that the internal temperature of the device may be raised to cause thermal destruction.

This phenomenon also occurs in the same manner in the IC chip which carries a CPU. The amount of heat generation is increased during the operation in proportion to the improvement in clock frequency. It is an important matter to make the thermal design in consideration of the heat release.

In the thermal design for preventing the thermal destruction or the like, element design or package design is made on condition that a heat sink having a large heat release area is secured to a case (package) of the IC chip.

In general, a metal material such as copper and aluminum, which has a good thermal conductivity, is used as a material for the heat sink.

Recently, the IC chip such as CPU and memory is in a trend that the IC chip itself has a large size in accordance 10, with the high degree of integration of the element and the enlargement of the element-forming area, while it is intended to drive the IC chip at low electric power for the purpose of low electric power consumption. When the IC chip has such a large size, it is feared that the stress caused by the difference in thermal expansion between the semiconductor substrate (silicon substrate or GaAs substrate) and the heat sink is increased, and that the peeling-off phenomenon and the mechanical destruction occur in the IC chip.

In order to avoid such an inconvenience, for example, it may be pointed out that the low electric power driving of the IC chip should be realized, and the heat sink material should be improved. The low electric power driving of the IC chip is realized in the level of not more than 3.3 V at present and the TTL level (5 V) which has been hitherto used as the power source voltage becomes obsolete.

As for the constitutive material for the heat sink, it is insufficient to consider only the thermal conductivity. It is necessary to select a material which has a coefficient of thermal expansion approximately identical with those of silicon and GaAs, which are used as the semiconductor substrate, while having a high thermal conductivity at the same time.

A variety of reports have been made in relation to the improvement of the heat sink material, including, for example, a case in which aluminum nitride (AlN) is used and a case Cu (copper)-W (tungsten) is used. AlN is excellent in balance between the thermal conductivity and the thermal expansion. Especially, the coefficient of thermal expansion of AlN is approximately coincident with the coefficient of thermal expansion of Si. Therefore, AlN is preferred as a heat sink material for a semiconductor device in which a silicon substrate is used as the semiconductor substrate.

Cu—W is a composite material having both of the low thermal expansion of W and the high thermal conductivity of Cu. Further, Cu—W is mechanically machined with ease. Therefore, Cu—W is preferred as a constitutive material for a heat sink having a complicated shape.

Other instances have been suggested, wherein metal Cu is contained in a ratio of 20 to 40% by volume in a ceramic base material containing a major component of SiC (conventional technique 1, see Japanese Laid-Open Patent Publication No. 8-279569), and wherein a powder-sintered porous member of an inorganic substance is infiltrated with Cu by 5 to 30% by weight (conventional technique 2, see Japanese Laid-Open Patent Publication No. 59-228742).

The heat sink material concerning the conventional technique 1 is produced in the powder formation in which a green compact of SiC and metal Cu is formed to produce a heat sink. Therefore, the coefficient of thermal expansion and the coefficient of thermal conductivity represent only theoretical values. It is impossible to obtain the balance between the coefficient of thermal expansion and the coefficient of thermal conductivity required for actual electronic parts etc.

The conventional technique 2 uses a low ratio of Cu with which the powder-sintered porous member composed of the inorganic substance is infiltrated. It is feared that a limit may arise to enhance the thermal conductivity thereby.

On the other hand, a composite material, which is obtained by combining carbon and metal, has been developed and practically used. However, such a composite material is used, for example, as an electrode for the discharge machining when the metal is Cu. When the metal is Pb, such a composite material is used, for example, as a bearing material. No case is known for the application as a heat sink material.

That is, in the present circumstances, the coefficient of thermal conductivity is at most 140 W/mK for the composite material obtained by combining carbon and metal, which cannot satisfy the value of not less than 160 W/mK required for the heat sink material for the IC chip.

DISCLOSURE OF THE INVENTION

The present invention has been made taking the foregoing problems into consideration, and an object thereof is to provide a heat sink material which makes it possible to obtain characteristics adapted to the balance between the coefficient of thermal expansion and the coefficient of thermal conductivity required for actual electronic parts (including semiconductor devices) etc.

Another object of the present invention is to provide a method of producing with ease a heat sink material having characteristics adapted to the balance between the coefficient of thermal expansion and the coefficient of thermal conductivity required for actual electronic parts (including semiconductor devices) etc., and the method for improving the productivity of a high quality heat sink.

According to the present invention, there is provided a heat sink material comprising carbon or allotrope thereof and metal. An average coefficient of thermal conductivity of those in directions of orthogonal three axes, or a coefficient of thermal conductivity in a direction of any axis is not less than 160 W/mK. Accordingly, it is possible to obtain the heat sink material in which the coefficient of thermal expansion is approximately coincident with those of the ceramic substrate (such as silicon or GaAs), and the semiconductor substrate (such as silicon or GaAs), etc., and the thermal conductivity is satisfactory.

It is also possible to obtain the heat sink material wherein the average coefficient of thermal conductivity of those in the directions of the orthogonal three axes, or the coefficient of thermal conductivity in the direction of any axis is not less than 180 W/mK, and wherein a coefficient of thermal expansion is $1 \times 10^{-6}$ to $10 \times 10^{-6}/°$ C.

It is preferable that the allotrope is graphite or diamond. Further, it is preferable that the carbon or the allotrope thereof has a coefficient of thermal conductivity of not less than 100 W/mK.

The heat sink material can be constructed by infiltrating a porous sintered member with the metal, the porous sintered member being obtained by sintering the carbon or the allotrope thereof to form a network.

In this case, it is preferable that a porosity of the porous sintered member is 10 to 50% by volume, and an average pore diameter is 0.1 to 200 $\mu$m. It is preferable that as for volume ratios between the carbon or the allotrope thereof and the metal, the volume ratio of the carbon or the allotrope thereof is within a range from 50 to 80% by volume, and the volume ratio of the metal is within a range from 50 to 20% by volume.

It is preferable that an additive is added to the carbon or the allotrope thereof for decreasing a closed porosity when the carbon or the allotrope thereof is sintered. The additive may be exemplified by SiC and/or Si.

It is also preferable that the heat sink material is constructed by infiltrating a preformed product with the metal, the preformed product being prepared by mixing water or a binder with powder of the carbon or the allotrope thereof, and forming an obtained mixture under a predetermined pressure. In this case, it is preferable that an average powder particle size of the powder is 1 to 2000 $\mu$m, and a length ratio is not more than 1:5 between a direction in which the powder has a minimum length and a direction in which the powder has a maximum length. In this case, although there is no strong network, it is possible to make an arbitrary shape.

It is preferable that as for volume ratios between the carbon or the allotrope thereof and the metal, the volume ratio of the carbon or the allotrope thereof is within a range from 20 to 80% by volume, and the volume ratio of the metal is within a range from 80 to 20% by volume.

It is also preferable that the heat sink material is constructed by mixing powder of the carbon or the allotrope thereof with the metal dissolved into a liquid state or a solid-liquid co-existing state to obtain a mixture, and casting the obtained mixture.

It is preferable that a closed porosity of the produced heat sink material is not more than 12% by volume.

It is preferable that an element for improving wettability at an interface is added to the metal. It is possible to adopt one or more of those selected from Te, Bi, Pb, Sn, Se, Li, Sb, Tl, Ca, Cd, and Ni as the element to be added. Especially, Ni has an effect that carbon is easily dissolved and easily infiltrated.

It is preferable that the metal is added with an element for improving reactivity with the carbon or the allotrope thereof. It is possible to adopt one or more of those selected from Nb, Cr, Zr, Be, Ti, Ta, V, B, and Mn, as the element to be added.

It is preferable that an element, which has a temperature range of solid phase/liquid phase of not less than 30° C., desirably not less than 50° C., is added to the metal in order to improve molten metal flow performance. Accordingly, it is possible to reduce the dispersion during the infiltration, the residual pores are decreased, and it is possible to improve the strength. The equivalent effect can be also obtained by increasing the infiltration pressure. It is possible to adopt one or more of those selected from Sn, P, Si, and Mg as the element to be added. Further, it is preferable that an element for lowering a melting point is added to the metal. The element to be added is Zn, for example.

It is preferable that an element for improving the coefficient of thermal conductivity is added to the metal. In this case, it is preferable that an element for improving the coefficient of thermal conductivity is added to the metal, and an alloy of the element and the metal is obtained by segregation or the like after a heat treatment, processing, and reaction with carbon, the alloy has a coefficient of thermal conductivity of not less than 10 W/mK. It is preferable that the coefficient of thermal conductivity is desirably not less than 20 W/mK, more desirably not less than 40 W/mK, and most desirably not less than 60 W/mK.

It is the known effect brought about by the heat treatment that the coefficient of thermal conductivity is improved by combining aging of the added element, annealing, and processing. The feature described above is based on the use of this effect. It is also known that the reaction with carbon decreases the added element of copper, aluminum, and silver, resulting in improvement in coefficient of thermal conductivity. Further, it is also known that the added element is deposited on the surface etc. owing to the segregation or the like when the infiltrated metal is solidified, and the coefficient of thermal conductivity as a whole is improved. Therefore, it is possible to utilize such an effect as well.

The heat sink material can be also constructed such that powder of the carbon or the allotrope thereof is mixed with powder of the metal to obtain a mixture, and the obtained mixture is formed under a predetermined pressure. In this case, it is preferable that an average powder particle size of the powder of the carbon or the allotrope thereof and the powder of the metal is 1 to 500 $\mu$m.

The heat sink material can be also constructed such that a pulverized cut material of the carbon or the allotrope thereof is mixed with powder of the metal to obtain a mixture, and the obtained mixture is formed at a predetermined temperature under a predetermined pressure.

When the heat sink material is constructed by the forming process as described above, it is preferable that as for volume ratios between the carbon or the allotrope thereof and the metal, the volume ratio of the carbon or the allotrope thereof is within a range from 20 to 60% by volume, and the volume ratio of the metal is within a range from 80 to 40% by volume. Accordingly, it is possible to obtain the heat sink material in which the coefficient of thermal conductivity is not less than 200 W/mK, and a coefficient of thermal expansion is $3 \times 10^{-6}$ to $14 \times 10^{-6}/°$ C.

It In this case, it is preferable that an additive making it possible to perform re-sintering after forming process is added to the carbon or the allotrope thereof. The additive may be exemplified by SiC and/or Si.

It is preferable that a low melting point metal for improving wettability at an interface is added to the metal. It is possible to adopt one or more of those selected from Te, Bi, Pb, Sn, Se, Li, Sb, Se, Tl, Ca, Cd, and Ni as the low melting point metal.

It is preferable that an element for improving reactivity with the carbon or the allotrope thereof is added to the metal. It is possible to adopt one or more of those selected from Nb, Cr, Zr, Be, Ti, Ta, V, B, and Mn as the element to be added.

It is preferable that an element, which has a temperature range of solid phase/liquid phase of not less than 30° C., desirably not less than 50° C., is added to the metal in order to improve molten metal flow performance. Accordingly, it is possible to reduce the dispersion during the infiltration, the residual pores are decreased, and it is possible to improve the strength. The same or equivalent effect can be also obtained by increasing the infiltration pressure. It is possible to adopt one or more of those selected from Sn, P, Si, and Mg as the element to be added. Further, it is preferable that an element for decreasing a melting point is added to the metal. The element to be in added is Zn, for example.

It is also preferable that a carbide layer is formed on a surface of the carbon or the allotrope thereof by means of a reaction at least between the carbon or the allotrope thereof and the element to be added. In this case, it is possible to adopt one or more of those selected from Ti, W, Mo, Nb, Cr, Zr, Be, Ta, V, B, and Mn as the element to be added.

It is possible to adopt at least one selected from Cu, Al, and Ag, as the metal to be combined with the carbon or the allotrope thereof. Each of the metals Cu, Al, and Ag has high conductivity.

In the present invention, a ratio of coefficient of thermal conductivity is not more than 1:5 between a direction in which the coefficient of thermal conductivity is minimum and a direction in which the coefficient of thermal conductivity is maximum. Accordingly, the coefficient of thermal conductivity has a characteristic approximately equal to the isotropic characteristic. Therefore, the heat is diffused in a well-suited manner. Thus, the heat sink material is preferably used for a heat sink. Further, it is unnecessary to consider the direction of installation case by case, thereby advantageous on the practical mounting.

According to another aspect of the present invention, there is provided a method of producing a heat sink material, comprising the steps of: sintering carbon or in allotrope thereof to form a network for obtaining a porous sintered member; infiltrating the porous sintered member with metal; and cooling the porous sintered member infiltrated with at least the metal.

Accordingly, it is possible to easily produce the heat sink material having a coefficient of thermal expansion approximately coincident with those of a ceramic substrate (such as silicon or GaAs), a semiconductor substrate (such as silicon or GaAs), etc., and having good thermal conductivity. It is possible to improve the productivity of a heat sink having a high quality.

It is also preferable that in the sintering step, the carbon or the allotrope thereof is placed in a vessel, and an interior of the vessel is heated to produce the porous sintered member of the carbon or the allotrope thereof.

It is also preferable that in the infiltrating step, the porous sintered member is immersed in molten metal of the metal introduced into a vessel, and the porous sintered member is infiltrated with the molten metal by introducing infiltrating gas into the vessel to pressurize an interior of the vessel. In this case, it is preferable that the force of the pressurization is four to five times as strong as a compressive strength of the porous sintered member of the carbon or the allotrope thereof or less than four to five times the compressive strength of the porous sintered member. Alternatively, the force of the pressurization is preferably 1.01 to 202 MPa (10 to 2000 atmospheres). In the cooling step in this case, the infiltrating gas in a vessel may be vented, and cooling gas may be quickly introduced to cool an interior of the vessel.

The following method is exemplified as another production method. The sintering step includes a step of setting the carbon or the allotrope thereof in a case, and a step of preheating an interior of the case to prepare the porous sintered member of the carbon or the allotrope thereof. The infiltrating step includes a step of setting the case in a mold of a press machine, a step of pouring molten metal of the metal into the case, and a step of forcibly pressing the molten metal downwardly with a punch of the press machine to infiltrate the porous sintered member in the case with the molten metal.

In this case, it is preferable that a pressure of the forcible pressing by the punch is four to five times as strong as a compressive strength of the porous sintered member of the carbon or the allotrope thereof or less than four to five times the compressive strength of the porous sintered member. Alternatively, the preferable pressure is 1.01 to 202 MPa (10 to 2000 atmospheres). It is preferable that a mold formed with a gas vent hole for venting any remaining gas in the porous sintered member or formed with a gap for venting gas.

It is also preferable that in the cooling step, the heat sink material, in which the porous sintered member is infiltrated with the metal, is cooled by cooling gas blown thereagainst or by using a cooling zone or a cooling mold where cooling water is supplied.

According to still another aspect of the present invention, there is provided a method of producing a heat sink material, comprising the steps of: mixing water or a binder with powder of carbon or allotrope thereof to obtain a mixture; forming the obtained mixture into a preformed product under a predetermined pressure; and infiltrating the preformed product with metal.

According to still another aspect of the present invention, there is provided a method of producing a heat sink material, comprising the steps of: mixing powder of carbon or allotrope thereof with metal dissolved into a liquid state or a solid-liquid co-existing state to obtain a mixture; and casting the obtained mixture.

According to still another aspect of the present invention, there is provided a method of producing a heat sink material, comprising the steps of: mixing powder of carbon or allotrope thereof with powder of metal to obtain a mixture; and pressurizing the obtained mixture placed in a mold of a hot press machine at a predetermined temperature under a predetermined pressure to form into the heat sink material.

According to still another aspect of the present invention, there is provided a method of producing a heat sink material, comprising the steps of: mixing powder of carbon or allotrope thereof with powder of metal to obtain a mixture; preforming the obtained mixture to prepare a preformed product; and pressurizing the preformed product placed in a mold of a hot press machine at a predetermined temperature under a predetermined pressure to form into the heat sink material.

According to still another aspect of the present invention, there is provided a method of producing a heat sink material, comprising the steps of: mixing a pulverized cut material of carbon or allotrope thereof with powder of metal, and preforming to prepare a mixture; and pressurizing the mixture placed in a mold of a hot press machine at a predetermined temperature under a predetermined pressure to form into the heat sink material.

According to still another aspect of the present invention, there is provided a method of producing a heat sink material, comprising the steps of: mixing a pulverized cut material of carbon or allotrope thereof with powder of metal to obtain a mixture; preforming the obtained mixture to prepare a preformed product; and pressurizing the preformed product placed in a mold of a hot press machine at a predetermined temperature under a predetermined pressure to form into the heat sink material.

In the production methods described above, it is preferable that the predetermined temperature is relatively −10° C. to −50° C. with respect to a melting point of the metal, and it is preferable that the predetermined pressure is 10.13 to 101.32 MPa (100 to 1000 atmospheres).

In the production methods described above, it is also preferable that the heat sink material is heated to a temperature of not less than a melting point of the metal after the pressurizing step.

Further, it is also preferable that the metal is at least one selected from Cu, Al, and Ag.

BRIEF DESCRIPTION OF THE DRAWINGS

FIG. 17 shows a table illustrating characteristics of the heat sink material according to the fifth production method;

FIG. 19 shows a table illustrating results of an exemplary experiment concerning a carbon P;

FIG. 20 shows a table illustrating results of an exemplary experiment concerning a carbon M;

FIG. 21 shows a table illustrating results of an exemplary experiment concerning a carbon N;

FIG. 22 shows a table illustrating characteristics of carbons P, M, and N;

FIG. 23 shows a table in which representative examples concerning a case based on a mold press and a case based on gas pressurization are extracted from the experimental results;

FIG. 30 shows a table illustrating the difference of the reaction situation of SiC/Cu and the infiltration situation of Cu when appropriate change is made for the porosity of SiC, the pore diameter, the presence or absence of Ni plating, the presence or absence of Si infiltration, the infiltration temperature, the pressurization, the pressurization time, and the cooling speed;

DETAILED DESCRIPTION OF THE INVENTION

Illustrative embodiments of the heat sink material and the method of producing the same according to the present invention will be explained below with reference to FIGS. 1 to 40.

Figure 1:
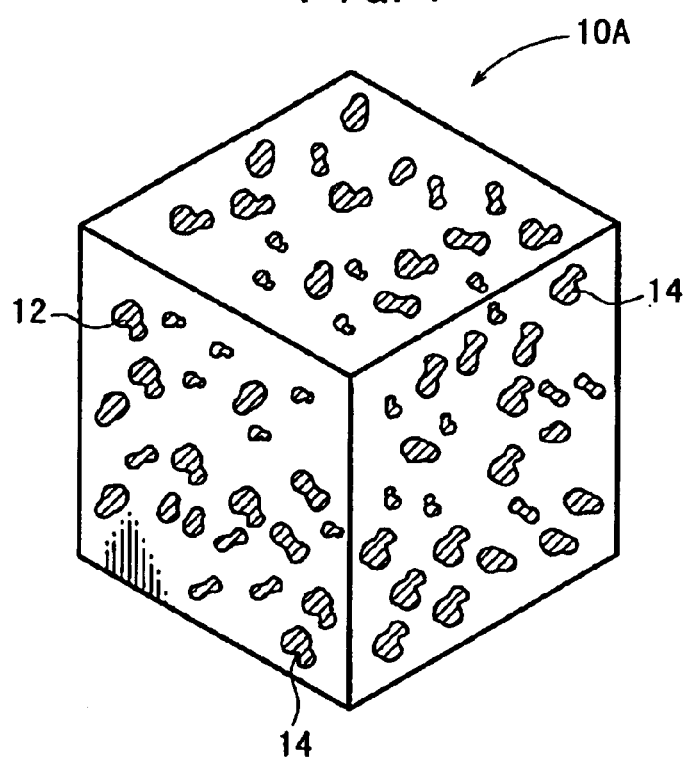
FIG. 1 shows a perspective view illustrating construction of a heat sink material according to a first embodiment.

As shown in FIG. 1, a heat sink material 10A according to the first embodiment comprises a porous sintered member 12 obtained by sintering carbon or allotrope thereof to form a network, in which the porous sintered member 12 is infiltrated with metal 14.

In this case, the carbon preferably used or the allotrope thereof has a coefficient of thermal conductivity of not less than 100 W/mK, desirably not less than 150 W/mK (estimated value in a state in which no pore exists), and more desirably not less than 200 W/mK (estimated value in a state in which no pore exists).

This embodiment is illustrative of a case of the heat sink material in which open pores of the porous sintered member 12 of graphite having a coefficient of thermal conductivity of not less than 100 W/mK are infiltrated with copper. Those usable as the metal 14 of infiltration other than copper include aluminum and silver.

As for the volume ratios of the porous sintered member 12 and the metal 14, the volume ratio of the porous sintered member 12 is within a range from 50 to 80% by volume, and the volume ratio of the metal 14 is within a range from 50 to 20% by volume. Accordingly, it is possible to obtain the heat sink material in which the average coefficient of thermal conductivity of those in the directions of the orthogonal three axes, or the coefficient of thermal conductivity in the direction of any axis is 180 to 220 W/mK or more, and in which the coefficient of thermal expansion is $1 \times 10^{-6}$ to $10 \times 10^{-6}/°$ C.

The porosity of the porous sintered member 12 is desirably 10 to 50% by volume, for the following reason. That is, if the porosity is not more than 10% by volume, it is impossible to obtain the average coefficient of thermal conductivity of those in the directions of the orthogonal three axes, or the coefficient of thermal conductivity in the direction of any axis of not less than 180 W/mK (room temperature). If the porosity exceeds 50% by volume, then the strength of the porous sintered member 12 is lowered, and it is impossible to suppress the coefficient of thermal expansion to be not more than $15.0 \times 10^{-6}/°$ C.

It is desirable that the value of the average open pore diameter (pore diameter) of the porous sintered member 12 is 0.1 to 200 $\mu$m. If the pore diameter is less than 0.1 $\mu$m, then it is difficult to infiltrate the interior of the open pores with the metal 14, and the coefficient of thermal conductivity is lowered. On the other hand, if the pore diameter exceeds 200 $\mu$m, then the strength of the porous sintered member 12 is lowered, and it is impossible to suppress the coefficient of thermal expansion to be low.

As for the distribution (pore distribution) in relation to the average open pores of the porous sintered member 12, it is preferable that not less than 90% by volume of the pores having diameters from 0.5 to 50 $\mu$m are distributed. If the pores of 0.5 to 50 $\mu$m are distributed by less than 90% by volume, then the open pores, which are not infiltrated with the metal 14, are increased, and the coefficient of thermal conductivity may be lowered.

As for the closed porosity of the heat sink material 10A obtained by infiltrating the porous sintered member 12 with the metal 14, it is preferable that the closed porosity is not more than 12% by volume. If the closed porosity exceeds 5% by volume, the coefficient of thermal conductivity may be lowered.

An automated porosimeter (trade name: Autopore 9200), which is produced by Shimadzu Corporation, was used to measure the porosity, the pore diameter, and the pore distribution.

In the heat sink material 10A according to the first embodiment, it is preferable that the graphite is added with an additive which reduces the closed porosity when the graphite is sintered. The additive is exemplified by SiC and/or Si. Accordingly, it is possible to decrease the closed pores upon the sintering, and it is possible to improve the infiltration ratio of the metal 14 with respect to the porous sintered member 12.

It is also preferable that an element, which reacts with the graphite, may be added to the graphite. The element to be added is exemplified by one or more of those selected from Ti, W, Mo, Nb, Cr, Zr, Be, Ta, V, B, and Mn. Accordingly, a reaction layer (carbide layer) is formed on the surface of the graphite (including the surface of the open pore) during the sintering of the graphite. The wettability is improved with respect to the metal 14 with which the open pores of the graphite are infiltrated. The infiltration can be performed at a low pressure. Further, fine open pores can be also infiltrated with the metal.

On the other hand, it is preferable that one or more of those selected from Te, Bi, Pb, Sn, Se, Li, Sb, Tl, Ca, Cd, and Ni are added to the metal 14 with which the porous sintered member 12 is infiltrated. Accordingly, the wettability is improved for the interface between the porous sintered member 12 and the metal 14. The metal 14 easily enters the open pores of the porous sintered member 12. Especially, Ni makes carbon easily dissolved and subject to the infiltration.

It is preferable that one or more of those selected from Nb, Cr, Zr, Be, Ti, Ta, V, B, and Mn are added to the metal 14 with which the porous sintered member 12 is infiltrated. Accordingly, the reactivity between the graphite and the metal is improved. The graphite and the metal easily make tight contact with each other in the open pores. It is possible to suppress the occurrence of closed pores.

Further, it is preferable that an element having a temperature range of solid-liquid phase of not less than 30° C., desirably not less than 50° C., for example, one or more of those selected from Sn, P, Si, and Mg are added to the metal 14 with which the porous sintered member 12 is infiltrated. That is because the molten metal flow performance is improved and the residual pores are decreased. Accordingly, it is possible to reduce the dispersion upon the infiltration. Further, the residual pores are decreased, and it is possible to improve the strength. The equivalent effect can be also obtained by increasing the infiltration pressure. It is preferable that an element to lower the melting point is added to the metal 14. Zn can be an additive element, for example.

Next, explanation will be made with reference to FIGS. 2A to 8 for several methods of producing the heat sink material 10A according to the first embodiment.

Both of first and second production methods of producing the heat sink material 10A according to the first embodiment comprise a sintering step of producing the porous sintered member 12 by sintering graphite to form a network, and an infiltrating step of infiltrating the porous sintered member 12 with the metal 14.

Figure 2B:
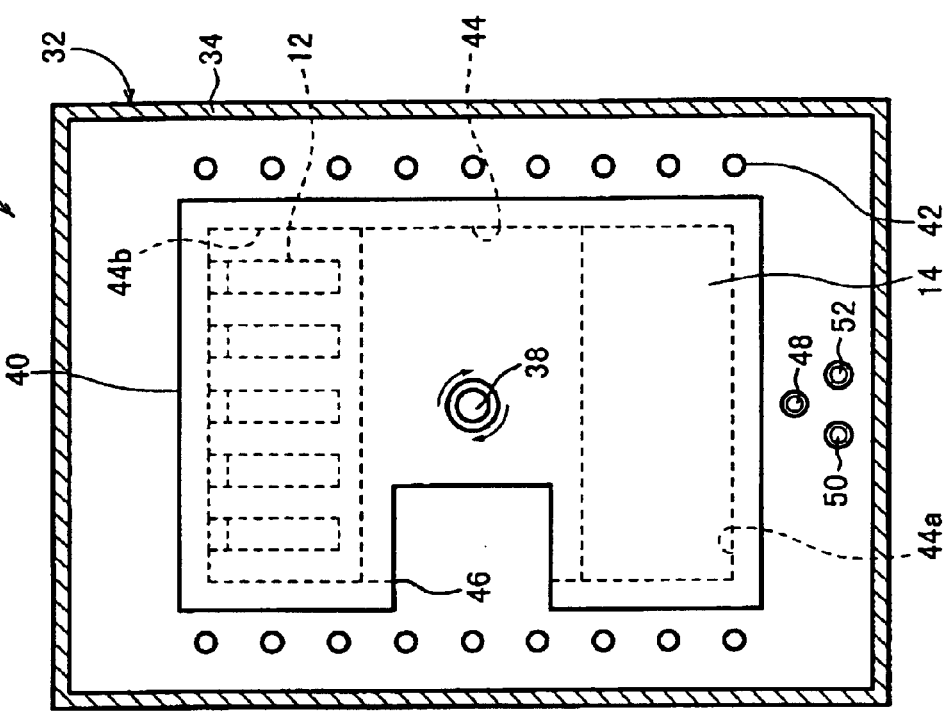
FIG. 2B shows, with partial cutaway, a side of the high pressure vessel.
Figure 2A:
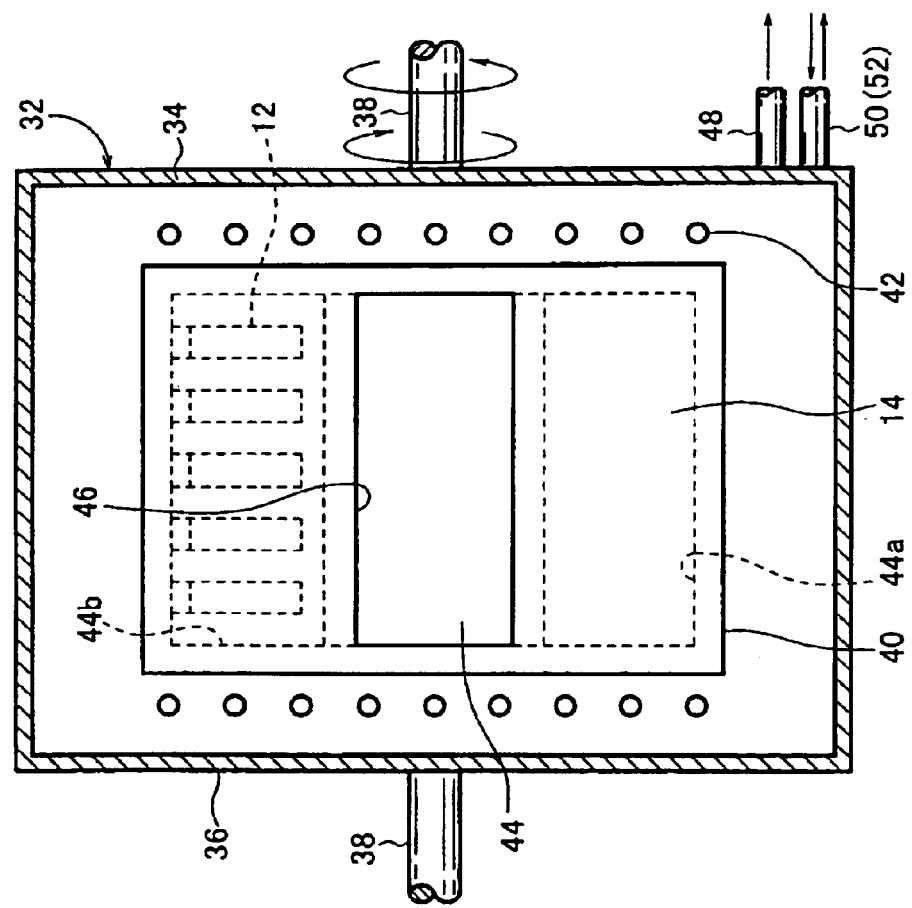
FIG. 2A shows, with partial cutaway, a front of a high pressure vessel to be used in a first production method.

As specifically shown in FIGS. 2A and 2B by way of example, the first production method is carried out by using a high pressure vessel 30. The high pressure vessel 30 is provided with rotary shafts 38 at approximately central portions of both side plates 34, 36 of a boxy casing 32, respectively. The casing 32 itself is rotatable about the center of the rotary shafts 38.

A refractory vessel 40 and a heater 42 for heating the refractory vessel 40 are provided in the casing 32. The refractory vessel 40 is a box-shaped object provided with a hollow section 44. An opening 46 communicating with the hollow section 44 is provided at a central portion in the height direction at one side surface. An ingot of the metal 14 or molten metal of the metal 14 as a material for the infiltration is set in one part of the hollow section (hereinafter referred to as a "first chamber 44a") of the hollow section 44 which is divided by the center of the opening 46.

A plurality of the porous sintered members 12 as a material subjected to the infiltration are attached to the other part of the hollow section (hereinafter referred to as a "second chamber 44b"). A support mechanism for the porous sintered members 12 is provided so that the porous sintered members 12 do not fall downwardly even when the second chamber 44b is located upwardly. The heater 42 has a structure which is not destroyed even at a high pressure of 300 MPa.

The high pressure vessel 30 is provided with a suction tube 48 for evacuation, and an introducing tube 50 and a discharge tube 52 for a gas applying high pressure and a cooling gas.

Next, explanation will be made with reference to FIG. 3 for the first production method based on the use of the high pressure vessel 30.

At first, in step S1, the porous sintered member 12 of graphite is prepared by performing a step of forming graphite into a rod shape, a step of infiltrating graphite with a pitch (a kind of coal tar), and a step of heating and sintering graphite.

When the graphite is formed to be the rod shape, the pitch is mixed with graphite powder and extruded in an atmosphere at about 150° C. into the rod shape ($\phi$100 to $\phi$600, the length is about 3000 mm). The graphite at this stage includes many pores, and it has a low coefficient of thermal conductivity.

Subsequently, vacuum degassing is performed in order to decrease the pores of the graphite. The graphite is infiltrated with the pitch in the vacuum and sintered at about 1000° C. These steps are repeated about three times.

Then, the graphite is further heated and sintered in a furnace at about 3000° C. in order to improve the coefficient of thermal conductivity. In this procedure, the furnace is covered with carbon powder in order to prevent the graphite from burning, and the graphite itself is covered with carbon powder. The step of heating the graphite may be performed by directly applying electricity to the graphite to effect heating and sintering.

In accordance with the above procedure, the porous sintered member 12 is obtained. It is desirable that the porous sintered member 12 is further pre-machined depending on the shape of the final product.

After that, in step S2, for the initial state the high pressure vessel 30 is located such that the first chamber 44a is positioned at the lower side of the refractory vessel 40 provided inside of the high pressure vessel 30.

After that, the porous sintered members 12 and the ingot of the metal 14 are placed in the refractory vessel 40 of the high pressure vessel 30. The ingot of the metal 14 is arranged in the first chamber 44a of the refractory vessel 40, and the porous sintered members 12 are set in the second chamber 44b (step S3). At this time, it is preferable that the porous sintered members 12 are preheated beforehand. The preheating is performed such that the porous sintered member 12 is set in a carbon case or it is covered with a heat-insulating material. When the temperature becomes a predetermined temperature, the porous sintered member 12 is set to the second chamber 44b as described above exactly in the state in which the porous sintered member 12 is set in the case or it is covered with the heat-insulating material.

Next, the high pressure vessel 30 (and the refractory vessel 40) is tightly enclosed, and then the interior of the high pressure vessel 30 is evacuated by the aid of the suction tube 48 to give a negative pressure state in the high pressure vessel 30 (step S4).

The electric power is applied to the heater 42 to heat and melt the metal 14 in the first chamber 44a (step S5). In the following description, the heated and melted metal 14 is referred to as "molten metal 14" as well for convenience.

After that, when the molten metal 14 in the first chamber 44a arrives at a predetermined temperature, the high pressure vessel 30 is rotated by 180 degrees (step S6). As a result of the rotating operation, the first chamber 44a is located at the upper side. Therefore, the molten metal 14 in the first chamber 44a falls by its own weight into the second chamber 44b which is disposed at the lower side. Then, the porous sintered members 12 are immersed in the molten metal 14.

Subsequently, an infiltrating gas is introduced into the high pressure vessel 30 via the gas-introducing tube 50 to pressurize the interior of the high pressure vessel 30 (step S7). Owing to this pressurization treatment, the open pores of the porous sintered members 12 are infiltrated with the molten metal 14.

The procedure immediately proceeds to the cooling step at the point of time when the infiltrating step is completed. In the cooling step, the high pressure vessel 30 is firstly rotated by 180 degrees again (step S8). As a result of the rotating operation, the first chamber 44a is located at the lower side. Therefore, the molten metal 14 in the second chamber 44b falls into the first chamber 44a again.

The open pores of the porous sintered members 12 are infiltrated with a part of the molten metal 14 owing to the pressurization treatment (infiltration treatment) in step S7 described above. Therefore, the molten metal 14, which falls into the first chamber 44a at the lower side, is residual molten metal with which the porous sintered members 12 are not infiltrated. When the residual molten metal falls into the first chamber 44a, the porous sintered members 12, which are infiltrated with the molten metal 14, remain in the second chamber 44b.

After that, the infiltrating gas in the high pressure vessel 30 is discharged via the gas discharge tube 52. Simultaneously with the discharging, the cooling gas is introduced into the high pressure vessel 30 via the gas-introducing tube 50 (step S9). Owing to the discharge of the infiltrating gas and the introduction of the cooling gas, the cooling gas is thoroughly circulated in the high pressure vessel 30. Thus, the high pressure vessel 30 is quickly cooled. Owing to the quick cooling, the molten metal 14, with which the porous sintered member 12 is infiltrated, is quickly solidified into mass of the metal 14, and the volume is expanded. Therefore, the infiltrating metal 14 is tightly retained in the porous sintered member 12.

Figure 3:
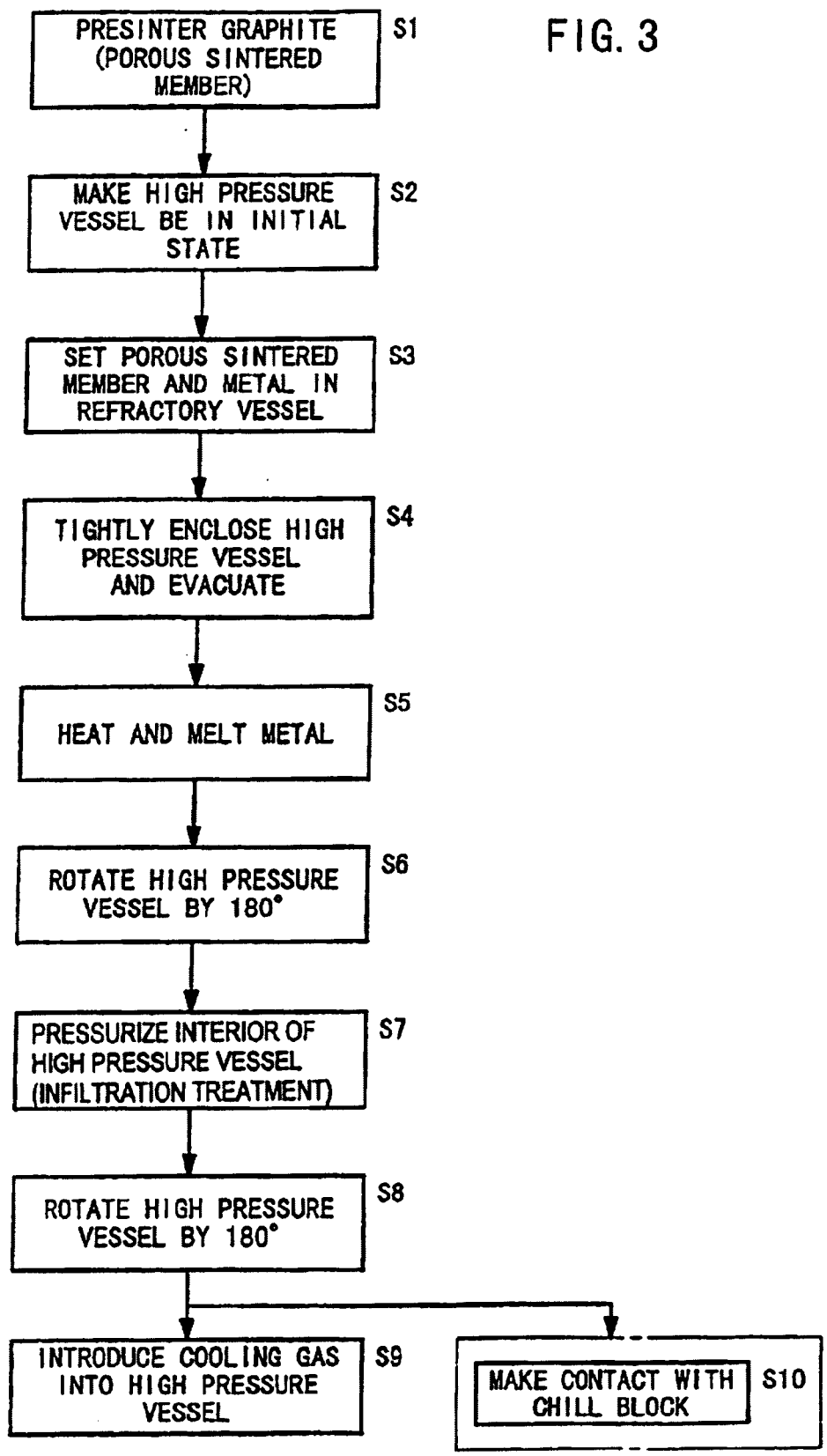
FIG. 3 shows a block diagram illustrating steps of the first production method.

Another cooling step is shown in a frame indicated by dashed lines in FIG. 3. The high pressure vessel 30 or the porous sintered member 12 infiltrated with the molten metal 14 is transported to a cooling zone when the treatment in step S8 is completed. The high pressure vessel 30 or the porous sintered member 12 infiltrated with the molten metal is made contact with a chill block installed in the cooling zone (see step S10).

By the contact with the chill block, the porous sintered member 12 is quickly cooled. The cooling process may be performed while blowing the porous sintered member 12 with a cooling gas, or cooling the chill block with water. Especially, it is preferable that the cooling is performed while taking the molten metal feeding effect into consideration.

The infiltration treatment for the porous sintered member 12 composed of graphite with the metal 14 can be easily carried out by performing the respective steps of the first production method as described above. Further, the infiltration ratio of the metal 14 in the porous sintered member 12 can be improved. It is possible to easily obtain the heat sink material 10A in which the average coefficient of thermal conductivity of those in the directions of the orthogonal three axes, or the coefficient of thermal conductivity in the direction of any axis is 180 to 220 W/mK or more, and the coefficient of thermal expansion is $1 \times 10^{-6}$ to $10 \times 10^{-6}/°$ C.

However, when SiC is adopted for the porous sintered member as described later on, it is possible to obtain a heat sink material in which the average coefficient of thermal expansion of those from room temperature to 200 ° C. is $4.0 \times 10^{-6}$ to $9.0 \times 10^{-6}/°$ C., and the average coefficient of thermal conductivity of those in the directions of the orthogonal three axes, or the coefficient of thermal conductivity in the direction of any axis is not less than 160 W/mK (room temperature), preferably not less than 180 W/mK.

In step S5 described above, when the heater 42 is powered to heat and melt the metal 14 in the first chamber 44a, it is desirable that the predetermined temperature (heating temperature) to proceed to step S6 is preferably a temperature higher than the melting point of the metal 14 by 30° C. to 25° C., and more preferably a temperature higher than the melting point by 50° C. to 200° C. In this case, it is preferable that the interior of the high pressure vessel is in vacuum of not more than $1 \times 10^{-3}$ Torr.

In step S7 described above, the pressure applied to the high pressure vessel 30, by introducing the infiltrating gas into the high pressure vessel 30, is not less than 0.98 MPa and not more than 202 MPa. In this case, the pressure is preferably not less than 4.9 MPa and not more than 202 MPa, and more preferably not less than 9.8 MPa and not more than 202 MPa.

The higher pressure is preferred in view of the improvement in infiltration ratio and the improvement in cooling ability. However, if the pressure is excessively high, then the graphite tends to be destroyed, and the cost of the equipment endurable to the high pressure is expensive. Therefore, the pressure is selected in consideration of these factors.

It is preferable that the period of time to apply the pressure to the high pressure vessel 30 is favorably not less than 1 second and not more than 60 seconds, and desirably not less than 1 second and not more than 30 seconds.

As for the pores of the porous sintered member 12, as described above, it is desirable that those having an average diameter of 0.5 to 50 mm exist by not less than 90% by volume, and the porosity is 10 to 50% by volume.

However, when SiC is adopted for a porous sintered member described later on, it is desirable that those having an average diameter of 5 to 50 $\mu$m exist by not less than 90% by volume, and the porosity is 20 to 70% by volume.

It is desirable that the cooling speed in the cooling step is preferably −400° C./hour or faster, and more preferably −800° C./hour or faster in the period from the condition at temperature of the infiltration to the condition at 800° C.

In step S7 described above, the pressure necessary to completely infiltrate the open pores of the porous sintered member 12 with the metal 14 is applied to the high pressure vessel 30. In this case, if open pores remain not infiltrated with the metal 14 in the porous sintered member 12, the thermal conductivity is extremely inhibited. Therefore, it is necessary to apply the high pressure.

The pressure can be roughly presumed in accordance with the Washburn's equation. However, the smaller the pore diameter is, the larger the necessary force is. According to this equation, a pressure of 39.2 MPa is appropriate in the case of a pore meter having 0.1 $\mu$m$\phi$, a pressure of 3.92 MPa is appropriate in the case of 1.0 $\mu$m$\phi$, and a pressure of 0.392 MPa is appropriate in the case of 10 $\mu$m$\phi$. However, pores of not more than 0.01 $\mu$m$\phi$ actually exist in a material in which the average pore diameter is 0.1 $\mu$m$\phi$ (see FIGS. 31 and 32). Therefore, it is necessary to use a larger pressure. Specifically a pressure of 392 MPa is required in the case of 0.01 $\mu$m$\phi$.

Preferred examples of the element to be added to the graphite and the element to be added to the metal have been already described, and explanation thereof is omitted in this section.

Next, explanation will be made with reference to FIGS. 4 and 5 for several modified methods of the first production method.

Figure 4:
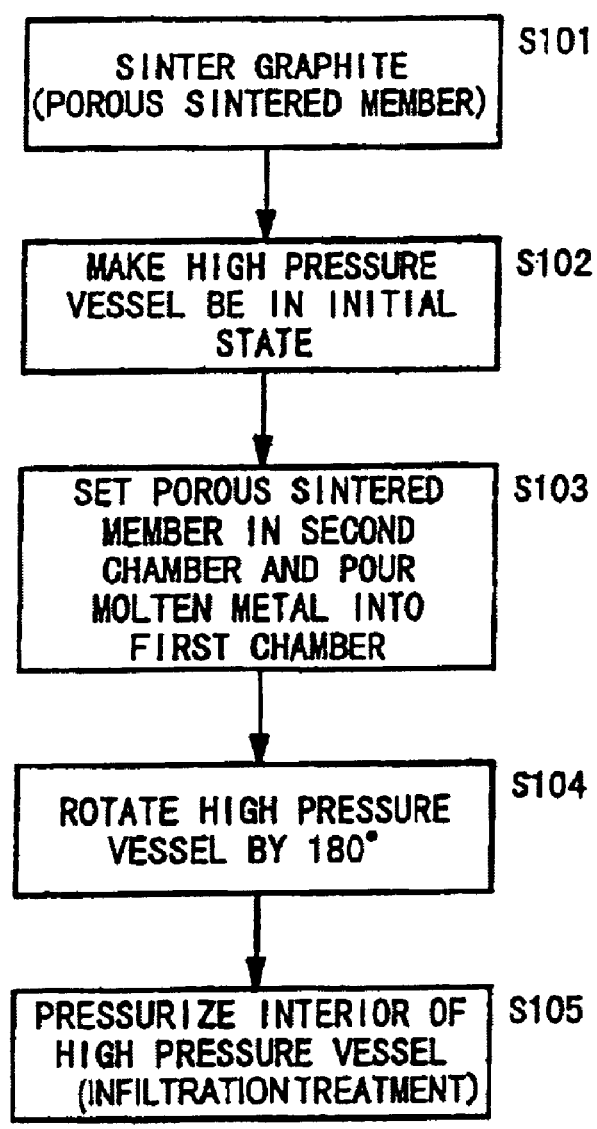
FIG. 4 shows a block diagram illustrating steps of a first modified method of the first production method.

In the first modified method, as shown in FIG. 4, graphite is firstly sintered to prepare a porous sintered member 12 composed of graphite (step S101). For the initial state, the high pressure vessel 30 is positioned at the lower side such that the first chamber 44a of the refractory vessel 40 provided in the high pressure vessel 30 (step S102).

After that, the porous sintered members 12 are set in the second chamber 44b, and the previously melted metal (molten metal) 14 is poured into the first chamber 44a (step S103).

Then, the high pressure vessel 30 is rotated by 180 degrees when the molten metal 14 in the first chamber 44a arrives at a predetermined temperature (step S104). As a result of the rotating operation, the molten metal 14 in the first chamber 44a falls into the second chamber 44b located at the lower side. Accordingly, the porous sintered member 12 is infiltrated with the molten metal 14.

After that, the infiltrating gas is introduced into the high pressure vessel 30 via the gas-introducing tube 50 to pressurize the interior of the high pressure vessel 30 (step S105). By the pressurization, the open pores of the porous sintered members 12 are infiltrated with the molten metal 14.

Next, the second modified method will be explained with reference to FIG. 5. In an infiltrating step of the second modified embodiment, the high pressure vessel 30 is used, which includes a partition plate (not shown) composed of a porous ceramic material provided at a central portion in the refractory vessel 40 installed in the high pressure vessel 30. The interior of the refractory vessel 40 is comparted by the partition plate into a first chamber 44a and a second chamber 44b.

As for the partition plate, it is desirable to use a porous ceramic material having the porosity of 40 to 90% by volume, and the pore diameter of 0.5 to 3.0 mm. More preferably, it is desirable to use a porous ceramic material having the porosity is 70 to 85% by volume, and the pore diameter of 1.0 to 2.0 mm.

Figure 5:
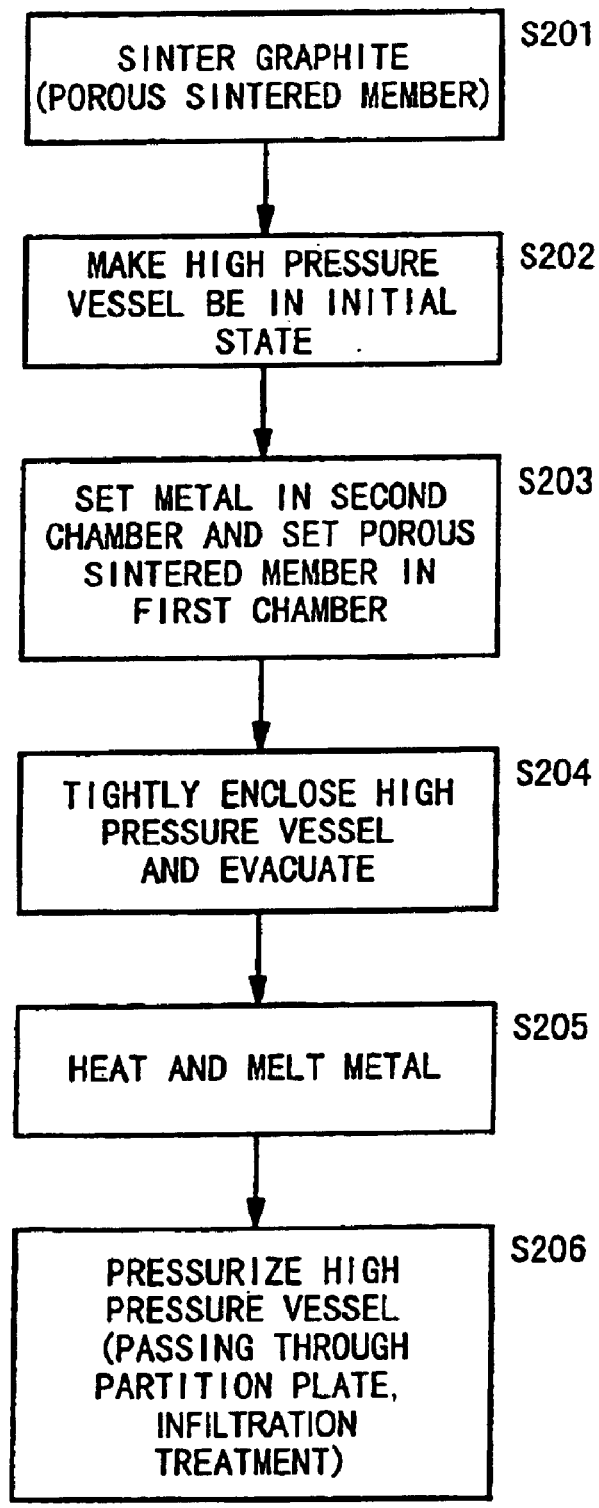
FIG. 5 shows a block diagram illustrating steps of a second modified method of the first production method.

In the second modified embodiment, as shown in FIG. 5, graphite is firstly sintered to prepare a porous sintered member 12 of graphite (step S201). For the initial state, the high pressure vessel 30 is located such that the first chamber 44a of the refractory vessel 40 provided in the high pressure vessel 30 is positioned on the lower side, and the second chamber 44b is positioned on the upper side (step S202).

Then, the porous sintered members 12 and the ingot of the metal 14 are placed in the refractory vessel 40 of the high pressure vessel 30. The ingot of the metal 14 is positioned on the upper side in the second chamber 44b, and the porous sintered members 12 are set in the first chamber 44a positioned on the lower side (step S203).

Subsequently, the high pressure vessel 30 (as well as refractory vessel 40) is tightly enclosed, and then the evacuation is effected for the interior of the high pressure vessel 30 by the aid of the suction tube 48 so that the interior of the high pressure vessel 30 is in the negative pressure state (step S204).

The heater 42 is powered to heat and melt the metal 14 in the second chamber 44b (step S205). When the molten metal 14 arrives at a predetermined temperature, the infiltrating gas is introduced into the high pressure vessel 30 via the gas-introducing tube 50 to pressurize the interior of the high pressure vessel 30 (step S206). By the pressurization treatment, the molten metal 44 in the second chamber 44b positioned on the upper side passes through the partition plate, and the open pores of the porous sintered members 12 in the first chamber 44a positioned on the lower side are infiltrated therewith.

Next, a second production method will be explained with reference to FIGS. 6 to 8. In the second production method, a furnace 60 for sintering graphite to prepare the porous sintered member 12 as shown in FIG. 6 and a press machine 62 for infiltrating the porous sintered member 12 with the metal 14 as shown in FIG. 7 are used.

Figure 6:
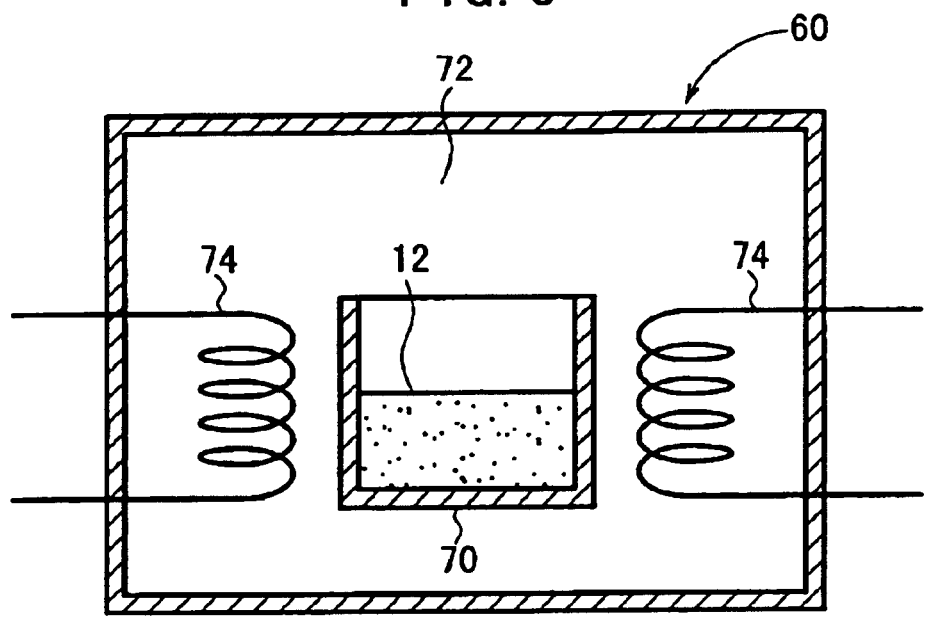
FIG. 6 shows an arrangement of a furnace to be used in a second production method.

As shown in FIG. 6, the furnace 60 has inside thereof a space 72 capable of setting a case 70, and a heater 74 used to heat the case 70 set in the space 72. The case 70 is composed of, for example, a material such as graphite, ceramics, cerapaper (heat-insulating material composed of ceramics such as alumina). The graphite is set in the case 70.

Figure 7:
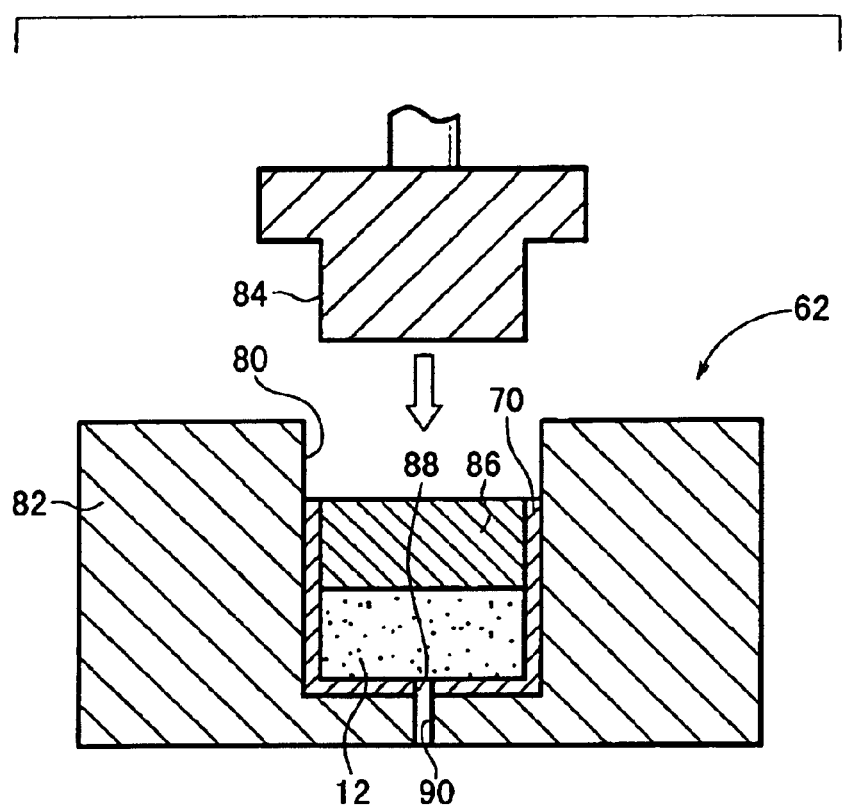
FIG. 7 shows a press machine to be used in the second production method.
Figure 8:
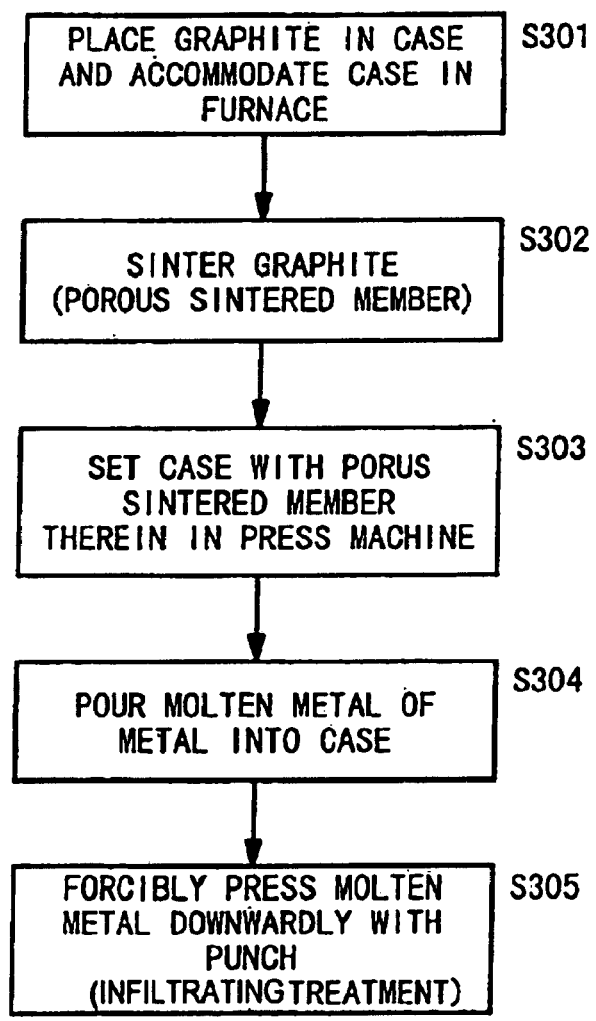
FIG. 8 shows a block diagram illustrating steps of the second production method.

As shown in FIG. 7, the press machine 62 has a mold 82 which has a recess 80 with an upper opening, and a punch 84 insertable into the recess 80 and forcibly pressing the contents in the recess 80 downwardly.

Next, explanation will be made with reference to FIG. 8 for the second production method based on the use of the furnace 60 and the press machine 62.

At first, the graphite is placed in the case 70, and the case 70 is set in the furnace 60 (step S301). The atmosphere in the furnace 60 is heated to sinter the graphite so that the porous sintered member 12 is prepared (step S302).

Alternatively, in this step, a current may be applied to the graphite to heat it up to about 3000° C. so that the porous sintered member 12 is prepared.

After that, the case 70 with the porous sintered member 12 therein is taken out of the furnace 60, and is set in the recess 80 of the press machine 62 (step S303).

Subsequently, the molten metal 86 of the metal 14 is poured into the case 70 (step S304), and then the punch 84 is inserted into the recess 80. The molten metal 86 in the case 70 is forcibly pressed downwardly (step S305). Owing to the pressing treatment with the punch 84, the open pores of the porous sintered member 12 are infiltrated with the molten metal 86 of the metal 14.

In the second production method described above, it is preferable that the pressure during the forcible pressing process with the punch 84 is 1.01 to 202 MPa (10 to 2000 atmospheres). As shown in FIG. 7, gas vent holes 88, 90 and/or gaps for venting the gas remaining in the porous sintered member 12 may be formed at the bottom of the case 70 and/or the bottom of the mold 82. In this case, the gas remaining in the porous sintered member 12 is vented through 20 the gas vent holes 88, 90 during the forcible pressing process with the punch 84. Therefore, the infiltration of the open pores with the molten metal 86 is smoothly performed.

As described above, when the respective steps of the second production method are carried out, the porous sintered member 12 composed of graphite can be easily subjected to the infiltration treatment with the metal 14. Further, it is possible to improve the ratio of infiltration of the porous sintered member 12 with the metal 14. It is possible to easily obtain the heat sink material 10A in which the average coefficient of thermal conductivity of those in the directions of the orthogonal three axes, or the coefficient of thermal conductivity in the direction of any axis is 180 to 220 W/mK or more, and the coefficient of thermal expansion is $1 \times 10^{-6}$ to $10 \times 10^{-6}$/° C.

A furnace, which utilizes preheating, may be used in place of the furnace 60 described above. In this case, a porous sintered member 12 of a material previously formed into a compact or graphite is preheated. The graphite (or SiC as described later on) formed to have a network by the aid of this treatment is easily infiltrated with the metal 14. As for the temperature for the preheating process, it is desirable that the preheating is performed up to a temperature approximately equivalent to the temperature of the molten metal 86. Specifically, when the molten metal 86 is at about 1200° C., it is desirable that the preheating temperature for the graphite is 1000 to 1400° C.

Next, a heat sink material 10B according to the second embodiment will be explained with reference to FIG. 9.

Figure 9:
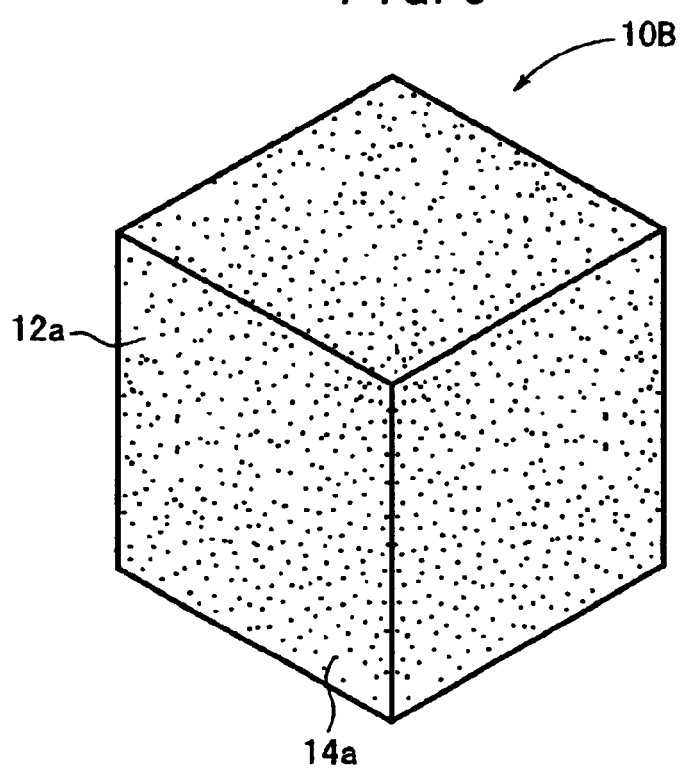
FIG. 9 shows a perspective view illustrating construction of a heat sink material according to a second embodiment.

As shown in FIG. 9, the heat sink material 10B according to the second embodiment is constructed by mixing powder 12a of carbon or allotrope thereof and powder 14a of metal 14, and forming an obtained mixture at a predetermined temperature under a predetermined pressure.

Those preferably used as the carbon or the allotrope thereof are those having a coefficient of thermal conductivity of not less than 100 W/mK, desirably not less than 150 W/mK (estimated value when no pore exists), and more desirably not less than 200 W/mK (estimated value when no pore exists). Especially, in the second embodiment, it is possible to use diamond other than graphite. This embodiment is illustrative of the heat sink material 10B constructed by mixing powder of copper and powder of graphite having a coefficient of thermal conductivity of not less than 100 W/mK, and forming an obtained mixture. It is possible to use aluminum and silver as the metal 14 other than copper.

The heat sink material 10B according to the second embodiment can be also constructed by mixing a pulverized cut material of carbon or allotrope thereof (for example, a pulverized cut material of carbon fiber) and powder 14a of the metal 14, and forming an obtained mixture at a predetermined temperature under a predetermined pressure.

Considering the forming process to be performed in a press mold, it is preferable that the predetermined temperature is relatively −10 to −50° C. with respect to a melting point of the metal 14. It is preferable that the predetermined pressure is 10.13 to 101.32 MPa (100 to 1000 atmospheres).

The average powder particle size of the powder 12a of the carbon or the allotrope thereof and the powder 14a of the metal 14 is preferably 1 μm to 500 μm. As for the volume ratios between the carbon or the allotrope thereof and the metal 14, the volume ratio of the carbon or the allotrope thereof is within a range from 20 to 60% by volume, and the volume ratio of the metal 14 is within a range from 80 to 40% by volume. Accordingly, it is possible to obtain the heat sink material 10B in which the average coefficient of thermal conductivity of those in the directions of the orthogonal three axes, or the coefficient of thermal conductivity in the direction of any one axis is 200 to 350 W/mK or more, and the coefficient of thermal expansion is $3 \times 10^{-6}$ to $14 \times 10^{-6}/°$ C.

In the heat sink material 10B according to the second embodiment, it is preferable that an additive, which makes it possible to perform resintering after the forming process, is added to the carbon or the allotrope thereof. The additive may be exemplified by SiC and/or Si. Accordingly, the resintering can be performed at a temperature of not less than the melting point of the metal 14 after the forming process. In this case, grains generated after the forming process bind to one another as a result the resintering. Therefore, it is possible to almost exclude the grain boundary which inhibits the heat conduction. Thus, it is possible to improve the coefficient of thermal conductivity of the heat sink material 10B.

An element reacting with the carbon or the allotrope thereof may be added into the carbon or the allotrope thereof. The additive element includes one or more of those selected from Ti, W, Mo, Nb, Cr, Zr, Be, Ta, V, B, and Mn. Accordingly, a reaction layer (carbide layer) is formed on the surface of the carbon or the allotrope thereof during the forming process and the resintering process. Thus, it is possible to improve the binding of grains at the surface of the heat sink material 10B.

It is preferable that a low melting point metal, for example, one or more of those selected from Te, Bi, Pb, Sn, Se, Li, Sb, Tl, Ca, Cd, and Ni are added to the metal 14. Accordingly, the wettability at the interface between the carbon or the allotrope thereof and the metal 14 is improved. It is possible to suppress the generation of the grain boundary which inhibits the heat conduction. In view of the heat conduction, it is preferable that the low melting point metal does not form solid solution with the metal 14.

It is also preferable that the metal 14 is added with one or more of those selected from Nb, Cr, Zr, Be, Ti, Ta, V, B, and Mn. Accordingly, it is possible to improve the reactivity of the carbon or the allotrope thereof with the metal 14. Also in this case, it is possible to suppress the occurrence of the grain boundary during the forming process.

It is preferable that an element, which has a temperature range of solid-liquid phase of not less than 30° C., desirably not less than 50° C., including, for example, one or more of those selected from Sn, P, Si, and Mg, is added to the metal 14 in order to improve molten metal flow performance and reduce the residual pores. Accordingly, it is possible to reduce the dispersion during the infiltration, the residual pores are decreased, and it is possible to improve the strength. The equivalent effect can be obtained also by increasing the infiltration pressure.

It is preferable that an element to reduce the melting point is added to the metal 14. The metal to be added is Zn, for example.

Next, explanation will be made with reference to FIGS. 10 to 14 for several methods (third and fourth production methods) to produce the heat sink material 10B according to the second embodiment.

Figure 10:
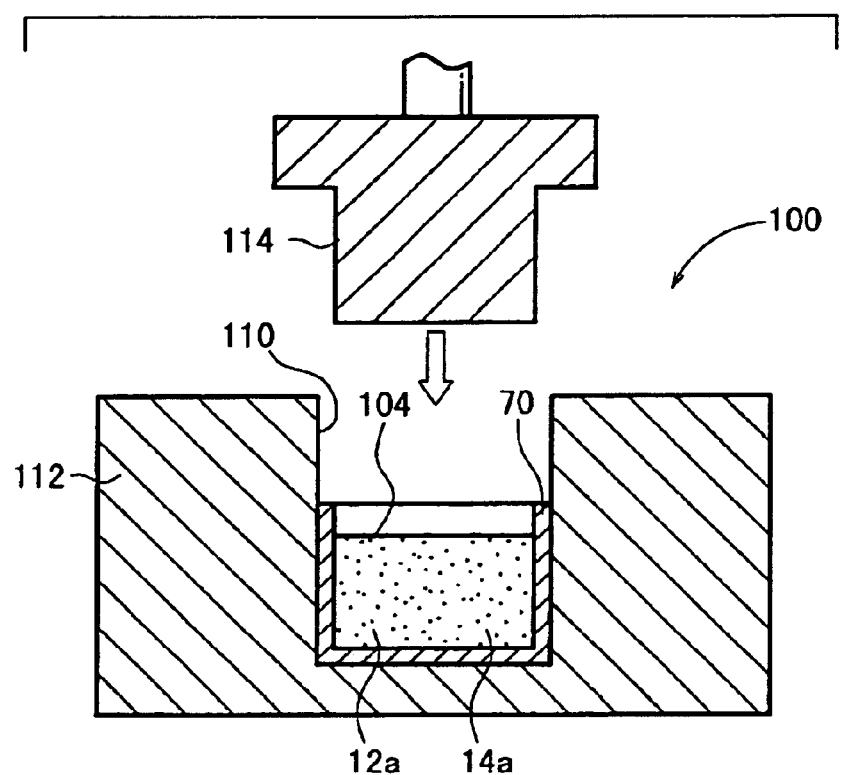
FIG. 10 shows an arrangement of a preforming machine to be used in a third production method.
Figure 11:
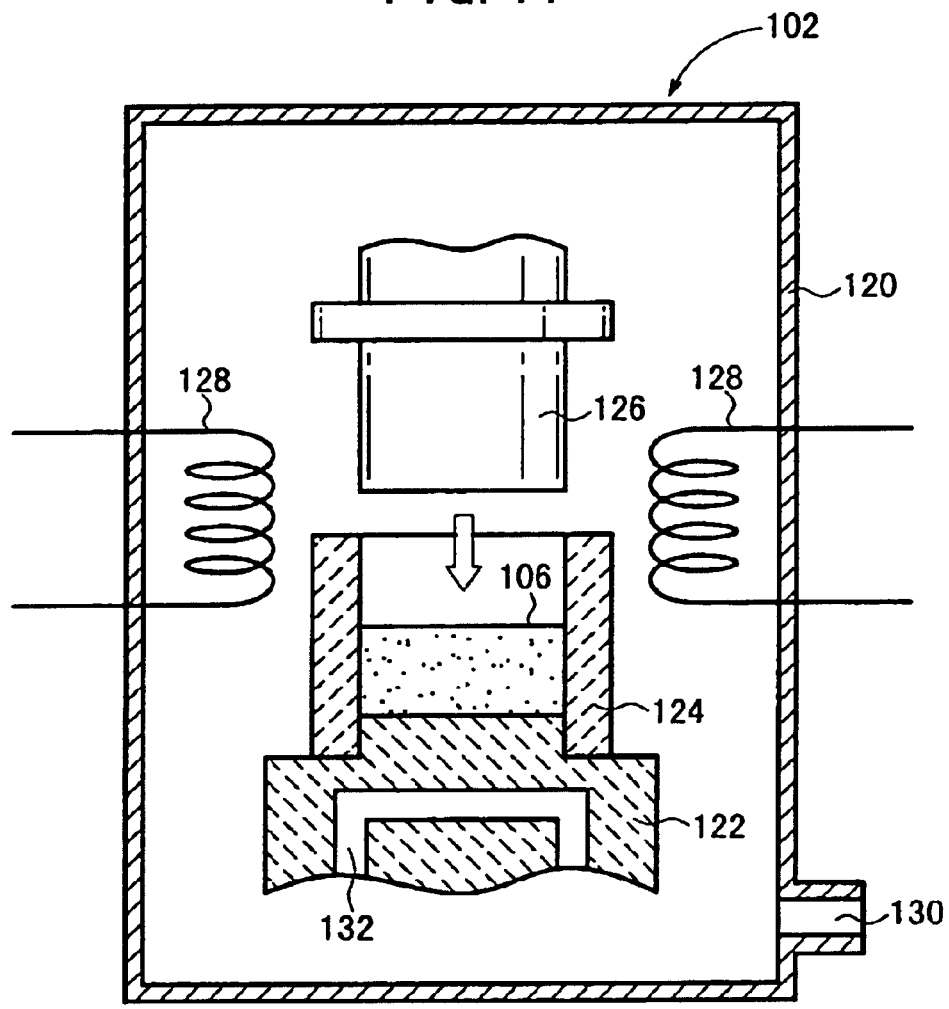
FIG. 11 shows an arrangement of a hot press machine to be used in the third production method.

At first, the third production method is carried out by using a preforming machine 100 (see FIG. 10) and a hot press machine 102 (see FIG. 11). Those machines are shown by way of example only.

As shown in FIG. 10, the preforming machine 100 includes a mold 112 which has a recess 110 with an upper opening, and a punch 114 insertable into the recess 110 and forcibly pressing the contents in the recess 110 downwardly. A mixture 104 obtained by mixing powder 12a of carbon or allotrope thereof and powder 14a of metal 14 is set in a case 70.

As shown in FIG. 11, the hot press machine 102 includes, in a cylindrical casing 120, a lower punch 122 also serving as a base pedestal, a refractory vessel 124 made of graphite fixed on the lower punch 122 with an upper opening, an upper punch 126 movable back and forth from an upper position into the refractory vessel 124, and a heater 128 used to heat the refractory vessel 124. The refractory vessel 124 receives a preformed product 106 of the mixture 104 formed by the preforming machine 100 therein. The hot press machine 102 has a suction tube 130 for evacuation.

A passage 132 is provided at the inside of the lower punch 122 in order to flow a heating fluid for heating the interior of the refractory vessel 124 and a cooling fluid for cooling the interior of the refractory vessel 124.

Figure 12:
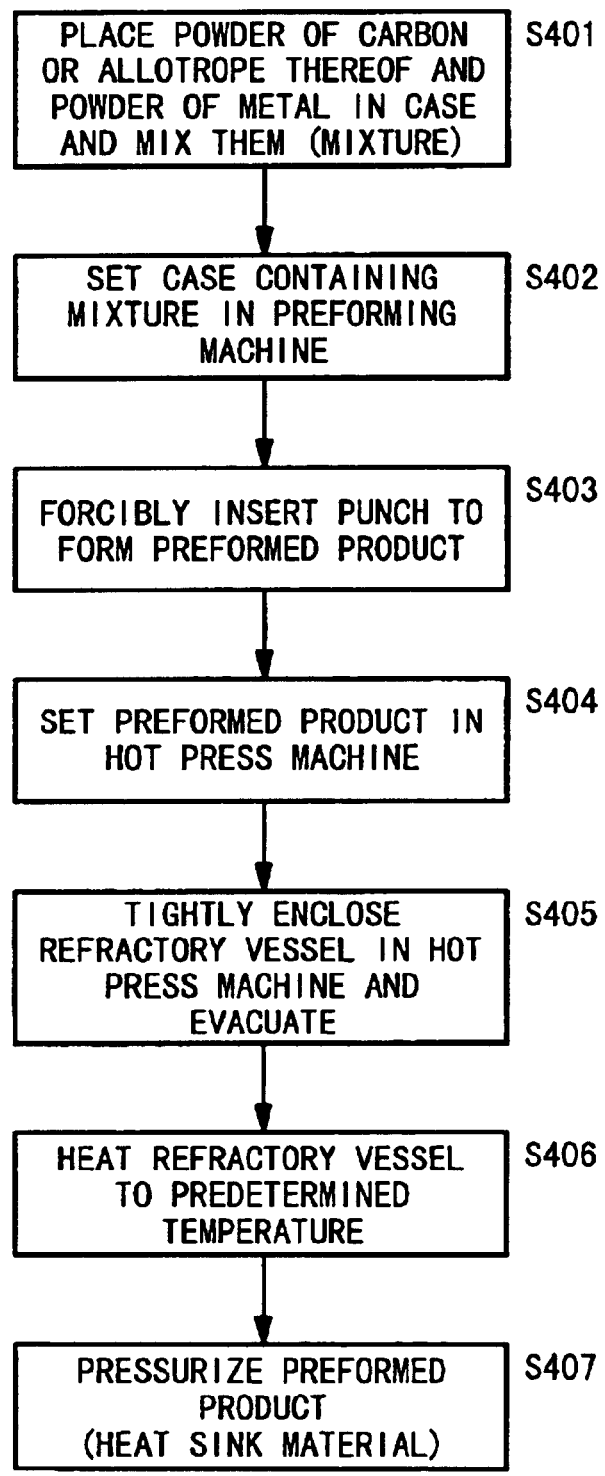
FIG. 12 shows a block diagram illustrating steps of the third production method.

The third production method is carried out by in performing steps shown in FIG. 12. At first, the powder 12a of carbon or allotrope thereof and the powder 14a of metal 14 are placed in the case 70 and are mixed with each other to obtain a mixture 104 (step S401). Subsequently, the case 70 containing the mixture 104 is set in the recess 110 of the mold 112 of the preforming machine 100 (step S402). After that, the punch 114 is forcibly inserted into the recess 110, and the mixture 104 is preformed to form the preformed product 106 (step S403).

Subsequently, the preformed product 106 is taken out of the mold 112, and the preformed product 106 is set in the refractory vessel 124 of the hot press machine 102 (step S404). After tightly enclosing the refractory vessel 124, the interior of the refractory vessel 124 is subjected to evacuation by the aid of the suction tube 130 to give a negative pressure state in the refractory vessel 124 (step S405). After that, the heater 128 is powered to make the temperature in the refractory vessel 124 be relatively −10 to −50° C. with respect to the melting point of the metal 14 (step S406).

When the temperature becomes a predetermined temperature, the upper punch 126 is moved downwardly to pressurize the preformed product 106 so that the heat sink material 10B is obtained (step S407). Then, the obtained product is used as the actual heat sink material 10B after performing a processing step etc. However, when the element enhancing the binding force between the carbon or the allotrope thereof and the metal 14 is added, the heating may be performed over the melting point of the metal 14 after the pressurization described above.

Preferred examples of the element to be added to the carbon or the allotrope thereof and the element to be added to the metal 14 have been already described, and detailed explanation thereof is omitted.

As described above, when the respective steps of the third production method are carried out, it is possible to easily obtain the heat sink material 10B in which the average coefficient of thermal conductivity of those in the directions of the orthogonal three axes, or the coefficient of thermal conductivity in the direction of any axis is 200 to 350 W/mK or more, and the coefficient of thermal expansion is $3 \times 10^{-6}$ to $14 \times 10^{-6}/°$ C.

Next, a fourth production method will be explained with reference to FIGS. 13 and 14. As shown in FIG. 14, the fourth production method is carried out by using only the hot press machine 102 without using the preforming machine 100.

Figure 13:
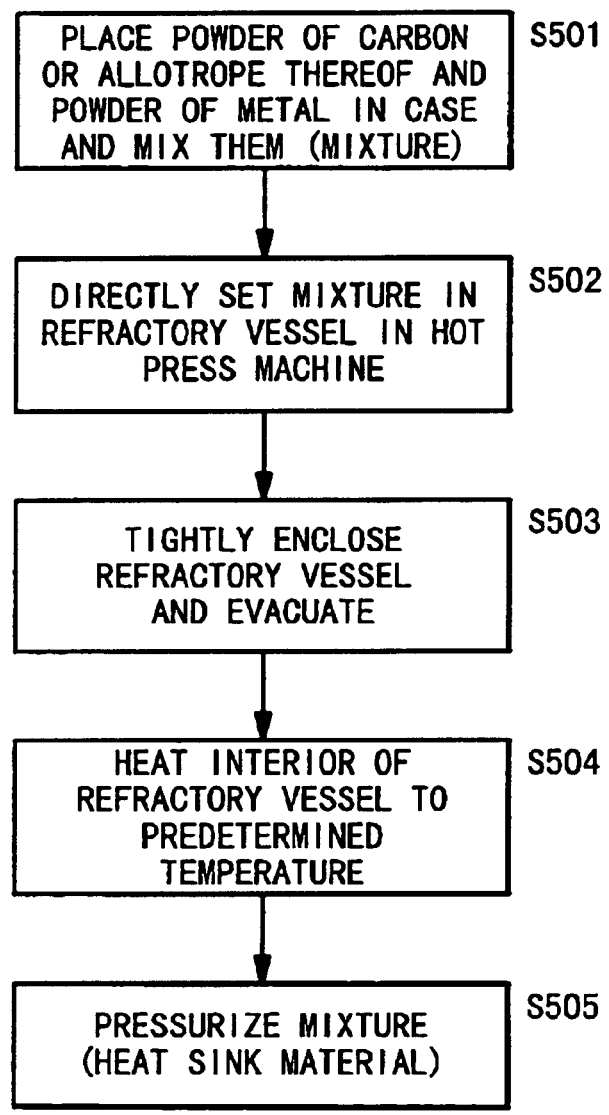
FIG. 13 shows a block diagram illustrating steps of a fourth production method.
Figure 14:
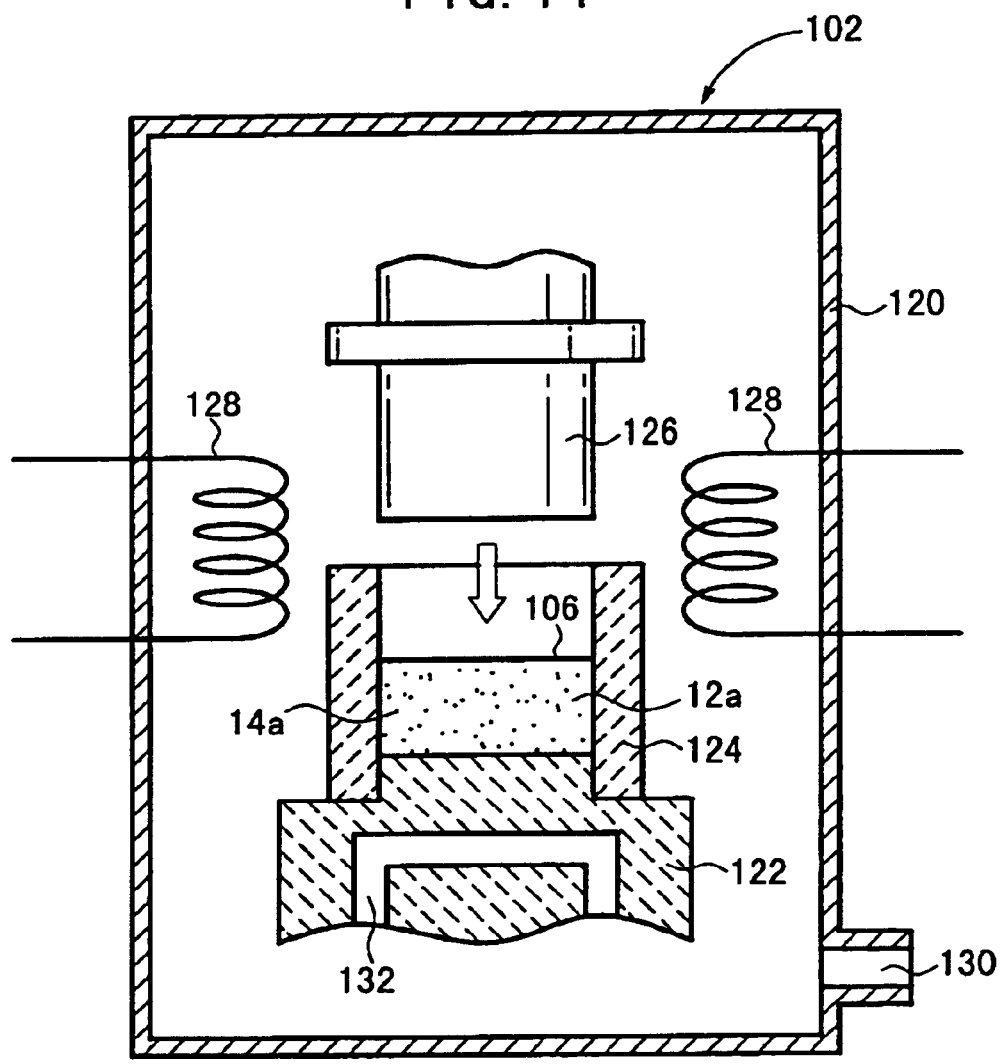
FIG. 14 shows an arrangement of a hot press machine to be used in the fourth production method.

As shown in FIG. 13, the powder 12a of the carbon or the allotrope thereof and the powder 14a of the metal 14 are firstly placed in the case 70, and are mixed with each other to obtain the mixture 104 (step S501). The mixture 104 in the case 70 is directly set in the refractory vessel 124 of the hot press machine 102 (step S502). After tightly enclosing the refractory vessel 124, the interior of the refractory vessel 124 is subjected to the evacuation by the aid of the suction tube 130 to give a negative pressure state in the refractory vessel 124 (step S503). After that, the heater 128 is powered to make the temperature in the refractory vessel 124 be relatively −10 to −50° C. with respect to the melting point of the metal 14 (step S504).

When the temperature becomes a predetermined temperature, the upper punch 126 is moved downwardly to pressurize the mixture 104 so that the heat sink material 10B is obtained (step S505).

Also in the fourth production method, it is possible to easily obtain the heat sink material 10B in which the average coefficient of thermal conductivity of those in the directions of the orthogonal three axes, or the coefficient of thermal conductivity in the direction of any axis is 200 to 350 W/mK or more, and the coefficient of thermal expansion is $3 \times 10^{-6}$ to $14 \times 10^{-6}$/° C.

Next, a heat sink material 10C according to the third embodiment will be explained with reference to FIG. 15.

Figure 15:
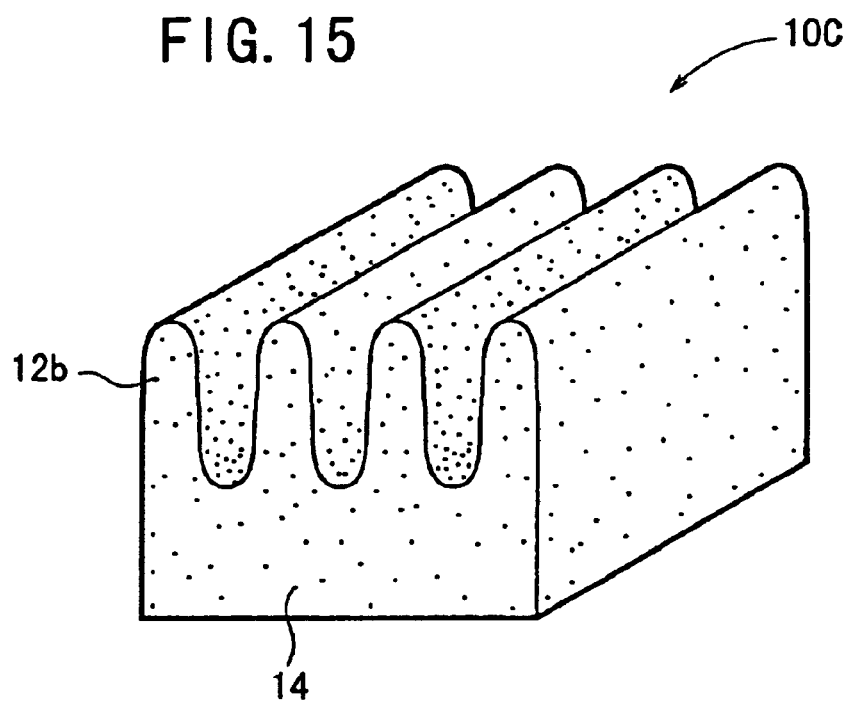
FIG. 15 shows a perspective view illustrating construction of a heat sink material according to a third embodiment.

As shown in FIG. 15, the heat sink material 10C according to the third embodiment is constructed by pressurizing a mixture obtained by mixing powder 12b of carbon or allotrope thereof and a binder (binding agent) etc. to prepare a preformed product or a block (preferably having a cubic, rectangular parallelepiped, or arbitrary configuration), and infiltrating the block with the metal. The same powder 12b as the powder 12a of carbon or allotrope thereof used in the second embodiment may be used. The heat sink material 10C can be manufactured to have an arbitrary shape which is approximate to the final shape.

Those usable as the carbon or the allotrope thereof other than graphite include diamond. Those usable as the metal 14 other than copper include aluminum and silver.

The average powder particle size of the powder 12b of the carbon or the allotrope thereof is 1 to 2000 μm. It is preferable that the length ratio is not more than 1:5 between a direction in which the powder 12b has a minimum length and a direction in which the powder 12b has a maximum length. In this case, although there is no strong network, it is possible to make an arbitrary shape which is approximate to the final shape. Therefore, it is also possible to omit the machining process to be performed in downstream steps. As for the volume ratios between the powder 12b of the carbon or the allotrope thereof and the metal 14, it is desirable that the volume ratio of the carbon or the allotrope thereof is within a range from 20 to 80% by volume, and the volume ratio of the metal 14 is within a range from 80 to 20% by volume.

It is desirable that an additive element to make reaction with the carbon or the allotrope thereof is added into the powder 12b of the carbon or the allotrope thereof. The additive element may be selected in the same manner as in the second embodiment.

It is desirable that respective additive elements are used for the metal 14 in the same manner as in the first embodiment. The additive elements may include, for example, the additive element to improve the wettability, the additive element to improve the reactivity between the carbon or the allotrope thereof and the metal 14, the additive element to improve the molten metal flow performance, and the additive element to lower the melting point.

Figure 16:
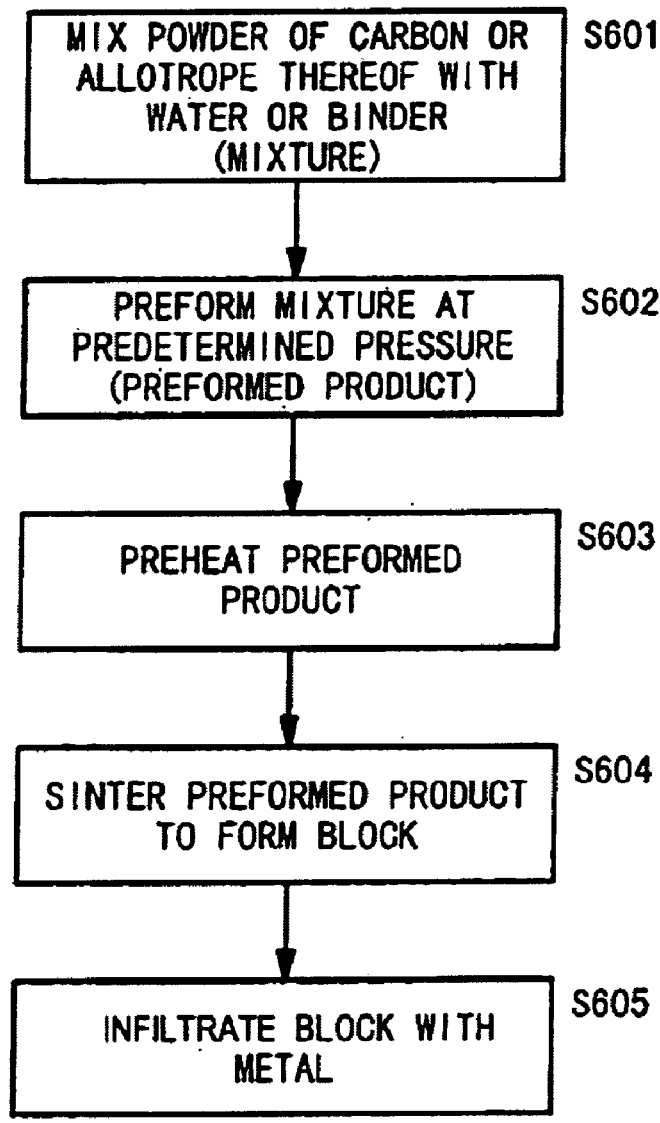
FIG. 16 shows a block diagram illustrating steps of a fifth production method.

Next, a fifth production method of the third embodiment will be explained with reference to FIG. 16. In the fifth production method, at first, water and the binder (binding agent) are mixed with the powder 12b of the carbon or the allotrope thereof to prepare a mixture (step S601).

The mixture is pressurized at a predetermined pressure to form a preformed product (step S602). The press machine 62 (see FIG. 7) or the preforming machine 100 (see FIG. 10) may be used as a pressurizing apparatus.

Subsequently, the preheating treatment is performed in order that the obtained preformed product is easily infiltrated with the metal 14 (step S603). As for the preheating temperature, for example, when the molten metal 14 is at about 1200° C., the preheating temperature for the graphite is desirably 1000° C. to 1400° C. The binder used in step S601 can be also removed by performing the preheating treatment.

Further, in step S604, the preformed product is sintered to form the block. The sintering method is carried out in the same manner as in the first embodiment.

The preformed product is infiltrated with the molten metal 14 (step S605). In the infiltrating step, the same treatments as those performed in the respective infiltrating steps described in the first embodiment may be performed. For example, the heat sink material 10C can be obtained by executing the steps ranging from S2 to S9 in the first production method (see FIG. 3) by using the high pressure vessel 30 (see FIG. 2).

According to the fifth production method, the coefficient of thermal expansion and the coefficient of thermal conductivity can be controlled to have desired values in the pressurization treatment performed in step S602, depending on the condition of the pressed powder.

The obtained heat sink material 10C is characterized in that the coefficient of thermal conductivity is more isotropic, and the wettability and the yield of material are also improved.

Further, the strength can be increased, because the metal 14 forms the network. It is also possible to reduce the residual pores.

Further, it is possible to inexpensively produce the heat sink material 10C. That is, the block before the infiltration cannot be machined, because it is fragile. However, the powder preformed product can be subjected to the infiltration after being formed to have a desired shape. Further, the powder preformed product is endurable to some plastic deformation thereafter. Therefore, it is possible to inexpensively obtain the heat sink material 10C having a complicated configuration.

Also in the fifth production method, the thermal expansion can be decreased by adding the element to form carbide to the metal 14 in the infiltration, in the same manner as in the respective production methods described above. Further, the infiltration ratio can be improved by adding the element to improve the wettability etc.

When a high infiltration pressure is applied, the infiltration ratio is increased, and the strength and the coefficient of thermal conductivity are improved as well.

Examples of infiltration based on the fifth production method are now shown in FIG. 17. Those indicated with "no pressurization" in the column of the filling method shown in FIG. 17 shows a case where the pressurizing step, i.e., step S602 described above was omitted, and a mixture obtained by spreading the powder was infiltrated with the metal 14. Those indicated with "pressurization" show a case where 10 cm³ of water glass and 100 cm³ of water were added to 1000 cm³ of powder to be compacted, and was thereafter formed by removing the water and the water glass during the preheating (1200° C.).

Figure 18:
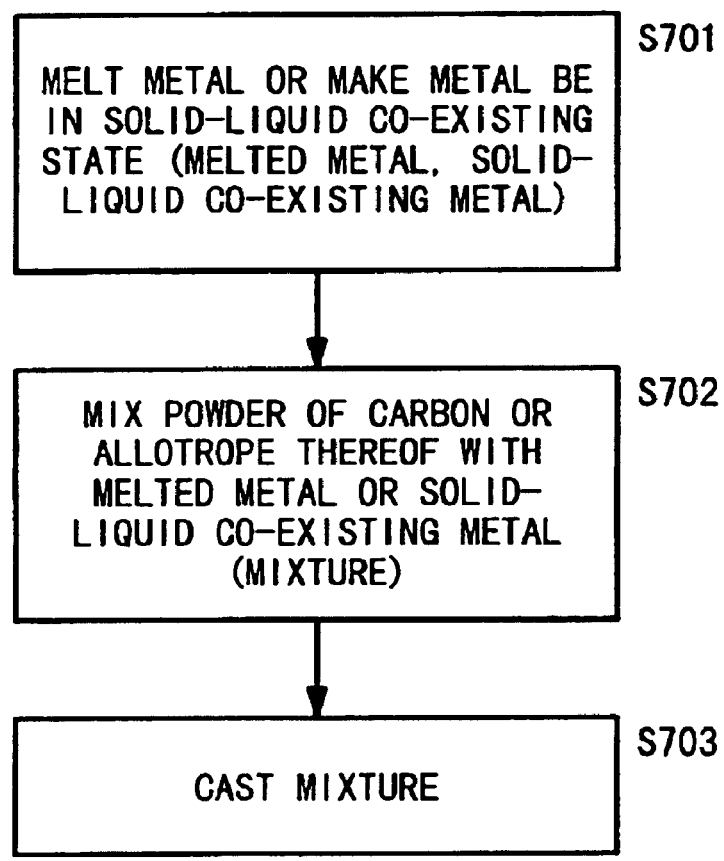
FIG. 18 shows a block diagram illustrating steps of a sixth production method.

Next, explanation will be made with reference to FIG. 18 for a sixth production method for the heat sink material 10a according to the third embodiment. In the sixth production method, at first, molten metal 14 obtained by melting metal or metal in a solid-liquid coexisting state (solid-liquid co-existing metal) is prepared (step S701). In this procedure, the term "solid-liquid co-existing metal" refers to one obtained by making metal (generally alloy) be in a semi-molten state or one obtained by cooling and agitating molten metal into a semisolidified state. That is, the term refers to both of a metal in the semi-molten state obtained by heating and a metal in the semisolidified state obtained by completely melting and being cooled afterwards.

Subsequently, the powder 12a of carbon or allotrope thereof is mixed with the molten metal 14 or the metal in the solid-liquid co-existing state (step S702).

The molten metal 14 or the solid-liquid co-existing metal mixed with the powder 12a is cast into a desired shape. Accordingly, it is possible to obtain the heat sink material 10C (step S703).

The heat sink material 10C obtained by the sixth production method has the same feature as that of the heat sink material produced by the fifth production method.

Next, an exemplary experiment (first exemplary experiment) will be described. In the first exemplary experiment, the type of the metal 14 for infiltration, the type of the additive element, and the infiltrating method were changed for three respective types of carbons (P, M, and N) to observe the difference in coefficient of thermal conductivity between two directions, the difference in coefficient of thermal expansion between two directions, the difference in bending strength between two directions, the water resistance, and the effect of the additive element respectively. Results of this exemplary experiment are shown in FIGS. 19 to 21. Respective characteristics of the three types of carbons (P, M, and N) are shown in FIG. 22.

The water resistance was inspected by placing a small amount of water and a sample in a desiccator to give a state where the sample was exposed to an atmosphere of water without being immersed in water.

At first, investigation is made for a case where a mold press was used as the infiltrating method. The coefficient of thermal conductivity is generally higher in the samples infiltrated with copper alloy containing the additive element than the samples infiltrated with pure copper. This result contributes to the following reason. Basically, the coefficient of thermal conductivity is higher when pure copper is used. However, pure copper is inferior in wettability with respect to carbon, resulting in difficulty of infiltration. Further, the coefficient of thermal conductivity is lowered at the interface between the carbon and the metal after the infiltration.

When the sample is infiltrated with pure aluminum, a product having a high coefficient of thermal conductivity is obtained as compared with the infiltration with pure copper, by the effect of generation of carbide and the high wettability with respect to the carbon. However, the coefficient of thermal conductivity is higher in the samples infiltrated with copper alloy containing additive element.

However, when the gas pressurization is used as the infiltrating method, the coefficient of thermal conductivity is higher than a case using the mold press. The coefficient of thermal conductivity of the sample infiltrated with pure copper by the gas pressurization is approximately the same as that of the sample infiltrated with copper alloy containing additive element. Representative examples are shown in FIG. 23, which are extracted from the experimental results shown in FIGS. 19 to 21 using the mold press and the gas pressurization.

The result described above is obtained, because the preheating temperature and the temperature of the molten metal are easily controlled when the gas pressurization is adapted. Of course, the infiltration characteristic at the same level (high coefficient of thermal conductivity) can be also obtained with the mold press by making artifice on the equipment.

No specific difference was found in the coefficient of thermal expansion for all of the carbons among those infiltrated with pure copper, those infiltrated with copper alloy, and those infiltrated with pure aluminum. No specific difference was also found in the coefficient of thermal expansion depending on the variety of the infiltrating method.

It is appreciated that those infiltrated with copper in alloy containing additive element to improve the wettability have satisfactory water resistance, and that those infiltrated with copper alloy containing additive element to facilitate generation of carbide are improved in bending strength as compared with those constructed with only carbon.

In each of the samples, the ratio of coefficient of thermal conductivity between a surface direction (a certain direction parallel to the surface of the sample) and a thickness direction (a direction perpendicular to the surface of the sample) is not more than 1:5, having a characteristic approximately equal to the isotropic property. Therefore, when such a sample is used as a heat sink, it is unnecessary to consider the installation direction case by case, which is advantageous in actual mounting.

Further, two exemplary experiments (second and third exemplary experiments) will be described. In these exemplary experiments, the infiltration pressure in the vessel was changed upon the infiltration in the infiltrating step for infiltrating carbon with metal in the first embodiment in order to observe the residual pores, the density, the uniformity, the compressive strength, and the difference in coefficients of thermal conductivity between the two orthogonal surface directions respectively.

The second exemplary experiment was carried out with infiltration pressures of 26.7 MPa (272 kgf/cm²) and 156.0 MPa (1592 kgf/cm²). Results of the exemplary experiment are shown in FIG. 24.

Figure 24:
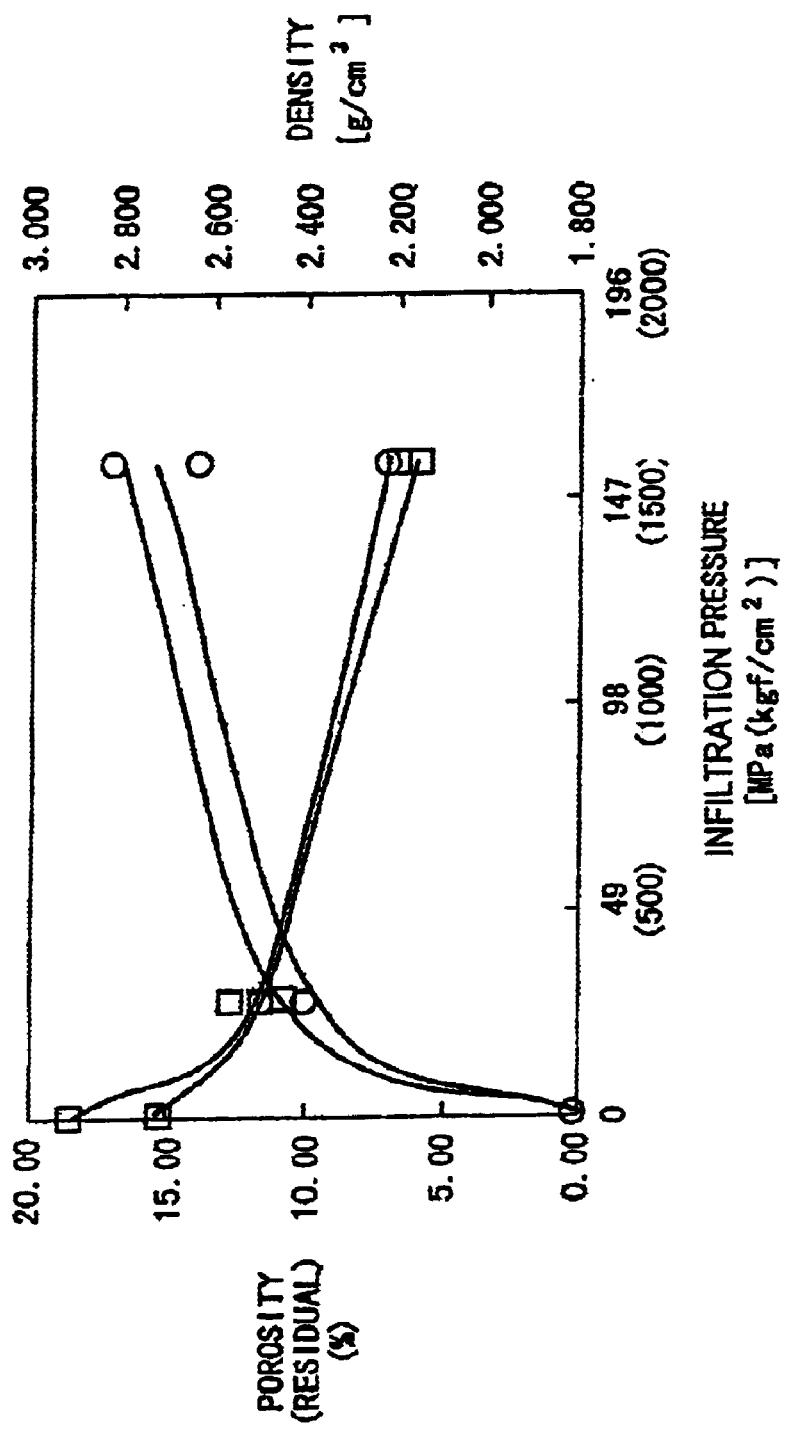
FIG. 24 shows characteristic curves illustrating the change of the porosity and the density with respect to the infiltration pressure.

In FIG. 24, the porosity (indicated by squares) and the density (indicated by circles) are plotted for the vertical axis, and the infiltration pressure is plotted for the horizontal axis. The plot of the porosity is depicted by squares, and the plot of the density is depicted by circles. According to the experimental results, it is understood that the density is increased and the porosity is decreased when the high infiltration pressure is applied.

The compressive strength of carbon (standard: JIS R 1608, method for testing compressive strength of fine ceramics) is 24.5 to 34.3 MPa (250 to 350 kgf/cm²) in the surface direction and 34.3 to 44.1 MPa (350 to 450 kgf/cm²) in the thickness direction. Therefore, according to this experiment, it has been confirmed that no problem arises in production even when the infiltration pressure having four to five times the carbon compressive strength is applied in the infiltrating step.

The third exemplary experiment was carried out with infiltration pressures of 26.7 MPa (272 kgf/cm$^2$) and 60.0 MPa (612 kgf/cm$^2$). Results of this exemplary experiment are shown in FIGS. 25 to 29.

Figure 25:
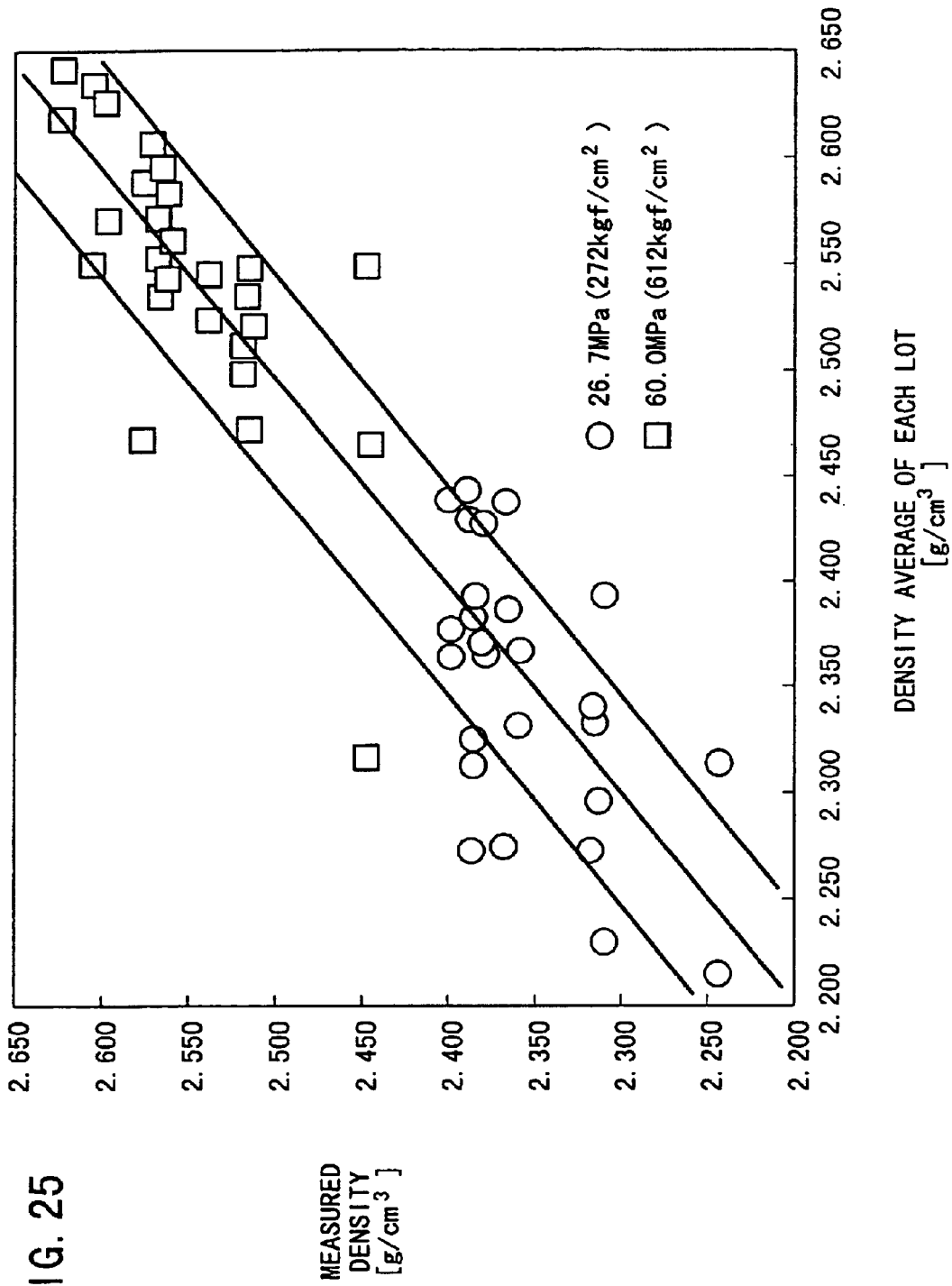
FIG. 25 shows characteristic curves illustrating the relationship between the measured density and the average density for respective lots.

In FIG. 25, the measured density is plotted for the vertical axis, and the average density of each lot is plotted for the horizontal axis.

According to FIG. 25, it is understood that the higher the infiltration pressure is, the smaller the dispersion of the density average of each lot is.

Figure 26:
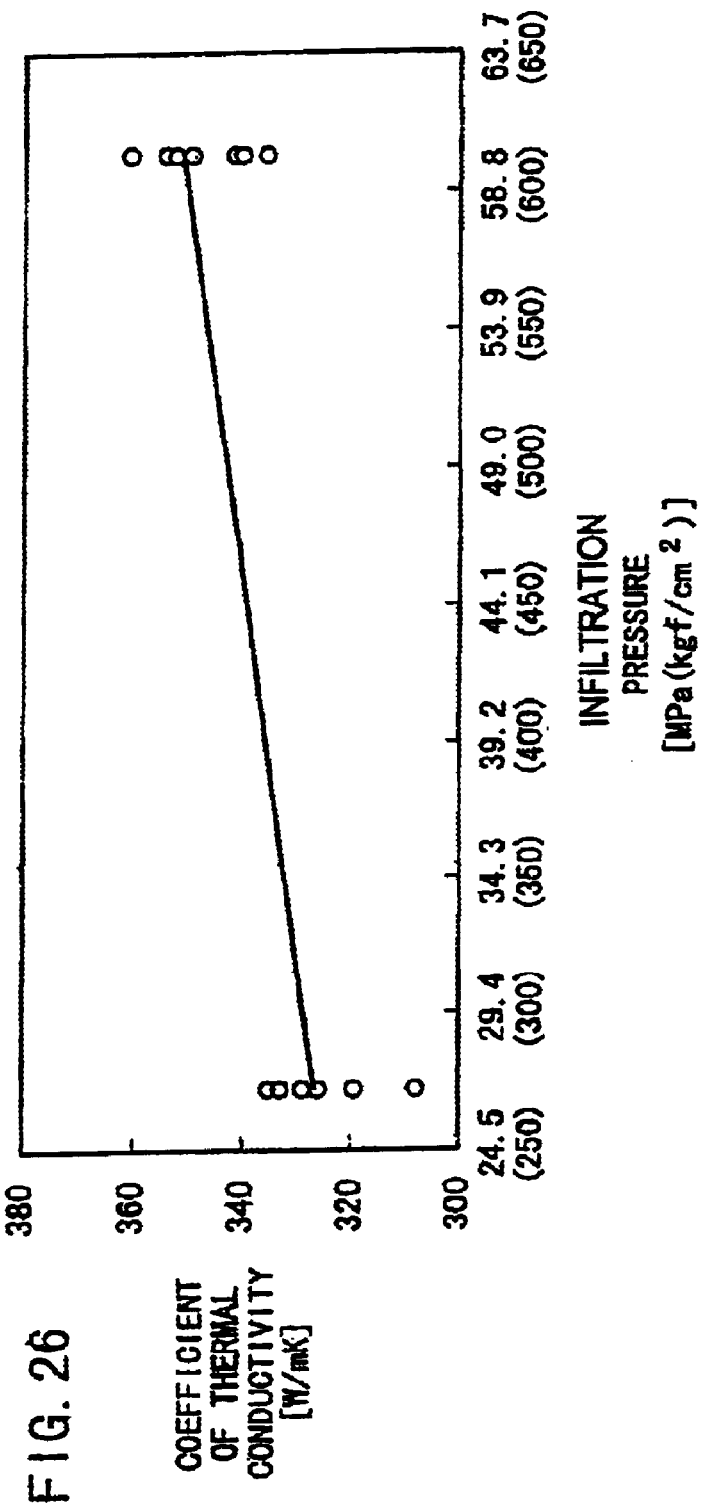
FIG. 26 shows a characteristic curve illustrating the change of the coefficient of thermal conductivity with respect to the infiltration pressure.
Figure 27:
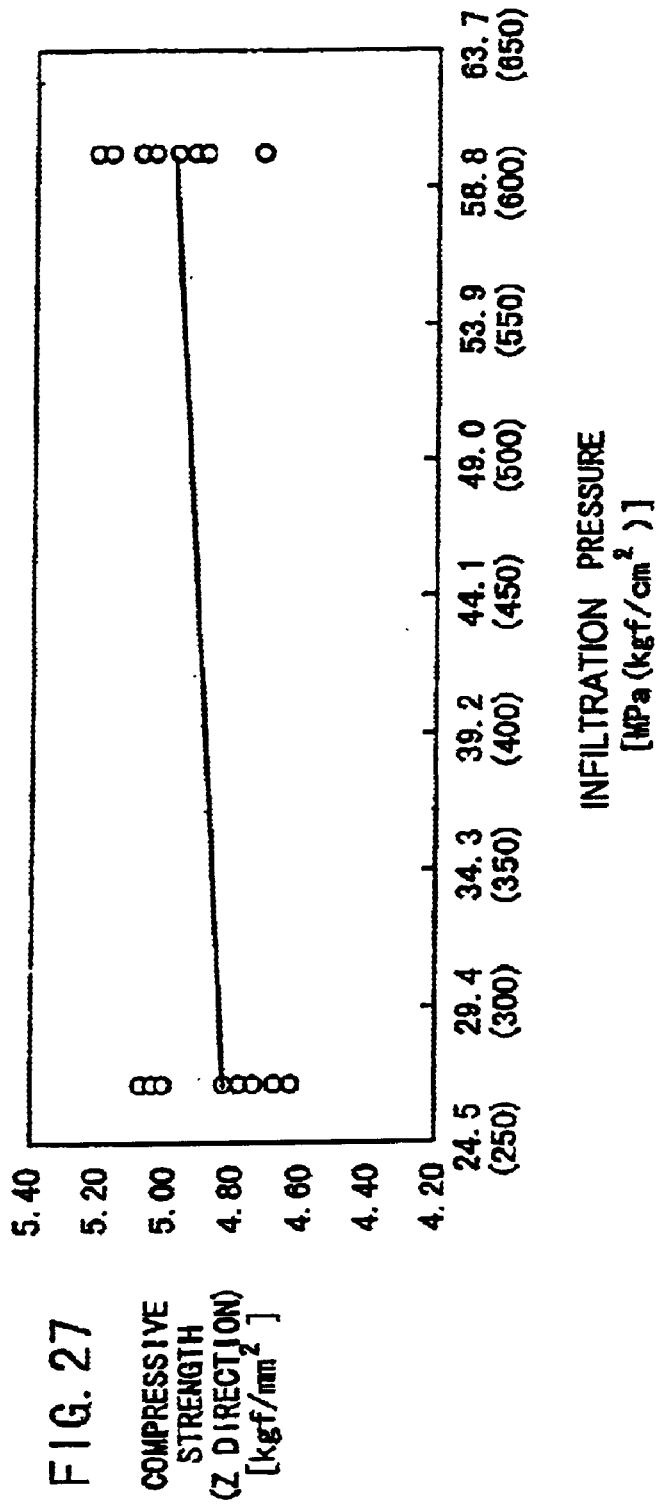
FIG. 27 shows a characteristic curve illustrating the change of the compressive strength with respect to the infiltration pressure.
Figure 28:
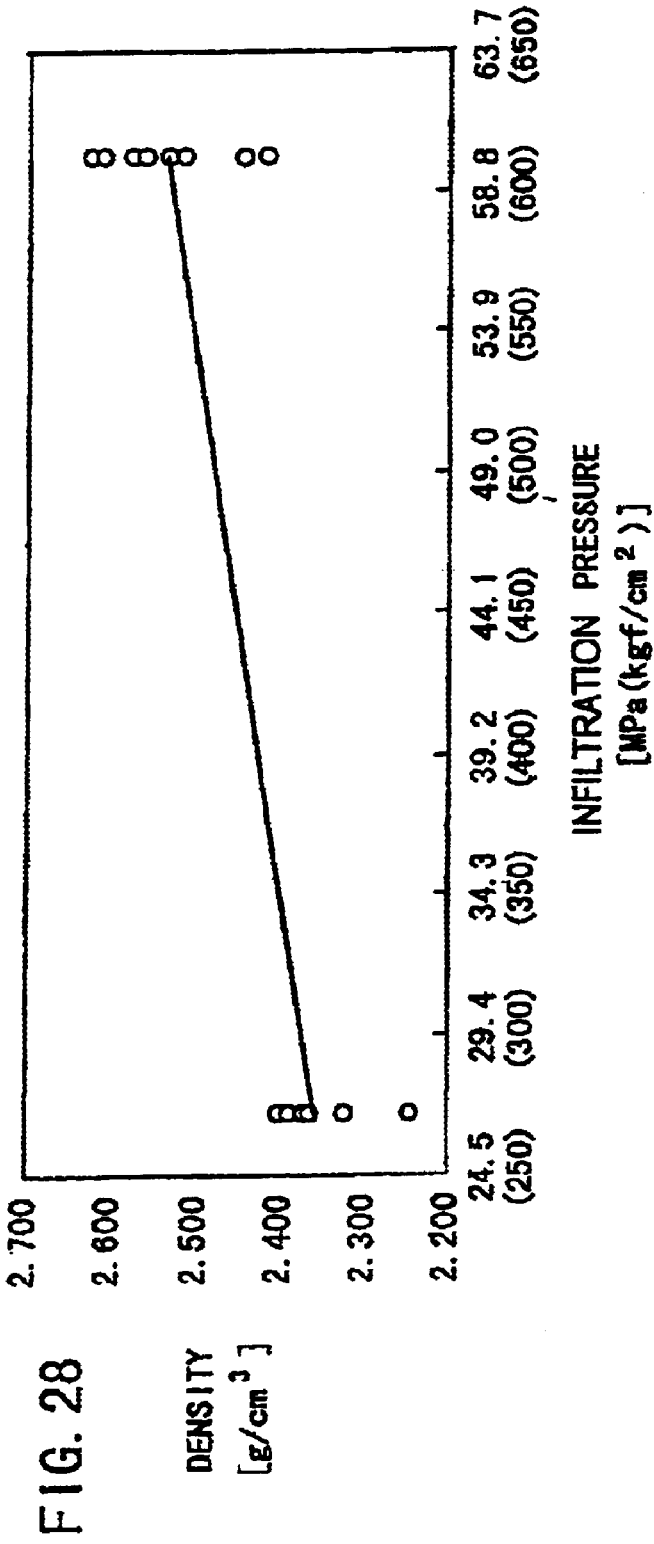
FIG. 28 shows a characteristic curve illustrating the change of the density with respect to the infiltration pressure.

In FIGS. 26 to 28, the infiltration pressure is plotted for the vertical axis, and the coefficient of thermal conductivity in the thickness direction, the compressive strength, and the density are plotted for the horizontal axis. According to FIGS. 26 to 28, it is understood that the values of the respective characteristics are improved when the high infiltration pressure is applied.

Figure 29:
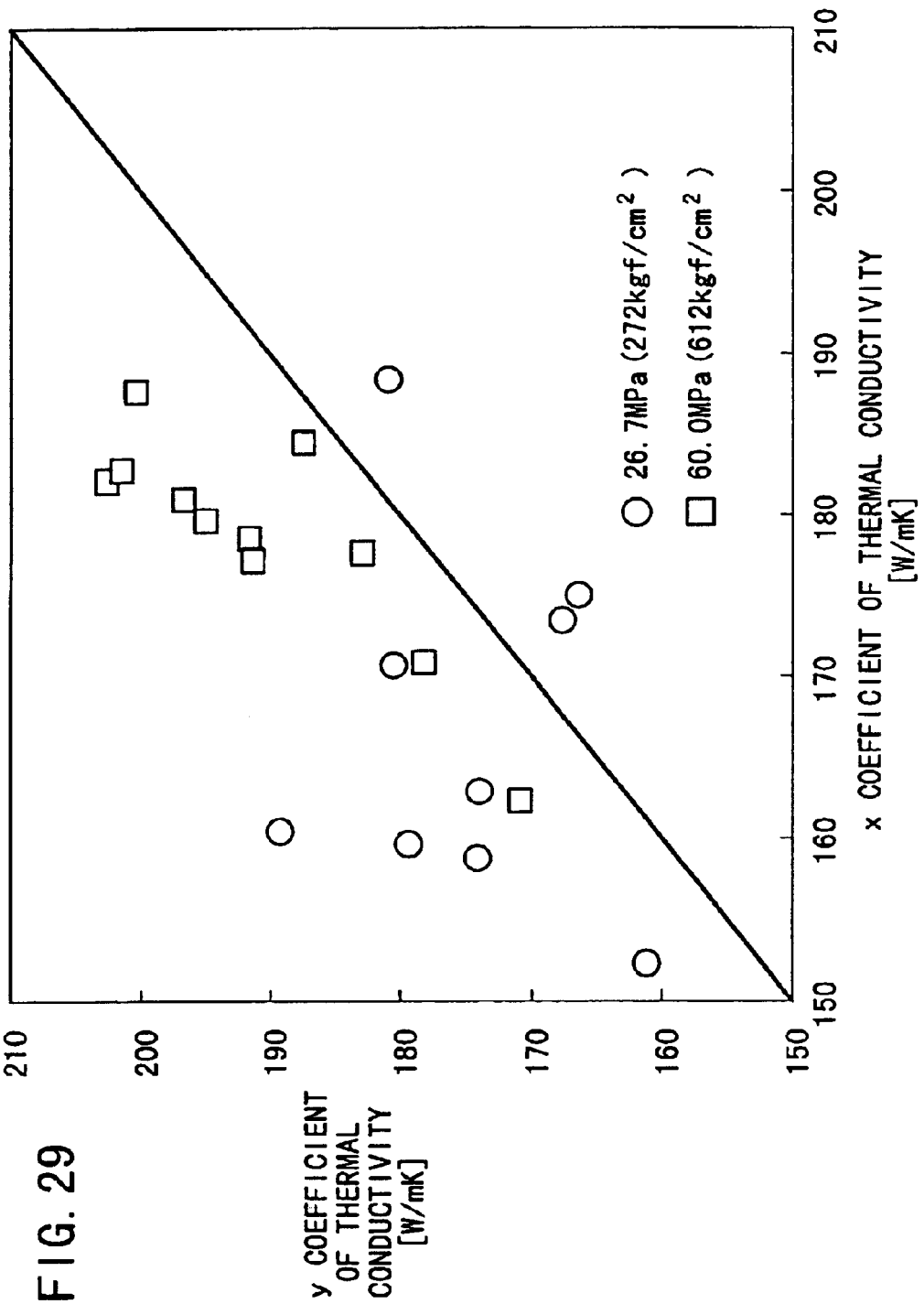
FIG. 29 shows a characteristic curve illustrating the change of the coefficient of thermal expansion with respect to the infiltration pressure.

In FIG. 29, the difference in coefficients of thermal conductivity between the two orthogonal surface directions is plotted. One of the coefficient of thermal conductivity is plotted for the horizontal axis as the X direction, and the other coefficient of thermal conductivity is plotted for the vertical axis as the Y direction. According to FIG. 29, it is understood that the dispersion in the surface direction is small when the high infiltration pressure is applied.

It is considered that the respective effects are provided in the second and third exemplary experiments described above, by the increase in infiltration amount of the metal 14 by increasing the infiltration pressure.

Further, two additional exemplary experiments (fourth and fifth exemplary experiments) will be described. In the fourth and fifth exemplary experiments, the infiltration pressure upon the infiltration with pressurization and the element to be added to the metal 14 were changed to observe the change of the residual pores respectively in the infiltrating step of infiltrating carbon with the metal 14 in the fourth embodiment.

The fourth exemplary experiment was carried out by adopting Cu0.1Nb for the infiltration metal for cases of the original material without applying the infiltration pressure and those pressurized at 27 MPa, 48 MPa, and 60 MPa. Results of this exemplary experiment are shown in FIG. 31.

Figure 31:
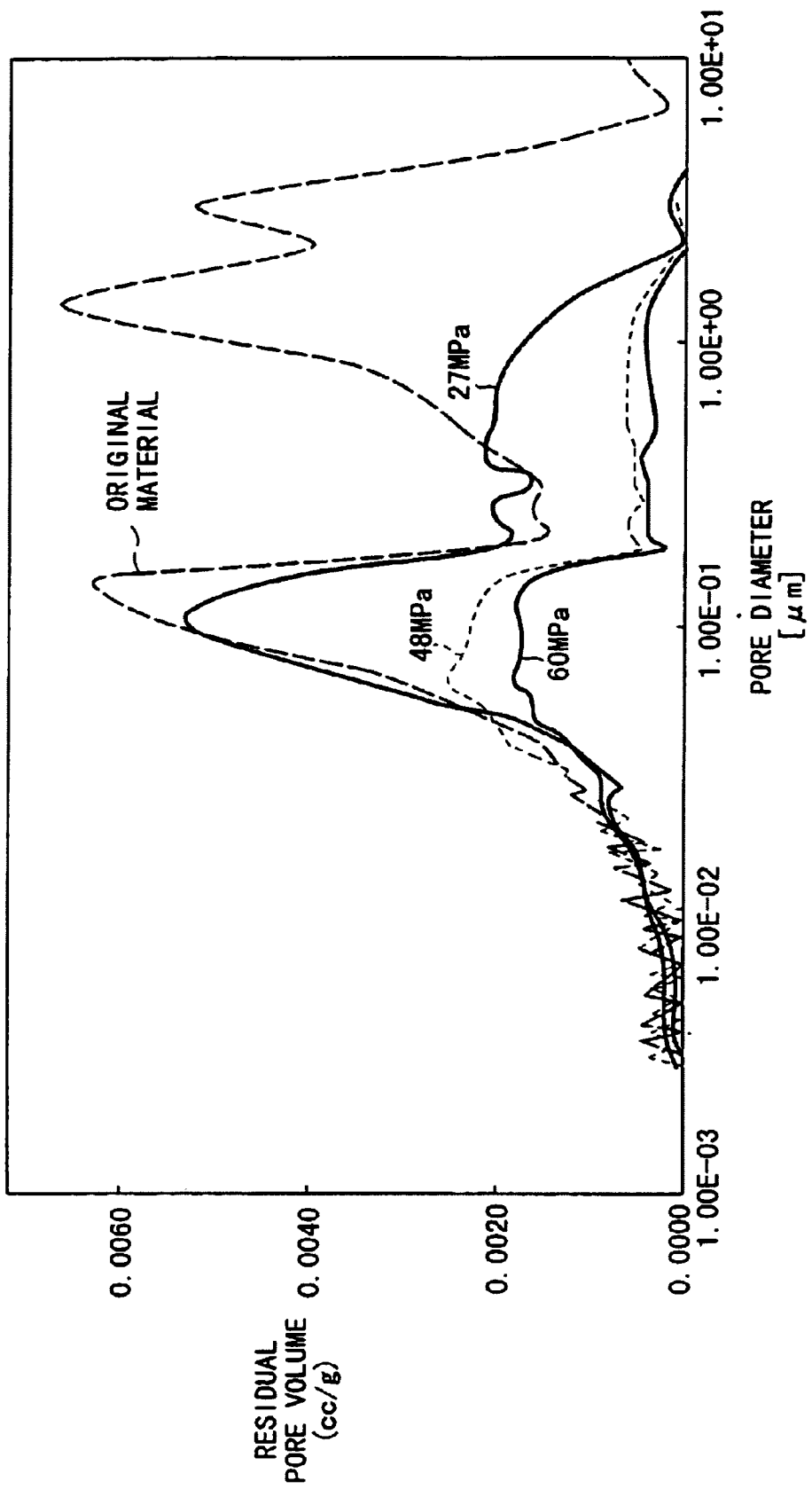
FIG. 31 shows characteristic curves illustrating the change of the residual pore with respect to the infiltration pressure.

In FIG. 31, the pore diameter is plotted for the horizontal axis, and the residual pore volume is plotted for the vertical axis to observe the difference among the cases of the respective infiltration pressures. According to FIG. 31, it is understood that the residual pore ratio after the infiltration is decreased when the infiltration pressure is increased.

The fifth exemplary experiment shows a case of no addition of element to the metal for infiltration, a case of addition of Cu5Si, and a case of addition of Cu0.1Nb. The experiment was performed with infiltration pressures of 27 MPa and 43 MPa. Results of this exemplary experiment are shown in FIG. 32.

Figure 32:
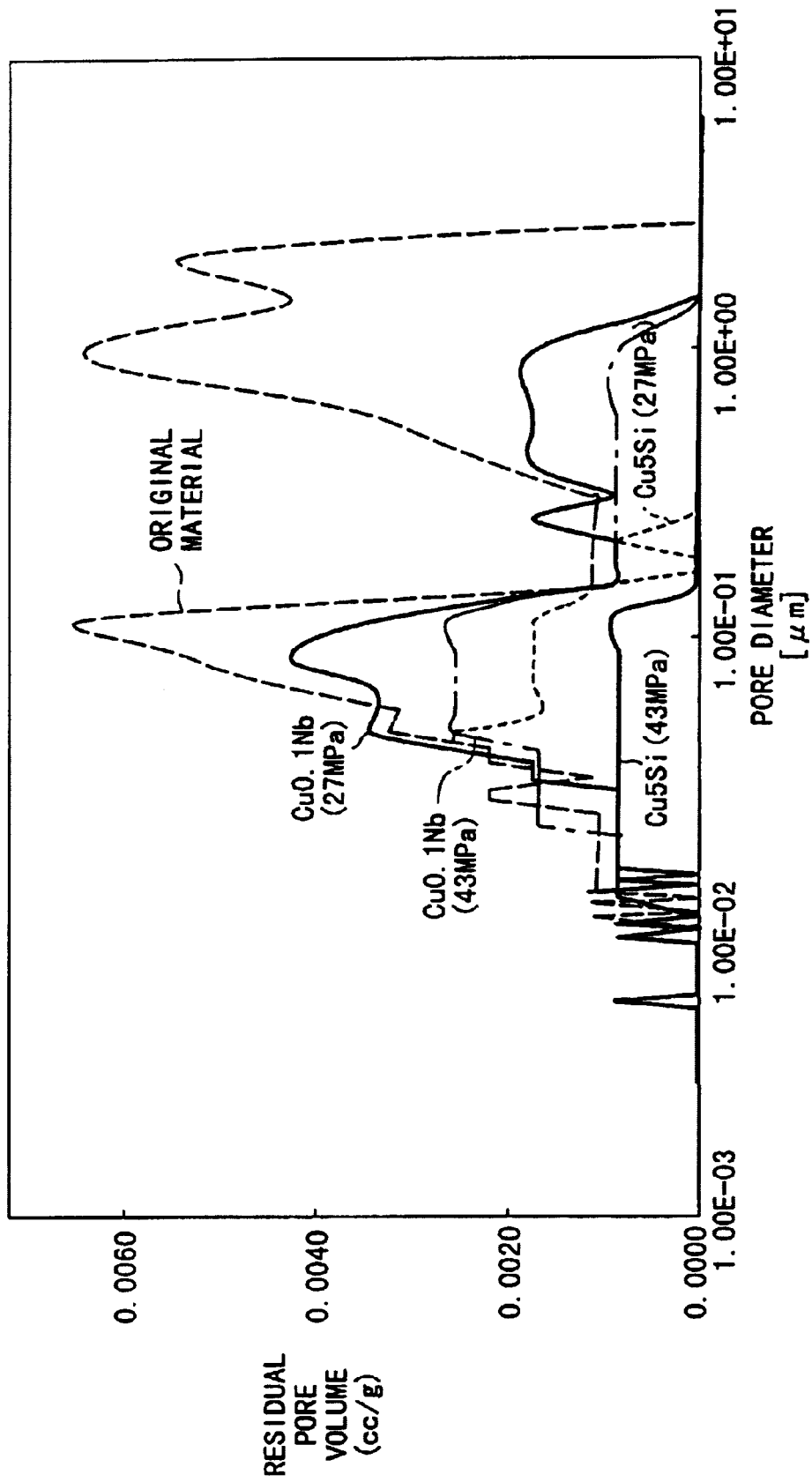
FIG. 32 shows characteristic curves illustrating the change of the residual pore with respect to the additive element.

The original material in FIG. 32 is under the same condition as that of the original material in FIG. 31. Therefore, their waveforms have approximately the same shape.

Cu5Si of the added element has a solid-liquid phase temperature range of not less than 30° C., and hence it has the good molten metal flow performance (wettability) as compared with Cu0.1Nb. As a result, it is understood that the residual pores are decreased in the sample added with Cu5Si. A tendency is observed such that the residual pores after the infiltration are decreased when the infiltration pressure is increased. This tendency is considered to be the same as the tendency observed in FIG. 31. It is possible to improve the strength by decreasing the residual pores.

Next, explanation will be made for a case in which SiC is used as a porous sintered member in place of the carbon or the allotrope thereof.

When the additive to improve the wettability is introduced into SiC, it is preferable that the component of metal contains one or more additive elements selected from Be, Al, Si, Mg, Ti, and Ni in a range up to 5%. Attention should be paid, because these elements are different from those of the case where carbon is utilized as the porous sintered member.

In order to improve the wettability between SiC and the metal 14, it is preferable that Ni plating of 1 to 10% by volume, desirably 3 to 5% by volume is previously applied to SiC. In this case, the infiltration at a low pressure can be realized. The Ni plating referred to herein should be desirably a plating treatment with which no melting occurs during preheating such as plating of Ni—P—W or plating of Ni—B—W.

In order to improve the wettability between SiC and the metal 14, it is preferable that SiC is previously infiltrated with Si by 1 to 10% by volume, desirably 3 to 5% by volume. Also in this case, the infiltration at a low pressure can be realized.

In relation to the procedure in which the Ni plating of 1 to 10% by volume is previously applied to SiC, or SiC is previously infiltrated with Si by 1 to 10% by volume, it is also preferable that palladium plating is previously applied to SiC. In this case, combined plating of Ni and/or Si can be also applied, in addition to the palladium plating described above.

The reaction may occur at a high temperature between SiC and the metal 14, SiC may be decomposed into Si and C, and the original function may not be exhibited. Therefore, it is necessary to shorten the period of time in which SiC and the metal 14 make direct contact with each other at a high temperature. The contact time between SiC and the metal 14 can be shortened by satisfying a first treatment condition (pressure applied to high pressure vessel 30=not less than 0.98 MPa (10 kgf/cm$^2$) and not more than 98 MPa (1000 kgf/cm$^2$)), a second treatment condition (heating temperature=temperature higher by 30 to 250° C. than melting point of metal 14), or a third treatment condition plating of 1 to 10% by volume is previously applied to SiC). Therefore, the decomposition reaction of SiC as described above can be avoided beforehand.

It is necessary to apply a high pressure in order to sufficiently infiltrate SiC with the metal 14, because the wettability is poor between SiC and the metal 14. The pore surface of SiC is improved in quality to give good wettability between SiC and the metal 14 by effecting the third treatment condition (Ni plating of 1 to 10% by volume is previously applied to SiC) or a fourth treatment condition (SiC is previously infiltrated with Si by 1 to 10% by volume). Therefore, even finer pores can be also infiltrated with the metal 14 at a lower pressure.

Still another exemplary experiment (sixth exemplary experiment) will now be described. In the sixth exemplary experiment, the porosity of SiC, the pore diameter, the presence or absence of Ni plating, the presence or absence of Si infiltration, the infiltration temperature, the pressurization pressure, the pressurization time, and the cooling speed were changed to observe the difference of the reaction of SiC/Cu and the infiltration of Cu under respective conditions. Obtained experimental results are shown in a table in FIG. 30. In FIG. 30, the reaction of SiC/Cu was determined by the thickness (average value) of the reaction layer formed between SiC and Cu. The determination condition is as follows. The basis of the determination condition is the fact that when the reaction layer of not less than 5 $\mu$m is generated between SiC and Cu, then the heat transfer between SiC and Cu is deteriorated, and the coefficient of thermal conductivity is lowered in a composite material for a semiconductor heat sink. The following experimental results are summarized:

(1)# if thickness (average) of reaction layer is not more than 1 $\mu$m→"no reaction";

(2)# if thickness (average) of reaction layer is more than 1 $\mu$m and not more than 5 $\mu$m→"slight reaction"; and (3)# if thickness (average) of reaction layer is more than 5 $\mu$m→"strong reaction".

According to the experimental results, the reaction of SiC/Cu is shown as "no reaction", the infiltration situation of Cu is satisfactory, and thus good results are obtained in any of those which satisfy predetermined ranges for the porosity of SiC, the pore diameter, the infiltration temperature, the pressurization pressure, the pressurization time, and the cooling speed respectively (samples 3, 7, 8, 11, and 12).

As for samples 3, 7, 11, and 12 of the samples described above, the Ni plating or the Si infiltration was performed. Therefore, the wettability with Cu is satisfactory. The good results as described above were obtained even when the pressurization time was shortened. As for sample 8, the Ni plating and the Si infiltration were not performed. However, the pressurization time could be successfully shortened by increasing the pressurization pressure. Thus, the good results as described above were obtained.

The infiltration situation of Cu is insufficient for any of samples 1, 5, and 9 in which the pressurization pressure was 0.78 MPa (8 kgf/cm$^2$) which was lower than the predetermined range described above. Among these samples, the reaction situation of SiC/Cu is shown as "strong reaction" for those in which the pressurization time is long (samples 1 and 5).

As for sample 6, the infiltration situation is insufficient, although the reaction situation of SiC/Cu is shown as "slight reaction." This seems to be because the porosity and the pore diameter do not satisfy the predetermined ranges respectively. As for sample 14, the reaction of SiC/Cu is shown as "strong reaction", although the infiltration situation is satisfactory. This seems to be because the pore diameter is larger than the predetermined range, and the pressurization time is relatively long.

Next, explanation will be made for embodiments based on the use of SiC for the porous sintered member. At first, the steps of sintering graphite to prepare the porous sintered member (step S1, step S101, step S201, step S301, and step S302) are unnecessary when SiC is utilized in the first embodiment described above (first production method, first modified method, second modified method, and second production method). The subsequent steps will be the same for producing the heat sink material.

Explanation will be made with reference to FIGS. 33 to 36 for a production method (seventh production method) according to the fourth embodiment as an embodiment based on the use of SiC for the porous sintered member.

Figure 33:
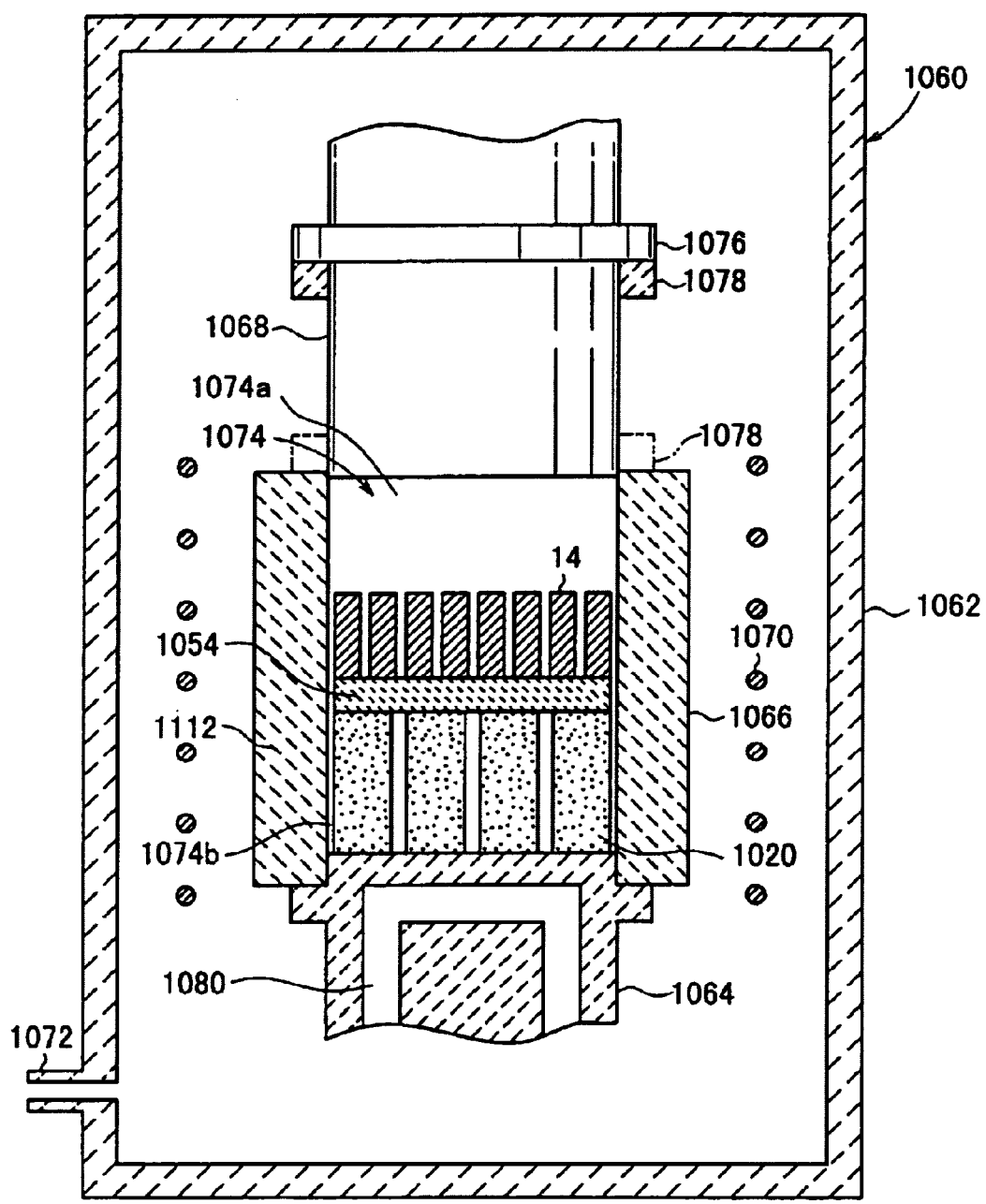
FIG. 33 shows a schematic arrangement of a hot press machine to be used in a seventh production method.

The seventh production method is carried out by using a hot press machine 1060 as specifically shown in FIG. 33 by way of example. The hot press machine 1060 has approximately the same structure as that of the hot press machine 102 explained in the second embodiment. However, for convenience, the seventh production method will be described with the separate drawing.

The hot press machine 1060 has, in a cylindrical casing 1062, a lower punch 1064 also serving as a base pedestal, a refractory vessel 1066 fixed on the lower punch 1064 with an upper opening, an upper punch 1068 movable back and forth from an upper position into the refractory vessel 1066, and a heater 1070 used to heat the refractory vessel 1066. The hot press machine 1060 is provided with a suction tube 1072 for evacuation.

The refractory vessel 1066 has a cylindrical configuration with a hollow section 1074. A flange 1076 is provided on the side surface of the upper punch 1068 for determining the throw (stroke) of the upper punch 1068. A packing 1078 is attached to the lower surface of the flange 1076. The packing 1078 makes contact with the upper circumferential surface of the refractory vessel 1066 in order to give a tightly enclosed state of the refractory vessel 1066. A passage 1080 is provided at the inside of the lower punch 1064. The passage 1080 is used to flow the heating fluid for heating the interior of the refractory vessel 1066 and the cooling fluid for cooling the interior of the refractory vessel 1066.

Figure 34:
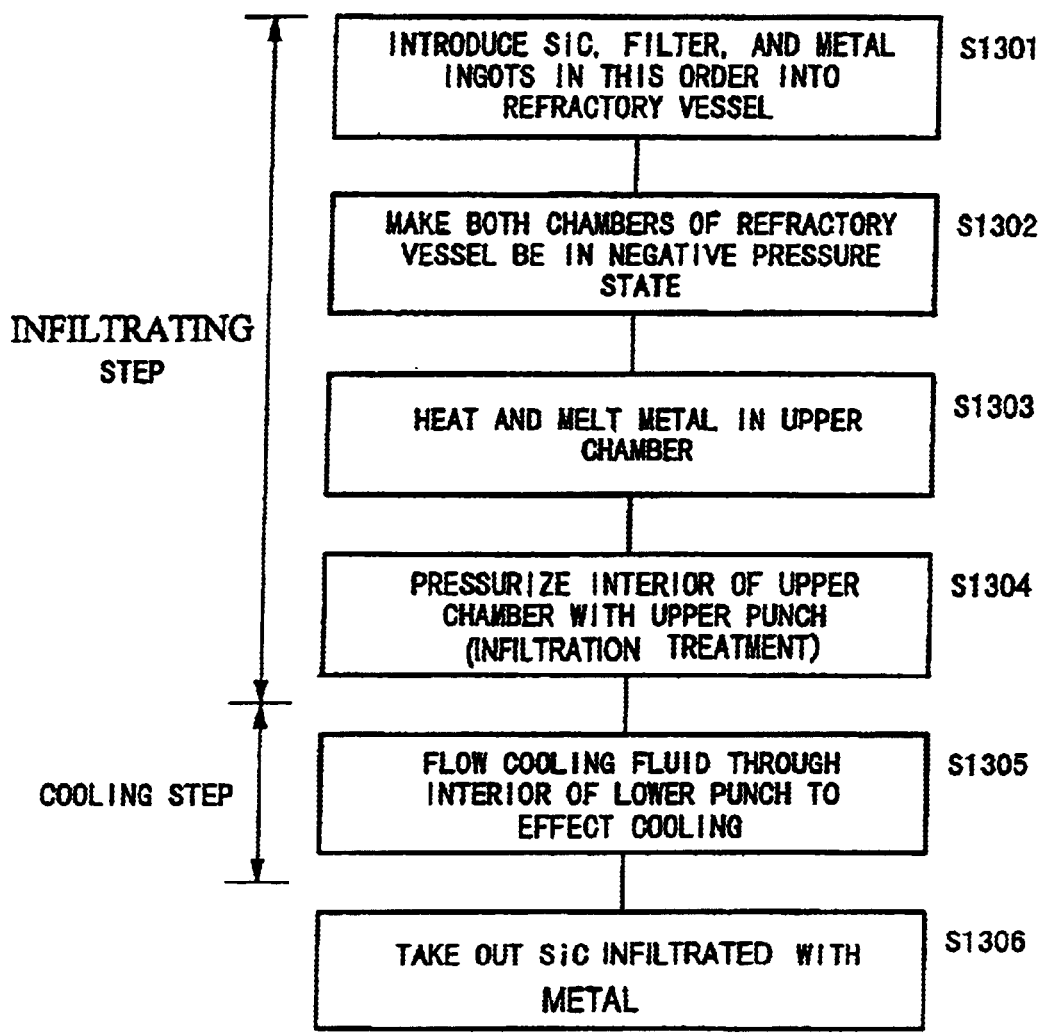
FIG. 34 shows a block diagram illustrating steps of the seventh production method.

The seventh production method is carried out by performing steps shown in FIG. 34.

At first, SiC 1020, a filter 1054 made of porous ceramics, and ingots of metal 14 are introduced in this order from the bottom of the hollow section 1074 of the refractory vessel 1066 (step S1301). For the filter 1054, it is desirable to use a porous ceramic material having a porosity of 40 to 90% and a pore diameter of 0.5 to 3.0 mm. It is more preferable to use a porous ceramic material having a porosity of 70 to 85% and a pore diameter of 1.0 to 2.0 mm.

The filter 1054 functions as a partition plate separating the SiC 1020 and the ingots of metal 14 so that they are placed in a non-contact state. An upper chamber 1074a is defined in the hollow section 1074 for setting the ingots of metal 14 on the filter 1054. A lower chamber 1074b is defined for setting the SiC 1020 under the filter 1054.

Subsequently, the refractory vessel 1066 is tightly enclosed, and then the evacuation is effected for the interior of the refractory vessel 1066 by the aid of the suction tube 1072 so that the both chambers 1074a, 1074b of the refractory vessel 1066 are in a negative pressure state (step S1302).

After that, the heater 1070 is powered to heat and melt the metal 14 in the upper chamber 1074a (step S1303). During this process, a heating fluid may be made flow through a passage 1080 of the lower punch 1064 in combination with the electric power application to the heater 1070 so that the interior of the refractory vessel 1066 may be heated.

The upper punch 1068 is moved downwardly when the melted matter of the metal 14 (molten metal) in the upper chamber 1074a arrives at a predetermined temperature to pressurize the interior of the upper chamber 1074a up to a predetermined pressure (step S1304). During this process, the refractory vessel 1066 is tightly enclosed by the mutual pressurization and the contact between the upper circumferential surface of the refractory vessel 1066 and the packing 1078 attached to the flange 1076 of the upper punch 1068. It is possible to effectively avoid such an inconvenience that the molten metal inside may leak to the outside of the refractory vessel 1066.

The melted matter of the metal 14 (molten metal) at the predetermined pressure in the upper chamber 1074a is extruded by the pressure in the upper chamber 1074a through the filter 1054 toward the lower chamber 1074*b*, and introduced into the lower chamber 1074*b*. At the same time, The SiC 1020 in the lower chamber 1074*b* is infiltrated with the molten metal.

When the time comes to the end point previously set in accordance with the time management (point of time when the infiltration of the SiC 1020 with the molten metal 14 is in a saturated state), a cooling fluid in turn flows through the passage 1080 in the lower punch 1064 so that the refractory vessel 1066 is cooled in a direction from the bottom toward the top (step S1305). Accordingly, the molten metal 14, with which the SiC 1020 is infiltrated, is solidified. The pressurized state in the refractory vessel 1066 effected by the upper punch 1068 and the lower punch 1064 is retained until the solidification is completed.

When the solidification is completed, SiC 1020 infiltrated with the metal 14 is taken out of the refractory vessel 1066 (step 1306).

In this production method, the SiC 1020 and the metal 14 are heated while being sufficiently degassed. After the metal 14 is melted, the metal 14 is immediately made contact with the SiC 1020. Further, the metal 14 and the SiC 1020 are in the pressurized state, and the pressurized state is maintained until when the cooling operation is completed.

Therefore, the SiC 1020 can be efficiently infiltrated with the metal 14. In the embodiment described above, the infiltration treatment is performed at the negative pressure. However, the infiltration treatment may be performed at the atmospheric pressure.

As described above, both of the molten metal 14 and the SiC 1020 make contact with each other after being pressurized so that the infiltration treatment is performed. Therefore, it is possible to minimize the decrease in pressure caused when both make contact with each other. Thus, it is possible to maintain the satisfactory pressurization state during the infiltration treatment.

Figure 35A:
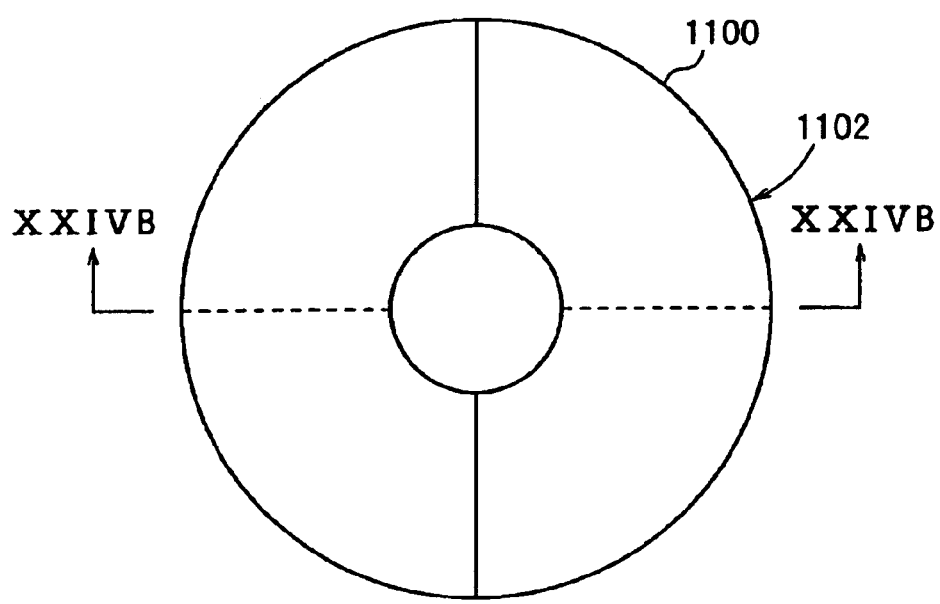
FIG. 35A shows a plan view illustrating a packing member.
Figure 35B:
FIG. 35B shows a sectional view taken along a line XXIVB—XXIVB shown in FIG. 35A.
Figure 36:
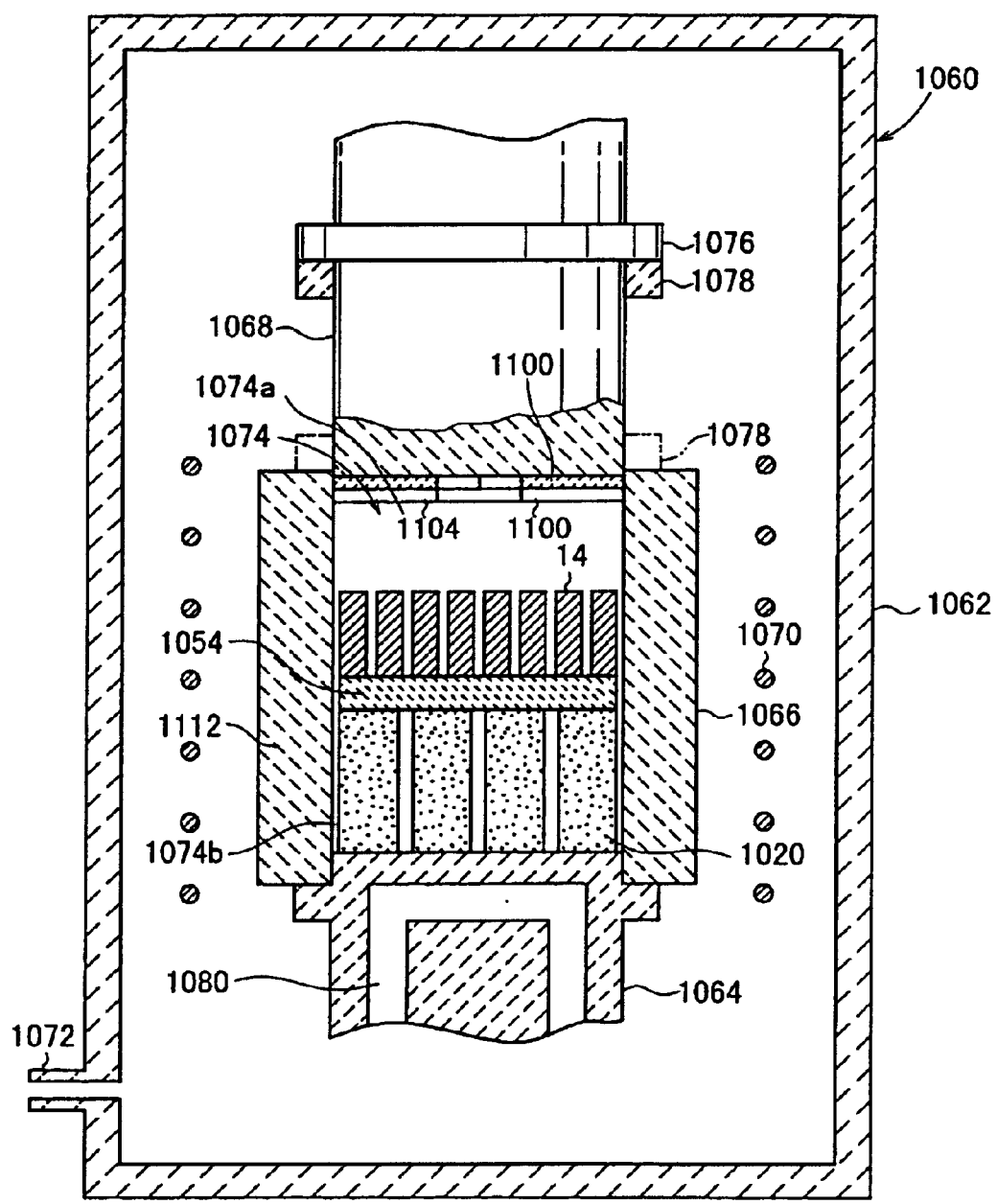
FIG. 36 shows a schematic arrangement of another exemplary hot press machine to be used in the seventh production method.

In the embodiment described above, the packing 1078 is provided at the lower surface of the flange 1076 of the upper punch 1068 in order to avoid the leakage of the molten metal 14. However, as indicated by two-dot chain lines in FIG. 33, a packing 1078 may be provided at the upper circumferential surface of the refractory vessel 1066. Alternatively, a packing member 1102 may be provided at a lower portion of the upper punch 1068 as shown in FIG. 36. The packing member 1102 has two ring-shaped divided type packings 1100 superimposed as shown in FIG. 35A. In this case, the molten metal enters a hollow section 1104 of the packing member 1102, and thus the diameter of each of the divided type packings 1100 is enlarged. As a result, the upper chamber 1074*a* is tightly enclosed, and the leakage of the molten metal 14 is avoided.

Next, a modified method of the seventh production method will be explained with reference to FIGS. 37 and 38. Constitutive components corresponding to those shown in FIG. 33 are designated by the same reference numerals, and duplicate explanation thereof will be omitted.

Figure 37:
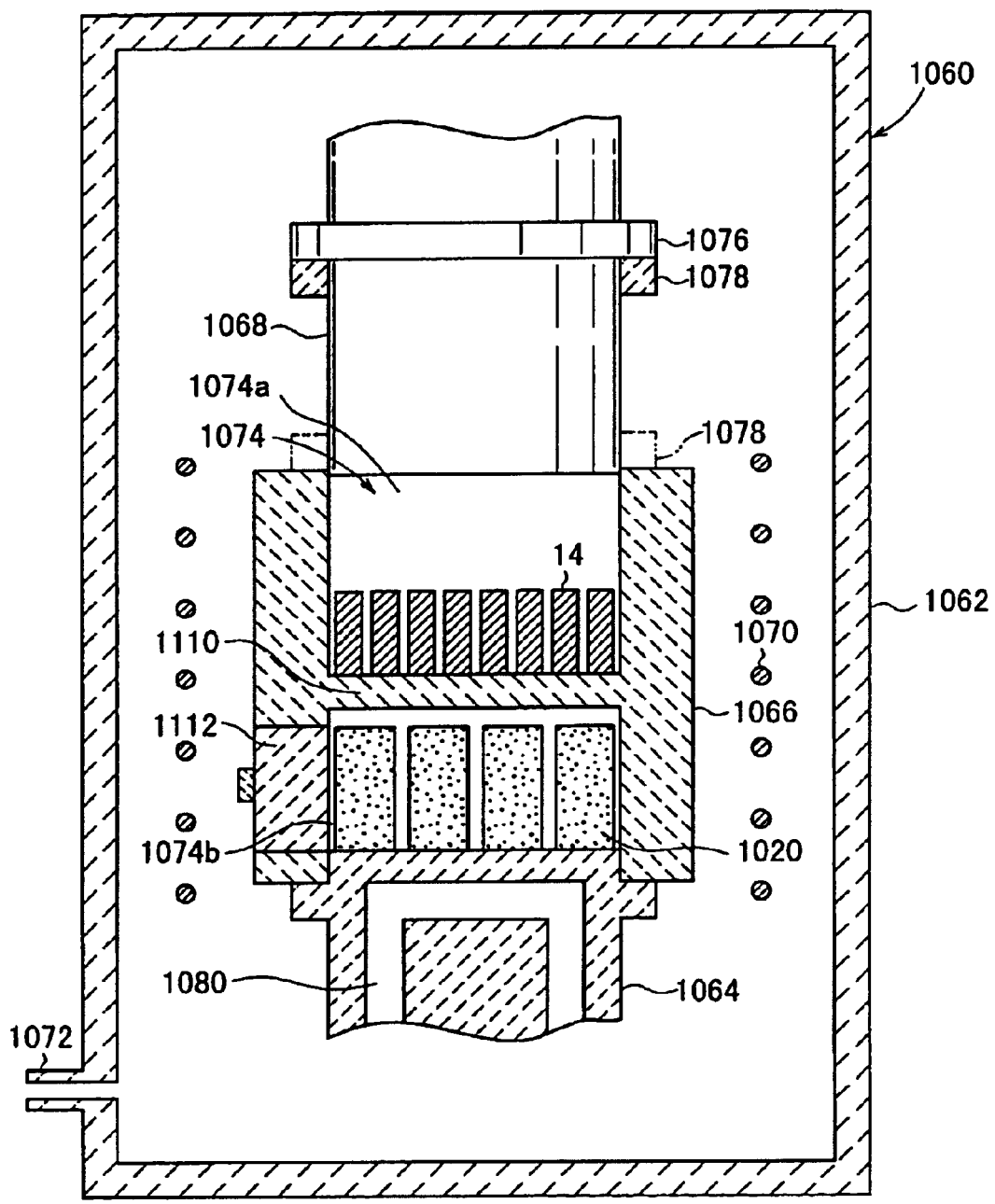
FIG. 37 shows a schematic arrangement of a hot press machine to be used in a modified method of the seventh production method.

The production method according to this modified method uses a hot press machine 1060 as shown in FIG. 37. In the hot press machine 1060, a filter member 1110 of porous ceramics is secured to a central portion in the height direction of a hollow section 1074 of a refractory vessel 1066, and a door 1112 is attached openably/closably to a side surface of a lower chamber 1074*b*. A portion of the hollow section 1074 of the refractory vessel 1066 disposed over the filter member 1110 serves as an upper chamber 1074*a*, and a portion disposed under the filter member 1110 serves as a lower chamber 1074*b*. Especially, the door 1112 attached to the lower chamber 1074*b* makes the lower chamber 1074*b* tightly enclosed when the door 1112 is closed.

Figure 38:
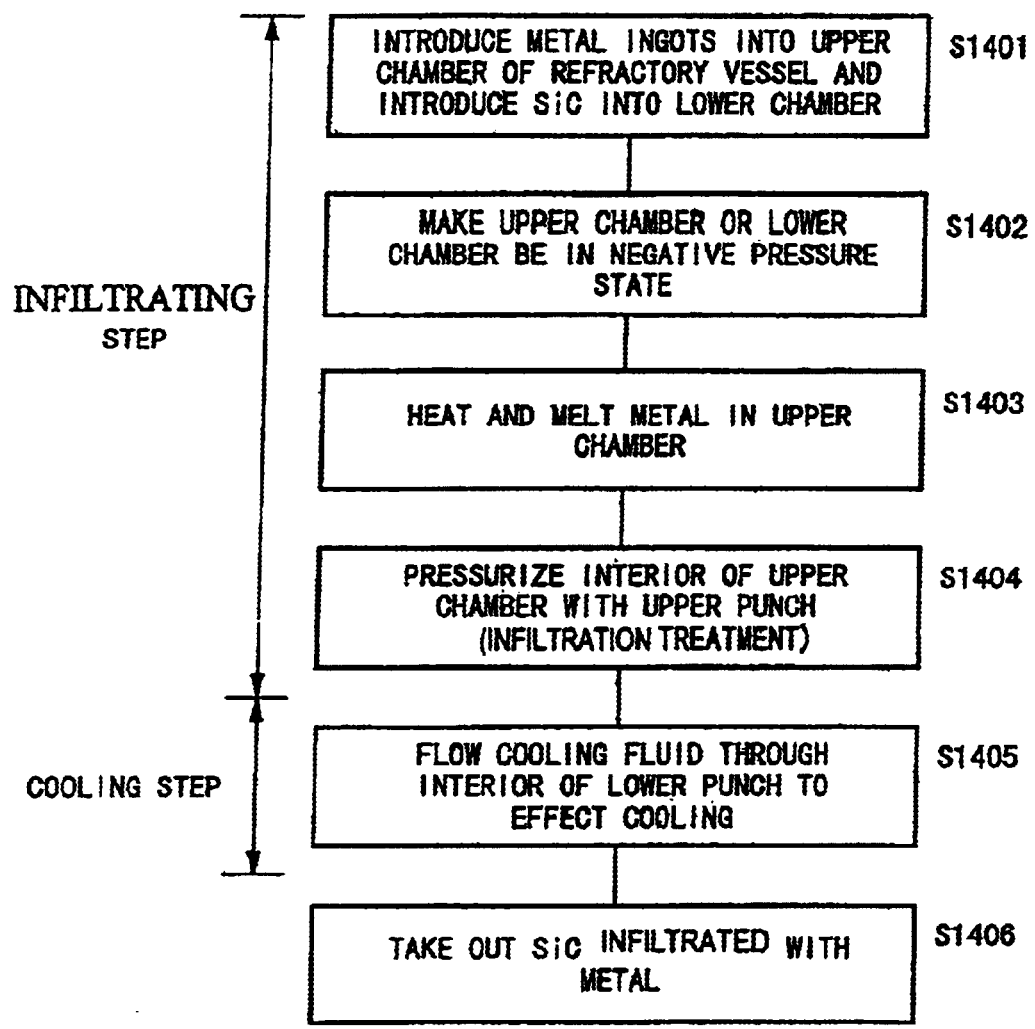
FIG. 38 shows a block diagram illustrating steps of the modified method of the seventh production method.

The modified production method is carried out by performing steps shown in FIG. 38.

At first, ingots of metal 14 are introduced into the upper chamber 1074*a* of the refractory vessel 1066, and the door 1112 of the lower chamber 1074*b* is opened to introduce SiC 1020 into the lower chamber 1074*b* (step S1401).

Subsequently, the door 1112 is closed to tightly enclose the lower chamber 1074*b*. Further, the hot press machine 1060 is tightly enclosed. After that, the evacuation is effected for the interior of the refractory vessel 1066 by the aid of the suction tube 1072 so that the both chambers 1074*a*, 1074*b* of the refractory vessel 1066 are in a negative pressure state (step S1402).

After that, the heater 1070 is powered to heat and melt the metal 14 in the upper chamber 1074*a* (step S1403). Also in this case, a heating fluid may be made flow through the passage 1080 of the lower punch 1064 in combination with the electric power application to the heater 1070 so that the interior of the refractory vessel 1066 can be heated.

When the melted matter of the metal 14 (molten metal) in the upper chamber 1074*a* comes to a predetermined temperature, the upper punch 1068 is moved downwardly to pressurize the interior of the upper chamber 1074*a* up to a predetermined pressure (step S1404).

The melted matter of the metal 14 (molten metal) in the upper chamber 1074*a* having arrived at the predetermined pressure is extruded by the pressure in the upper chamber 1074*a* through the filter member 1110 toward the lower chamber 1074*b*, and it is introduced into the lower chamber 1074*b*. At the same time, the SiC 1020 installed in the lower chamber 1074*b* is infiltrated with the molten metal.

When the time comes to the end point previously set in accordance with the time management, a cooling fluid is in turn made flow through the passage 1080 in the lower punch 1064 so that the refractory vessel 1066 is cooled in a direction from the bottom toward the top (step S1405). Accordingly, the molten metal 14, with which the SiC 1020 is infiltrated, is solidified.

When the solidification is completed, the SiC 1020 infiltrated with the metal 14 is taken out of the refractory vessel 1066 (step 1406).

Also in this modified production method, the SiC 1020 can be efficiently infiltrated with the metal 14 in the same manner as in the seventh production method. Also in this modified method, both of the molten metal 14 and the SiC 1020 make contact with each other after being pressurized so that the infiltration treatment is performed. Therefore, it is possible to minimize the decrease in pressure caused when both make contact with each other. Thus, it is possible to maintain the satisfactory pressurization state during the infiltration treatment. In this modified method, the infiltration treatment is performed at the negative pressure. However, the infiltration treatment may be performed at the atmospheric pressure.

Figure 39:
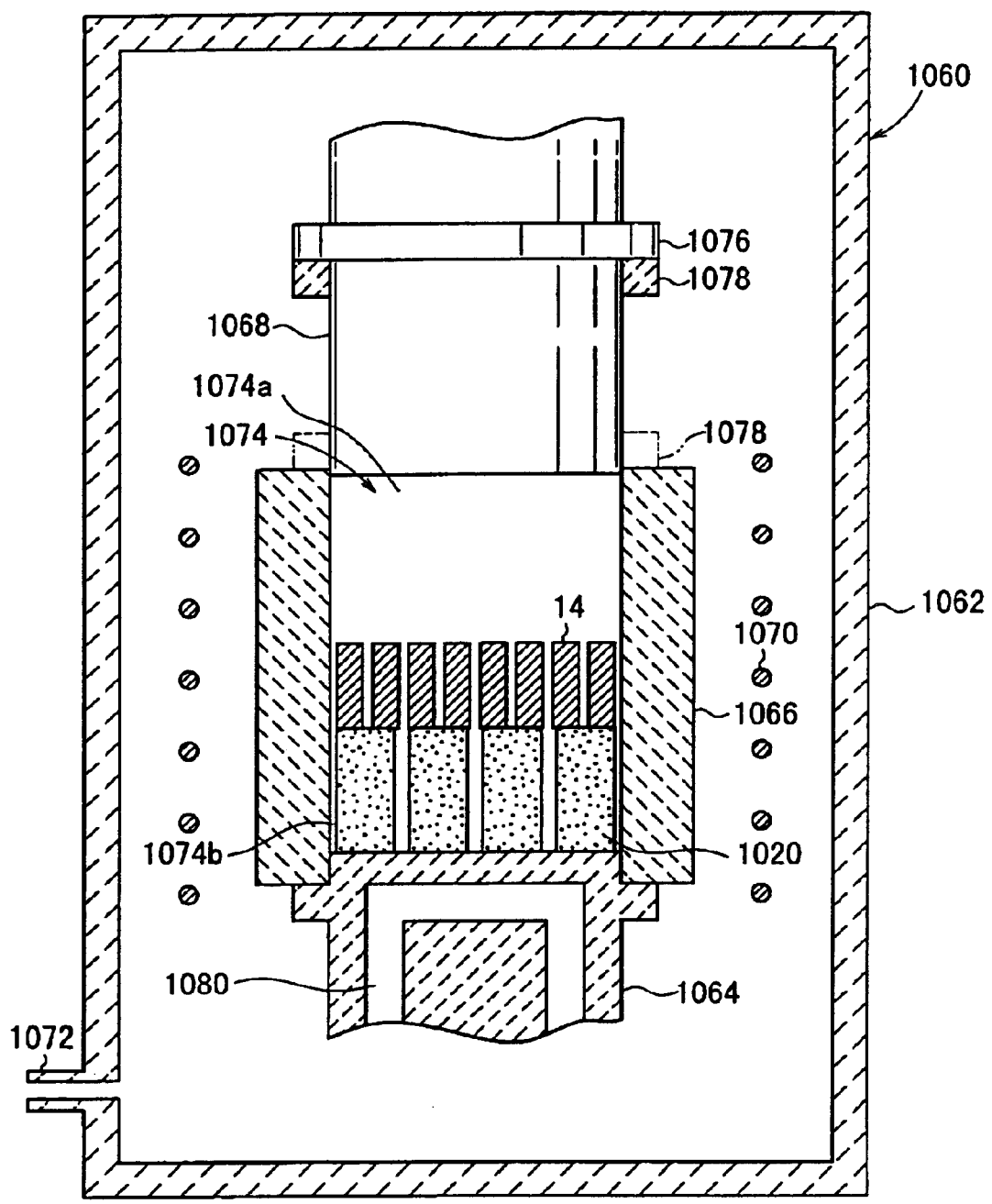
FIG. 39 shows a schematic arrangement of a hot press machine to be used in an eighth production method.

Further, explanation will be made with reference to FIGS. 39 and 40 for a production method (eighth production method) according to the fifth embodiment as an embodiment in which SiC is utilized for the porous sintered member. Constitutive components corresponding to those shown in FIG. 33 are designated by the same reference numerals, duplicate explanation of which will be omitted.

The eighth production method is in principle approximately the same as the production method according to the fourth embodiment described above. However, the former is different from the latter in that SiC 1020 and the metal 14 make contact with each other at a negative pressure or at the atmospheric pressure in the infiltrating step, and a heating treatment is performed to melt the metal 14.

Specifically, the eighth production method differs in that the filter 1054 is not introduced into the refractory vessel 1066 of the hot press machine 1060 used in the production method according to the third embodiment shown in FIG. 33, and the SiC 1020 and the metal 14 are introduced in this order from the bottom of the vessel 1060.

Figure 40:
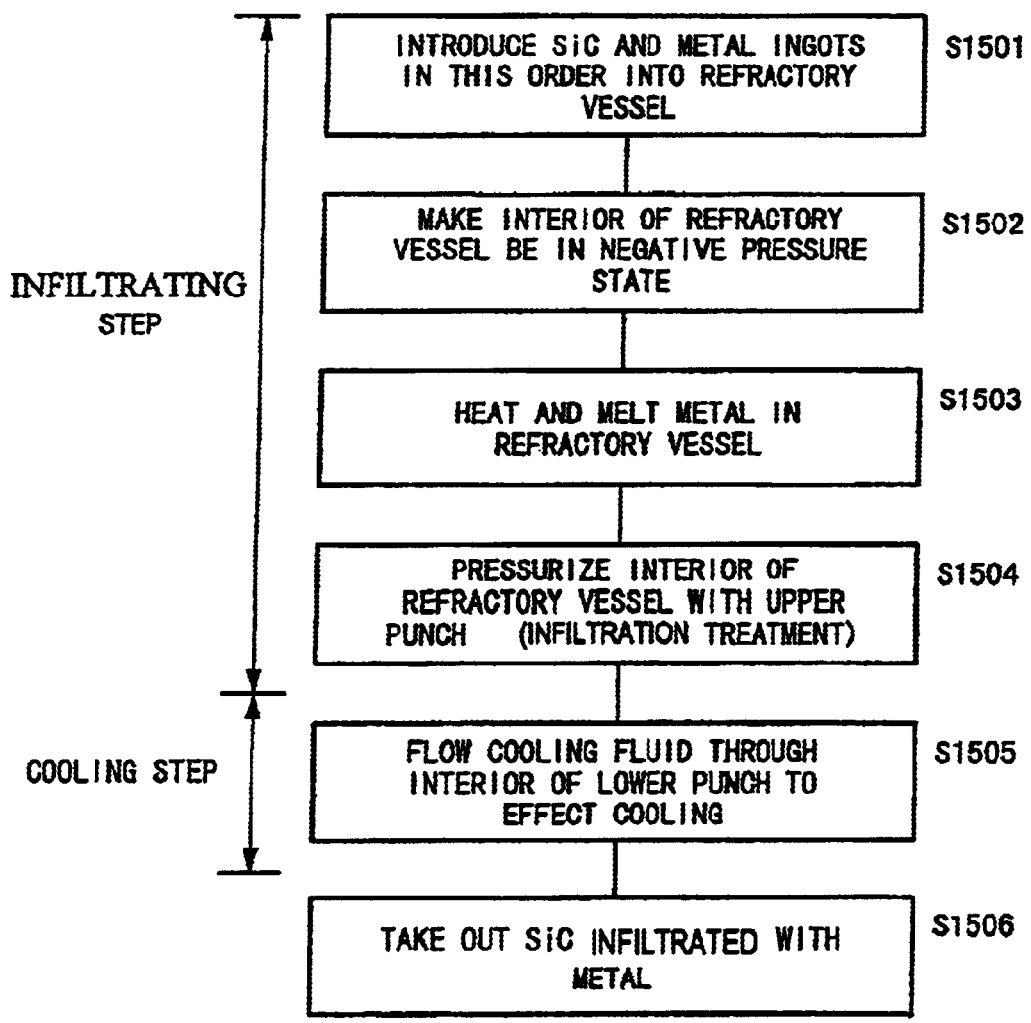
FIG. 40 shows a block diagram illustrating steps of the eighth production method.

The production method according to the fifth embodiment is carried out by performing steps shown in FIG. 40.

At first, the SiC 1020 and ingots of the metal 14 are introduced in this order from the bottom of the hollow section 1074 of the refractory vessel 1066 (step S1501).

Subsequently, the hot press machine 1060 is tightly enclosed, and then the interior of the refractory vessel 1066 is subjected to the evacuation by the aid of the suction tube 1072 so that the interior of the refractory vessel 1066 is in a negative pressure state (step S1502).

After that, the heater 1070 is powered to heat and melt the metal 14 in the refractory vessel 1066 (step S1503). During this process, a heating fluid may be made flow through the passage 1080 of the lower punch 1064 in combination with the electric power application to the heater 1070 so that the interior of the refractory vessel 1066 may be heated.

When the melted matter of the metal 14 (molten metal) in the refractory vessel 1066 arrives at a predetermined temperature, the upper punch 1068 is moved downwardly to pressurize the interior of the refractory vessel 1066 up to a predetermined pressure (step S1504).

The SiC 1020 is infiltrated with the melted matter of the metal 14 (molten metal) having arrived at the predetermined pressure in accordance with the pressure in the refractory vessel 1066.

When the time comes to the end point previously set in accordance with the time management (point of time at which the infiltration of the SiC 1020 with the molten metal is in a saturated state), a cooling fluid is in turn made flow through the passage 1080 in the lower punch 1064 so that the refractory vessel 1066 is cooled in a direction from the bottom toward the top (step S1505). Accordingly, the molten metal, with which the SiC 1020 is infiltrated, is solidified. The pressurized state in the refractory vessel 1066 effected by the upper punch 1068 and the lower punch 1064 is retained until the solidification is completed.

When the solidification is completed, the SiC 1020 infiltrated with the metal 14 is taken out of the refractory vessel 1066 (step 1506).

Also in this eighth production method, the SiC 1020 and the metal 14 are heated while being sufficiently degassed. After the metal 14 is melted in the state where the metal 14 and the SiC 1020 make contact with each other, the interior of the refractory vessel 1066 is in the pressurized state. Further, the pressurization is maintained until the point of time when the cooling operation is completed. Therefore, the SiC 1020 can be efficiently infiltrated with the metal 14.

It is a matter of course that the heat sink material and the method of producing the same according to the present invention are not limited to the embodiments and methods described above, which may be embodied in other various forms without deviating from the gist or essential characteristics of the present invention.

What is claimed is:

1. A heat sink material comprising carbon or graphite and metal which is at least one selected from Cu, Al, and Ag, said metal having one or more of Te, Bi, Pb, Sn, Se, Li, Sb, Tl, Ca and Cd added thereto for improving wettability at an interface between said carbon or graphite and said metal, wherein said heat sink material is constructed by infiltrating a porous sintered member with said metal, said porous sintered member being obtained by sintering said carbon or said graphite to form a network, wherein an average coefficient of thermal conductivity of those in directions of orthogonal three axes, or a coefficient of thermal conductivity in a direction of any axis is not less than 180 W/mK, and a ratio of coefficient of thermal conductivity is not more than 1:5 between a direction in which said coefficient of thermal conductivity is minimum and a direction in which said coefficient of thermal conductivity is maximum, and wherein a coefficient of thermal expansion is $1 \times 10^{-6}$ to $10 \times 10^{-6}$/° C.

2. The heat sink material according to claim 1, wherein an additive is added to said carbon or said graphite for decreasing a closed porosity when said carbon or said graphite is sintered.

3. The heat sink material according to claim 2, wherein said additive for decreasing said closed porosity is at least one selected from SiC and Si.

4. The heat sink material according to claim 1, wherein a closed porosity is not more than 12% by volume.

5. The heat sink material according to claim 1, wherein said carbon or said graphite has a coefficient of thermal conductivity of not less than 100 W/mK.

6. The heat sink material according to claim 1, wherein as for volume ratios between said carbon or said graphite and said metal, said volume ratio of said carbon or said graphite is within a range from 20 to 80% by volume, and said volume ratio of said metal is within a range from 80 to 20% by volume.

7. A heat sink material comprising carbon or graphite and metal which is at least one selected from Cu, Al, and Ag, said metal having one or more of Nb, Cr, Zr, Be, Ti, Ta, V, B and Mn added to improve reactivity with said carbon or graphite, wherein said heat sink material is constructed by infiltrating a porous sintered member with said metal, said porous sintered member being obtained by sintering said carbon or said graphite to form a network, wherein an average coefficient of thermal conductivity of those in directions of orthogonal three axes, or a coefficient of thermal conductivity in a direction of any axis is not less than 180 W/mK, and a ratio of coefficient of thermal conductivity is not more than 1:5 between a direction in which said coefficient of thermal conductivity is minimum and a direction in which said coefficient of thermal conductivity is maximum, and wherein a coefficient of thermal expansion is $1 \times 10^{-6}$ to $10 \times 10^{-6}$/° C.

8. The heat sink material according to claim 7, wherein an additive is added to said carbon or said graphite for decreasing a closed porosity when said carbon or said graphite is sintered.

9. The heat sink material according to claim 8, wherein said additive for decreasing said closed porosity is at least one selected from SiC and Si.

10. The heat sink material according to claim 7, wherein a closed porosity is not more than 12% by volume.

11. The heat sink material according to claim 7, wherein said carbon or said graphite has a coefficient of thermal conductivity of not less than 100 W/mk.

12. The heat sink material according to claim 7, wherein as for volume ratios between said carbon or said graphite and said metal, said volume ratio of said carbon or said graphite is within a range from 20 to 80% by volume, and said volume ratio of said metal is within a range from 80 to 20% by volume.

13. A heat sink material comprising carbon or graphite and metal which is at least one selected from Cu and Ag, said metal includes an element added thereto to improve molten metal flow performance, said element added to said metal has a temperature range of solid phase/liquid phase of not less than 30° C., wherein said heat sink material is constructed by infiltrating a porous sintered member with said metal, said porous sintered member being obtained by sintering said carbon or said graphite to form a network, wherein an average coefficient of thermal conductivity of those in directions of orthogonal three axes, or a coefficient of thermal conductivity in a direction of any axis is not less than 180 W/mK, and a ratio of coefficient of thermal conductivity is not more than 1:5 between a direction in which said coefficient of thermal conductivity is minimum and a direction in which said coefficient of thermal conductivity is maximum, and wherein a coefficient of thermal expansion is $1 \times 10^{-6}$ to $10 \times 10^{-6}/°$ C.

14. The heat sink material according to claim 13, wherein said element added to said metal comprises Si.

15. The heat sink material according to claim 13, wherein an additive is added to said carbon or said graphite for decreasing a closed porosity when said carbon or said graphite is sintered.

16. The heat sink material according to claim 15, wherein said additive for decreasing said closed porosity is at least one selected from SiC and Si.

17. The heat sink material according to claim 13, wherein a closed porosity is not more than 12% by volume.

18. The heat sink material according to claim 13, wherein said carbon or said graphite has a coefficient of thermal conductivity of not less than 100 W/mK.

19. The heat sink material according to claim 13, wherein as for volume ratios between said carbon or said graphite and said metal, said volume ratio of said carbon or said graphite is within a range from 20 to 80% by volume, and said volume ratio of said metal is within a range from 80 to 20% by volume.

20. A heat sink material comprising carbon or graphite and metal which is at least one selected from Cu, Al, and Ag, said metal having an element added thereto for lowering a melting point of said metal, wherein said heat sink material is constructed by infiltrating a porous sintered member with said metal, said porous sintered member being obtained by sintering said carbon or said graphite to form a network, wherein an average coefficient of thermal conductivity of those in directions of orthogonal three axes, or a coefficient of thermal conductivity in a direction of any axis is not less than 180 W/mK, and a ratio of coefficient of thermal conductivity is not more than 1:5 between a direction in which said coefficient of thermal conductivity is minimum and a direction in which said coefficient of thermal conductivity is maximum, and wherein a coefficient of thermal expansion is $1 \times 10^{-6}$ to $10 \times 10^{-6}/°$ C.

21. The heat sink material according to claim 20, wherein said element to be added is Zn.

22. The heat sink material according to claim 20, wherein an additive is added to said carbon or said graphite for decreasing a closed porosity when said carbon or said graphite is sintered.

23. The heat sink material according to claim 22, wherein said additive for decreasing said closed porosity is at least one selected from SiC and Si.

24. The heat sink material according to claim 20, wherein a closed porosity is not more than 12% by volume.

25. The heat sink material according to claim 20, wherein said carbon or said graphite has a coefficient of thermal conductivity of not less than 100 W/mK.

26. The heat sink material according to claim 20, wherein as for volume ratios between said carbon or said graphite and said metal, said volume ratio of said carbon or said graphite is within a range from 20 to 80% by volume, and said volume ratio of said metal is within a range from 80 to 20% by volume.

27. A heat sink material comprising carbon or graphite and metal which is at least one selected from Cu, Al, and Ag, said metal having an element added thereto for improving a coefficient of thermal conductivity of said heat sink material, wherein said heat sink material is constructed by infiltrating a porous sintered member with said metal, said porous sintered member being obtained by sintering said carbon or said graphite to form a network, wherein said added element being alloyed with said met to obtain an alloy which is deposited on the surface of said metal after heat treatment and reaction with carbon, and wherein said alloy has an initial coefficient of thermal conductivity of not less than 10 W/mk.

wherein an average coefficient of thermal conductivity of said heat sink material in directions of orthogonal three axes, or a coefficient of thermal conductivity in a direction of any axis is not less than 180 W/mK, and a ratio of coefficient of thermal conductivity is not more than 1:5 between a direction in which said coefficient of thermal conductivity is minimum and a direction in which said coefficient of thermal conductivity is maximum, and wherein a coefficient of thermal expansion is $1 \times 10^{-6}$ to $10 \times 10^{-6}/°$ C.

28. The heat sink material according to claim 27, wherein an additive is added to said carbon or said graphite for decreasing a closed porosity when said carbon or said graphite is sintered.

29. The heat sink material according to claim 28, wherein said additive for decreasing said closed porosity is at least one selected from SiC and Si.

30. The heat sink material according to claim 27, wherein a closed porosity is not more than 12% by volume.

31. The heat sink material according to claim 27, wherein said carbon or said graphite has a coefficient of thermal conductivity of not less than 100 W/mK.

32. The heat sink material according to claim 27, wherein as for volume ratios between said carbon or said graphite and said metal, said volume ratio of said carbon or said graphite is within a range from 20 to 80% by volume, and said volume ratio of said metal is within a range from 80 to 20% by volume.

33. A heat sink material comprising carbon or graphite and metal which is at least one selected from Cu, Al, and Ag, wherein a carbide layer is formed on a surface of said carbon or said graphite, wherein an average coefficient of thermal conductivity of those in directions of orthogonal three axes, or a coefficient of thermal conductivity in a direction of any axis is not less than 180 W/mK, and a ratio of coefficient of thermal conductivity is not more than 1:5 between a direction in which said coefficient of thermal conductivity is minimum and a direction in which said coefficient of thermal conductivity is maximum, and wherein a coefficient of thermal expansion is $1\times10^{-6}$ to $10\times10^{-6}/°$ C.

34. The heat sink material according to claim 33, wherein an element for forming a carbide layer is added to said metal, and wherein said carbide layer is formed on the basis of a reaction at least between said carbon or said graphite and the element to be added.

35. The heat sink material according to claim 34, wherein said element to be added is one or more of those selected from Ti, W, Mo, Nb, Cr, Zr, Be, Ta, V, B, and Mn.

36. A heat sink material comprising carbon or graphite and metal which is at least one selected from Cu, Al, and Ag,
   wherein said heat sink material is constructed by infiltrating a porous sintered member with said metal, said porous sintered member being obtained by sintering said carbon or said graphite to form a network,
   wherein an element which has a temperature range of solid phase/liquid phase of not less than 30° C. is added to said metal in order to improve molten metal flow performance,
   wherein an average coefficient of thermal conductivity of those in directions of orthogonal three axes, or a coefficient of thermal conductivity in a direction of any axis is not less than 180 W/mK, and a ratio of coefficient of thermal conductivity is not more than 1:5 between a direction in which said coefficient of thermal conductivity is minimum and a direction in which said coefficient of thermal conductivity is maximum, and
   wherein a coefficient of thermal expansion is $1\times10^{-6}$ to $10\times10^{-6}/°$ C.

37. The heat sink material according to claim 36, wherein said element to be added is one or more of those selected from Sn, P and Mg.

38. The heat sink material according to claim 37, wherein said element to be added is Si.

* * * * *